(12) United States Patent
Yamazaki et al.

(10) Patent No.: US 8,148,818 B2
(45) Date of Patent: Apr. 3, 2012

(54) SEMICONDUCTOR DEVICE AND METHOD FOR MANUFACTURING THE SAME

(75) Inventors: Shunpei Yamazaki, Setagaya (JP); Yoshiaki Oikawa, Tochigi (JP); Hironobu Shoji, Tochigi (JP); Yutaka Shionoiri, Isehara (JP); Kiyoshi Kato, Atsugi (JP); Masataka Nakada, Kamitsuga (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 283 days.

(21) Appl. No.: 12/468,280

(22) Filed: May 19, 2009

(65) Prior Publication Data

US 2009/0289340 A1 Nov. 26, 2009

(30) Foreign Application Priority Data

May 23, 2008 (JP) .................................. 2008-136082

(51) Int. Cl.
*H01L 23/29* (2006.01)
(52) U.S. Cl. ................. 257/729; 257/679; 257/E23.121; 257/E23.119; 438/127; 438/155
(58) Field of Classification Search .................. 257/679, 257/E21.502, E23.18
See application file for complete search history.

(56) References Cited

U.S. PATENT DOCUMENTS

| | | |
|---|---|---|
| 5,075,166 A | 12/1991 | Sikorski et al. |
| 5,597,631 A | 1/1997 | Furumoto et al. |
| 5,757,456 A | 5/1998 | Yamazaki et al. |
| 5,770,313 A | 6/1998 | Furumoto et al. |
| 5,821,138 A | 10/1998 | Yamazaki et al. |
| 6,118,502 A | 9/2000 | Yamazaki et al. |
| 6,224,965 B1 | 5/2001 | Haas et al. |
| 6,376,333 B1 | 4/2002 | Yamazaki et al. |
| 6,403,221 B1 | 6/2002 | Nakamura et al. |
| 6,491,228 B1 | 12/2002 | Ueda et al. |
| 6,762,508 B1 | 7/2004 | Kiso et al. |
| 6,998,282 B1 | 2/2006 | Yamazaki et al. |
| 7,049,178 B2 | 5/2006 | Kim et al. |
| 7,050,138 B1 | 5/2006 | Yamazaki et al. |

(Continued)

FOREIGN PATENT DOCUMENTS

EP 0939441 9/1999

(Continued)

OTHER PUBLICATIONS

Invitation to pay additional fees (Application No. PCT/JP2009/059470), International Searching Authority, dated Jun. 16, 2009.

*Primary Examiner* — N Drew Richards
*Assistant Examiner* — Mamadou Diallo
(74) *Attorney, Agent, or Firm* — Eric J. Robinson; Robinson Intellectual Property Law Office P.C.

(57) ABSTRACT

A conductive shield covering a semiconductor integrated circuit prevents electrostatic breakdown of the semiconductor integrated circuit (e.g., malfunction of a circuit and damage to a semiconductor element) due to electrostatic discharge. Further, with use of a pair of insulators between which the semiconductor integrated circuit is sandwiched, a highly reliable semiconductor having resistance can be provided while achieving reduction in the thickness and size. Moreover, also in the manufacturing process, external stress, or defective shapes or deterioration in characteristics resulted from electrostatic discharge are prevented, and thus the semiconductor device can be manufactured with high yield.

33 Claims, 23 Drawing Sheets

U.S. PATENT DOCUMENTS

| | | |
|---|---|---|
| 7,061,083 B1 | 6/2006 | Usami et al. |
| 7,361,519 B2 | 4/2008 | Yamazaki et al. |
| 7,485,489 B2 | 2/2009 | Björbell |
| 7,487,373 B2 | 2/2009 | Koyama |
| 7,928,510 B2 | 4/2011 | Watanabe |
| 2003/0032210 A1 | 2/2003 | Takayama et al. |
| 2003/0038280 A1 | 2/2003 | Kojo et al. |
| 2003/0071953 A1 | 4/2003 | Yamazaki et al. |
| 2004/0016939 A1 | 1/2004 | Akiba et al. |
| 2004/0229404 A1 | 11/2004 | Kiso et al. |
| 2005/0070038 A1 | 3/2005 | Yamazaki et al. |
| 2005/0085034 A1 | 4/2005 | Akiba et al. |
| 2005/0162578 A1 | 7/2005 | Yamazaki et al. |
| 2005/0233122 A1 | 10/2005 | Nishimura et al. |
| 2005/0285231 A1 | 12/2005 | Arao et al. |
| 2006/0011288 A1 | 1/2006 | Watanabe et al. |
| 2006/0099738 A1* | 5/2006 | Yamazaki ............... 438/114 |
| 2006/0117554 A1 | 6/2006 | Herrmann et al. |
| 2006/0246269 A1* | 11/2006 | Yukawa ................. 428/209 |
| 2007/0004125 A1 | 1/2007 | Watanabe et al. |
| 2007/0023758 A1 | 2/2007 | Tsurume et al. |
| 2007/0030205 A1 | 2/2007 | Farrell et al. |
| 2007/0030681 A1 | 2/2007 | Farrell et al. |
| 2007/0044303 A1 | 3/2007 | Yamano |
| 2007/0077691 A1 | 4/2007 | Watanabe |
| 2007/0181875 A1 | 8/2007 | Yamazaki et al. |
| 2007/0259585 A1 | 11/2007 | Yamazaki et al. |
| 2007/0278563 A1 | 12/2007 | Takano et al. |
| 2008/0012126 A1* | 1/2008 | Dozen et al. ............. 257/729 |
| 2008/0044940 A1 | 2/2008 | Watanabe et al. |
| 2008/0054976 A1 | 3/2008 | Endo et al. |
| 2008/0093464 A1 | 4/2008 | Dairiki et al. |
| 2008/0186185 A1 | 8/2008 | Herrmann et al. |
| 2008/0224940 A1 | 9/2008 | Sugiyama et al. |
| 2008/0224941 A1 | 9/2008 | Sugiyama et al. |
| 2008/0242005 A1 | 10/2008 | Dozen et al. |
| 2008/0303140 A1 | 12/2008 | Ohtani et al. |
| 2009/0278252 A1 | 11/2009 | Oikawa et al. |
| 2009/0289341 A1 | 11/2009 | Yamazaki et al. |
| 2009/0302455 A1 | 12/2009 | Chida et al. |

FOREIGN PATENT DOCUMENTS

| | | |
|---|---|---|
| EP | 1092739 | 4/2001 |
| EP | 1589797 | 10/2005 |
| EP | 1758438 | 2/2007 |
| EP | 1818860 A | 8/2007 |
| EP | 1970951 | 9/2008 |
| JP | 05-190582 | 7/1993 |
| JP | 06-350250 A | 12/1994 |
| JP | 08-250745 | 9/1996 |
| JP | 08-250745 A | 9/1996 |
| JP | 08-288522 | 11/1996 |
| JP | 09-156265 A | 6/1997 |
| JP | 10-092980 | 4/1998 |
| JP | 10-211784 A | 8/1998 |
| JP | 10-302027 | 11/1998 |
| JP | 2000-231619 | 8/2000 |
| JP | 2001-277726 | 10/2001 |
| JP | 2003-141486 A | 5/2003 |
| JP | 2003-174153 | 6/2003 |
| JP | 2004-094492 A | 3/2004 |
| JP | 2004-118255 | 4/2004 |
| JP | 2004-362341 | 12/2004 |
| JP | 2006-139802 | 6/2006 |
| JP | 2007-123859 A | 5/2007 |
| JP | 2007-241999 | 9/2007 |
| JP | 2008-084303 A | 4/2008 |
| WO | WO-96/09158 | 3/1996 |
| WO | WO 01/01740 | 1/2001 |
| WO | WO 04/001848 | 12/2003 |
| WO | WO-2006/038438 | 4/2006 |
| WO | WO-2007/016433 | 2/2007 |
| WO | WO-2007/043285 | 4/2007 |

* cited by examiner

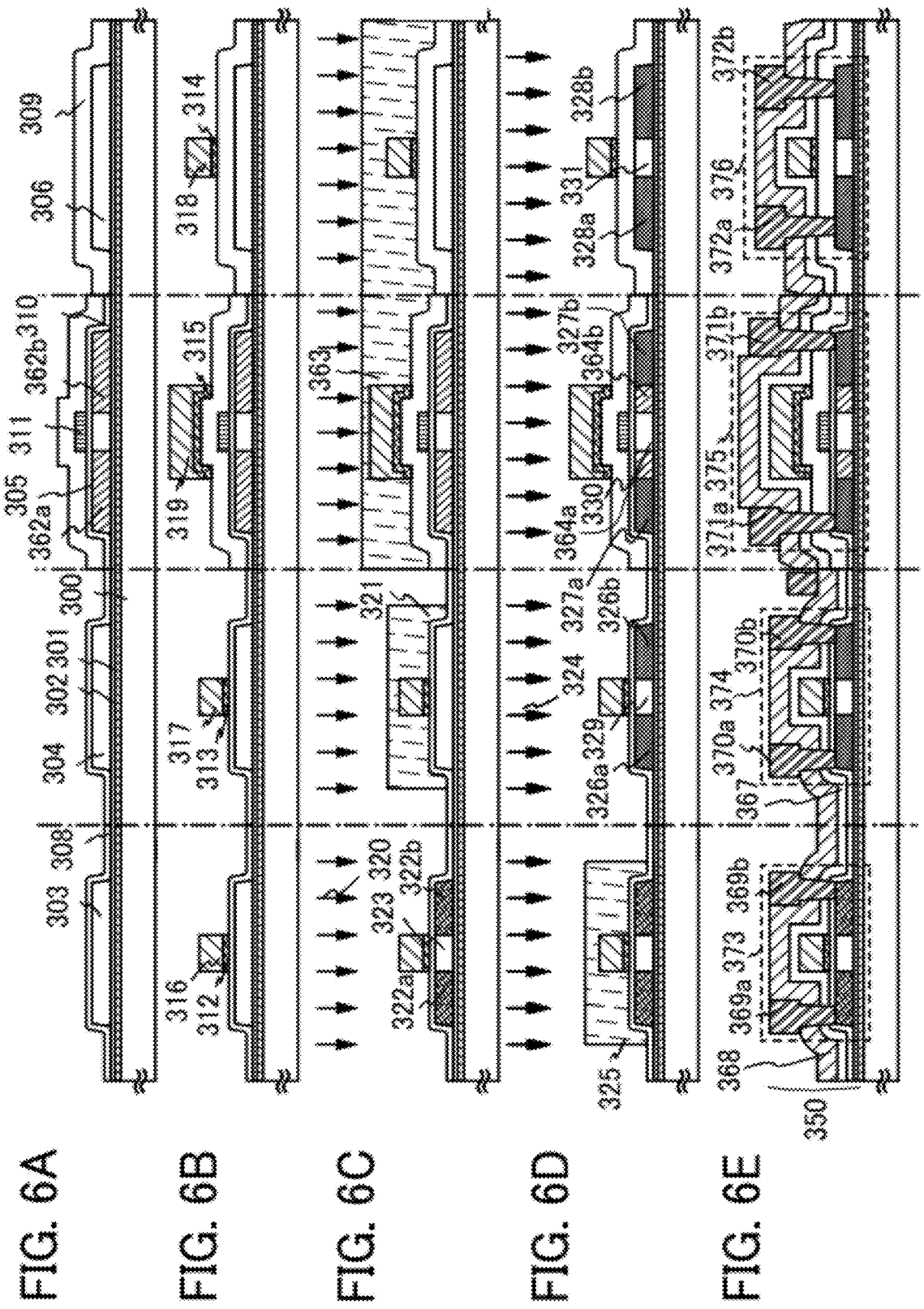

FIG. 9A
```
            CHECK
payment  ○○bank
place    ○○branch
amount   ¥1,234,567※
date of  yyyy/mm/dd
issue    ○○ Corporation
place of          presidnet
drawing  drawer     sign
```
190
FIG. 9B
```
name
birthday yyyy/mm/dd
domicile  Kanagawa-ken
address Tokyo-to
derivery  yyyy/mm/dd
expiration date
birthday of Heisei 30year
number ○○○○th
others
```
191
FIG. 9C
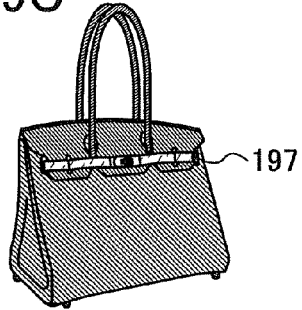
197
FIG. 9D
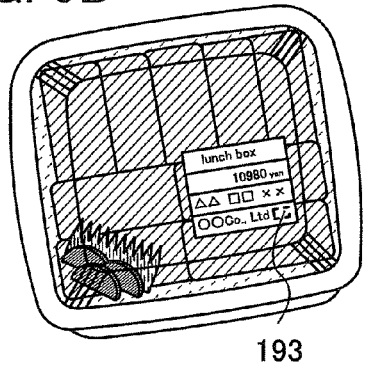
193
FIG. 9E
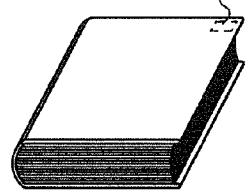
194
FIG. 9F
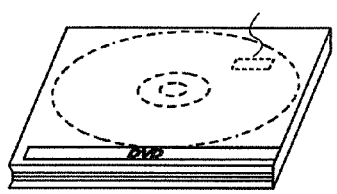
195
FIG. 9G
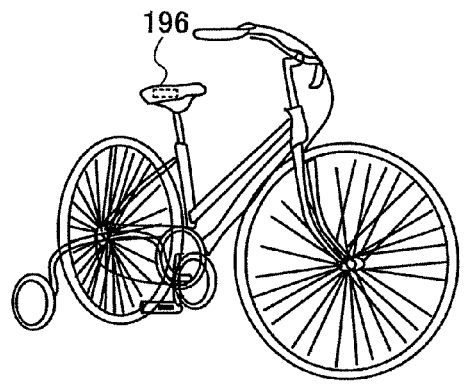
196

SEMICONDUCTOR DEVICE AND METHOD FOR MANUFACTURING THE SAME

TECHNICAL FIELD

The present invention relates to semiconductor devices and methods for manufacturing the same.

BACKGROUND ART

As for a semiconductor device which transmits and receives data through an antenna by wireless communication (such a semiconductor device is also referred to as a "non-contact signal processing device", a "semiconductor integrated circuit chip", or an "IC chip"), a problem of breakdown of the semiconductor device due to electrostatic discharge from the outside (electrostatic breakdown) is a serious problem which causes reduction in reliability or productivity from a manufacturing process of the semiconductor device through to inspection and use thereof as a product. Measures against the problem have been reported (e.g., see Patent Document 1).

Patent Document 1 shows an example in which a conductive polymer layer is used for a substrate or an adhesive in the above semiconductor device in order to prevent electrostatic breakdown.

PATENT DOCUMENT

Patent Document 1

Japanese Published Patent Application No. 2007-241999

DISCLOSURE OF INVENTION

With expansion of the market of the above semiconductor device, demands on the shape and required characteristics of the semiconductor device vary. Therefore, a semiconductor device which has higher resistance to electrostatic breakdown and is provided with required characteristics has been required.

Further, it is also important to increase strength against stress from the outside of the above semiconductor device the size and thickness of which have been reduced.

Therefore, it is an object of the present invention to provide a highly reliable semiconductor device which has resistance to stress from the outside and electrostatic discharge, while achieving reduction in the thickness and size of the semiconductor device. It is another object of the present invention to manufacture a semiconductor device with high yield while preventing stress from the outside or defective shapes or deterioration in characteristics resulted from electrostatic discharge also in a manufacturing process.

A semiconductor device according to an embodiment of the present invention has a pair of insulators which sandwiches an antenna and a semiconductor integrated circuit which is electrically connected to the antenna, and a shield which is provided on an outer side (on the side opposite to the side where the semiconductor integrated circuit is provided) of each insulator. The semiconductor device according to an embodiment of the present invention is a non-contact signal processing device which has functions of transmitting and receiving signals to and from an external device by wireless communication. Therefore, the shield transmits electromagnetic waves to be transmitted and received by the antenna included in the semiconductor device and blocks static electricity applied from the outside (also referred to as "external static electricity") to the semiconductor integrated circuit in the semiconductor device.

According to an embodiment of the present invention, a semiconductor device has a first insulator and a second insulator which are provided so as to face each other; a semiconductor integrated circuit which is sandwiched between the first insulator and the second insulator and provided in a region therebetween; an antenna which is provided over the semiconductor integrated circuit; and a shield which is provided so as to cover entire surfaces of the first insulator and the second insulator.

According to an embodiment of the present invention, a semiconductor device has a first insulator and a second insulator which are provided so as to face each other; a semiconductor integrated circuit which is sandwiched between the first insulator and the second insulator and provided in a region therebetween; a first antenna which is provided over the semiconductor integrated circuit; a shield which is provided so as to cover entire surfaces of the first insulator and the second insulator; and a second antenna which is electromagnetically coupled to the first antenna and provided outside one of the first insulator and the second insulator.

Since the shield diffuses and releases static electricity applied due to electrostatic discharge or prevents charge from locally existing (localization of electric charge) (prevents local electric potential difference from occurring), the semiconductor integrated circuit can be prevented from being damaged by static electricity. The shield is formed so as to cover (surround) top and bottom surfaces and side surfaces (side surfaces generated due to cutting; also referred to as "cut surfaces") of the semiconductor integrated circuit with the insulators therebetween. Alternatively, the shield is formed so as to cover (surround) the entire surface of the semiconductor integrated circuit with the insulators therebetween.

Note that the shield is not electrically connected to the antenna and the semiconductor integrated circuit.

A material having conductivity may be used as a material of the shield. A conductive layer formed using a conductive material can be used.

Such a shield is also referred to as a "conductive shield". The shield is formed to a thickness and formed using a material which transmit electromagnetic waves to be transmitted and received by the antenna and the semiconductor integrated circuit which are covered with (surrounded by) the conductive shield and also block static electricity. Accordingly, a highly reliable semiconductor device which has resistance to electrostatic breakdown and is capable of transmitting and receiving data through the antenna by wireless communication can be provided.

The pair of insulators which sandwiches the semiconductor integrated circuit also functions as an impact resistance layer which has resistance to force applied from the outside (also referred to as "external stress") to the semiconductor device and an impact diffusion layer which diffuses the force. The provision of the insulators makes it possible to reduce locally applied stress; thus, damage of the semiconductor device or deterioration in characteristics thereof can be prevented.

In the semiconductor device, the semiconductor integrated circuit is sandwiched between the pair of insulators. The semiconductor integrated circuit is manufactured over a substrate and separated from the substrate after being bonded to the insulators. In this specification, a surface generated on the semiconductor integrated circuit after the semiconductor integrated circuit is separated from the substrate is referred to as a "separation surface".

As the conductive shield, a film of metal, metal nitride, metal oxide, or the like, or a stacked layer thereof can be used. The thickness of the conductive shield is greater than 0 and less than or equal to 1 μm.

The conductive shield may be formed using, for example, an element selected from titanium, molybdenum, tungsten, aluminum, copper, silver, gold, nickel, platinum, palladium, iridium, rhodium, tantalum, cadmium, zinc, iron, silicon, germanium, zirconium, and barium; or an alloy material, a compound material, a nitride material, or an oxide material containing the above element as its main component.

As the nitride material, tantalum nitride, titanium nitride, or the like can be used.

As the oxide material, indium tin oxide (ITO), indium tin oxide containing silicon oxide (ITSO), organic indium, organic tin, zinc oxide, or the like can be used. Alternatively, indium zinc oxide (IZO) containing zinc oxide (ZnO), zinc oxide (ZnO), zinc oxide containing gallium (Ga), tin oxide ($SnO_2$), indium oxide containing tungsten oxide, indium zinc oxide containing tungsten oxide, indium oxide containing titanium oxide, indium tin oxide containing titanium oxide, or the like may be used.

Alternatively, a semiconductor film formed of a semiconductor doped with an impurity element or the like to have conductivity or the like can be used. For example, a polycrystalline silicon film doped with an impurity element such as phosphorus, or the like can be used.

Further alternatively, a conductive polymer may be used as the conductive shield. As the conductive polymer, a so-called π-electron conjugated conductive polymer can be used. For example, polyaniline and/or a derivative thereof, polypyrrole and/or a derivative thereof, polythiophene and/or a derivative thereof, a copolymer of two or more kinds of those materials, and the like can be given.

Specific examples of a conjugated conductive polymer are given below: polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxypyrrole), poly(3-methyl-4-hydroxypyrrole), poly(3-methoxypyrrole), poly(3-ethoxypyrrole), poly(3-octoxypyrrole), poly(3-carboxylpyrrole), poly(3-methyl-4-carboxylpyrrole), polyN-methylpyrrole, polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid), and poly(3-anilinesulfonic acid).

An organic resin or a dopant (a halogen, a Lewis acid, an inorganic acid, an organic acid, a halide of a transition metal, an organic cyano compound, and a nonionic surfactant or the like) may be contained in the conductive shield containing a conductive polymer.

The conductive shield can be formed by a dry process such as a sputtering method, a plasma CVD method, or an evaporation method or a wet process such as a coating method, a printing method, or a droplet discharge method (an ink jet method).

Further, a protective layer may be stacked on the conductive shield. For example, a titanium film is formed as the conductive shield, and then a titanium oxide film may be stacked as the protective layer on the titanium film. By formation of the protective layer, even in the case where the conductive shield is provided for a surface of the semiconductor device, the protective layer is the outermost surface, and thus the conductive shield can be prevented from being deteriorated.

A structure body in which a fibrous body is impregnated with an organic resin can be used as the insulator.

In addition, a material the modulus of elasticity of which is low and the breaking strength of which is high may be used as the insulator.

The insulator is preferably formed using a high-strength material. As typical examples of the high-strength material, there are a polyvinyl alcohol resin, a polyester resin, a polyamide resin, a polyethylene resin, an aramid resin, a polyparaphenylene benzobisoxazole resin, a glass resin, and the like. If the insulator formed using a high-strength material having elasticity is provided, burden such as local pressing force is diffused in the entire layer and absorbed; accordingly, the semiconductor device can be prevented from being damaged.

More specifically, as the insulator, the following can be used: an aramid resin, a polyethylene naphthalate (PEN) resin, a polyether sulfone (PES) resin, a polyphenylene sulfide (PPS) resin, a polyimide (PI) resin, or the like.

In this specification, the term "transfer" (also referred to as "transpose") means that a semiconductor integrated circuit formed over one substrate is separated from the substrate and the semiconductor integrated circuit is moved to another substrate. In other words, the term "transfer" also means that a position where the semiconductor integrated circuit is provided is moved to a position over another substrate.

The insulator may be bonded to the semiconductor integrated circuit with an adhesive layer. In that case, the adhesive layer is provided between the semiconductor integrated circuit and the insulator. Alternatively, the insulator and the semiconductor integrated circuit may be directly bonded by heat and pressure treatment.

Note that in an embodiment of the present invention, the semiconductor device refers to a device which can function by utilizing semiconductor characteristics. By use of an embodiment of the present invention, semiconductor devices such as a device having a circuit including a semiconductor element (e.g., a transistor, a memory element, and a diode) and a chip having a processor circuit can be manufactured.

The conductive shield covering the semiconductor integrated circuit prevents electrostatic breakdown of the semiconductor integrated circuit (e.g., malfunction of the circuit and damage to a semiconductor element) due to electrostatic discharge. In addition, with use of the pair of insulators between which the semiconductor integrated circuit is sandwiched, a highly reliable semiconductor device which has resistance can be provided while achieving reduction in the thickness and size. Moreover, the semiconductor device can be manufactured with high yield by prevention of external stress, or defective shapes or deterioration in characteristics resulted from electrostatic discharge also in a manufacturing process.

BRIEF DESCRIPTION OF DRAWINGS

In the accompanying drawings:

FIGS. 6A to 6E are views illustrating a method for manufacturing a semiconductor device according to an embodiment of the present invention;

FIGS. 9A to 9G are views illustrating application examples of a semiconductor device according to an embodiment of the present invention;

BEST MODE FOR CARRYING OUT THE INVENTION

Figure 1A:
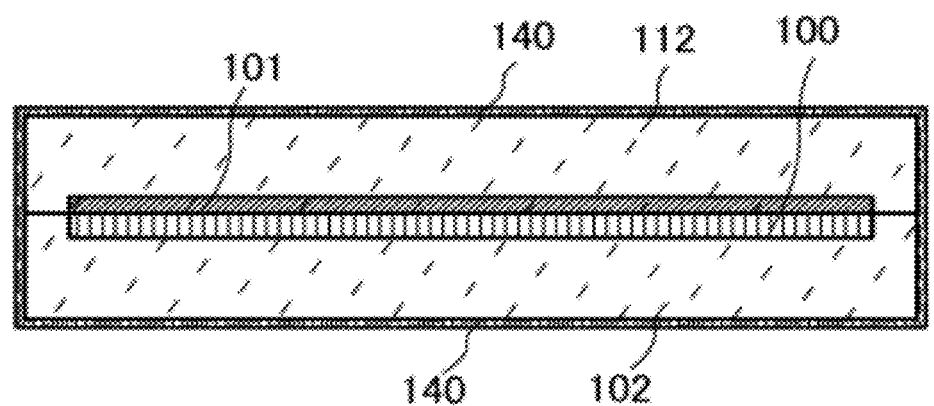
FIGS. 1A and 1B are views each illustrating a semiconductor device according to an embodiment of the present invention.

Embodiments and Examples of the present invention will be described in detail with reference to the accompanying drawings. Note that it is easily understood by those skilled in the art that the modes and details of the present invention can be modified in a variety of ways without departing from the spirit and scope of the present invention. Therefore, the present invention should not be construed as being limited to the description below of the embodiment and example. Note that, in structures of the present invention described below, reference numerals indicating the same portions or portions having similar functions are used in common in all drawings, and the description on the same portions or the portions having similar functions will not be repeated.

Embodiment 1

In this embodiment, a more highly reliable semiconductor device and a method for manufacturing a semiconductor device with high yield will be described in detail with reference to FIGS. 1A and 1B, FIGS. 2A to 2C, and FIGS. 3A to 3D.

As for a semiconductor device in this embodiment, a semiconductor integrated circuit is separated from a substrate used for manufacturing the semiconductor integrated circuit and is sandwiched between flexible insulators. Note that in this specification, a substrate over which a semiconductor integrated circuit is formed is also referred to as a "manufacturing substrate". Thus, the semiconductor integrated circuit is formed over the manufacturing substrate with a separation layer therebetween.

Figure 1B:
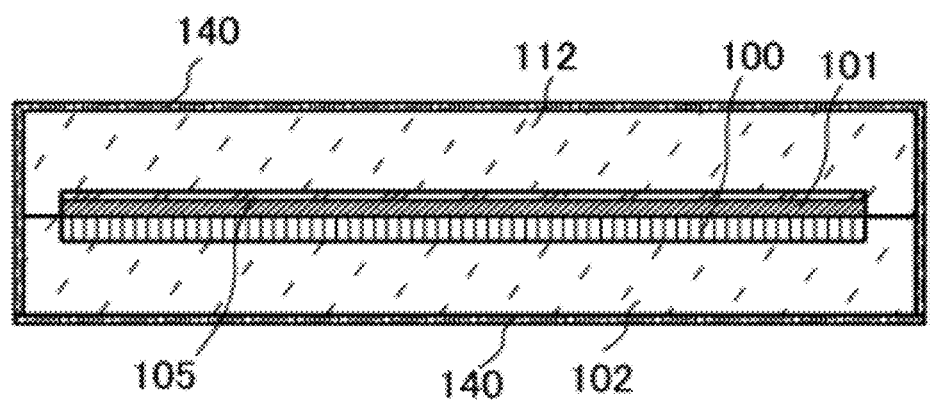

FIGS. 1A and 1B each illustrate a semiconductor device of this embodiment. In FIG. 1A, an antenna 101 and a semiconductor integrated circuit 100 which is electrically connected to the antenna 101 are sandwiched between a first insulator 112 and a second insulator 102, and a conductive shield 140 is provided on an outer side (on the side opposite to the side where the semiconductor integrated circuit is provided) of each of the first insulator 112 and the second insulator 102.

The conductive shield 140 is provided on an entire surface overlapping with the semiconductor integrated circuit 100 so as to cover (surround) the semiconductor integrated circuit 100. In other words, the conductive shield 140 is also provided on side surfaces of a stacked body including the first insulator 112, the second insulator 102, the antenna 101, and the semiconductor integrated circuit 100 so as to cover (surround) the stacked body.

Note that the conductive shield 140 is not electrically connected to the semiconductor integrated circuit 100 and the antenna 101.

The semiconductor device of this embodiment is a non-contact signal processing device which has functions of transmitting and receiving signals to and from an external device by wireless communication. Therefore, the conductive shield 140 transmits electromagnetic waves to be transmitted and received by the antenna 101 included in the semiconductor device and blocks external static electricity applied from the outside to the semiconductor integrated circuit 100 in the semiconductor device. Since the conductive shield 140 diffuses and releases static electricity applied by electrostatic discharge or prevents electric charge from locally existing (localization of electric charge) (prevents local electric potential difference from occurring), the semiconductor integrated circuit 100 can be prevented from being damaged by static electricity.

A large area of the semiconductor integrated circuit 100 is protected against external static electricity because top surface, bottom surface, and both side surfaces of the semiconductor device are provided with the conductive shield 140. Thus, a higher effect of preventing electrostatic breakdown can be obtained.

Although the conductive shields 140 are preferably formed under the same conditions (method, material, and thickness) in terms of a manufacturing process, they may be formed under different conditions. For example, since the resistance against ESD of a surface on the side opposite to the side where the antenna 101 is provided is lower than that of a surface on the side opposite to the side where the semiconductor integrated circuit 100 is provided, the thickness of the conductive shield on the surface on the side opposite to the side where the antenna 101 is provided may be larger than that of the conductive shield on the surface on the side opposite to the side where the semiconductor integrated circuit 100 is provided.

Further, the semiconductor device described in this embodiment operates by generating induced electromotive force with electromagnetic waves from the outside (the semiconductor device has a wireless communication function). Therefore, the conductive shield 140 needs to prevent the semiconductor integrated circuit from being damaged by static electricity and needs to be formed using a conductive material which transmits electromagnetic waves.

It is generally known that electromagnetic waves decay in a substance. The decay of electromagnetic waves becomes notable especially in a conductive material. Therefore, in this embodiment, the conductive shield 140 is formed to be thin enough to be capable of transmitting electromagnetic waves.

The thickness of the conductive shield 140 may be set based on the frequency of electromagnetic waves to be used for communication and the resistivity or the magnetic permeability of a conductive material to be used as the conductive shield 140.

For example, in the case where the frequency of electromagnetic waves is 13.56 MHz and titanium (resistivity ($\rho$): $5.5 \times 10^{-7}$ ($\Omega \cdot m$)) is used as the conductive shield, the thickness of the conductive shield 140 is at least less than or equal to 100 nm. Accordingly, damage to the semiconductor device resulted from electrostatic discharge can be suppressed and communication with the outside can be favorably performed.

Needless to say, a material used as the conductive shield 140 is not limited to titanium. In the case of using, for example, indium tin oxide containing silicon oxide (also referred to as "ITSO") whose resistivity is higher than that of titanium, the conductive shield 140 may be formed to a thickness of at least about less than or equal to 700 nm.

Further, the lower limit of the thickness of the conductive shield 140 is preferably set based on the resistivity. For example, in the case where the resistivity of a conductive material used as the conductive shield 140 is high, the conductive shield 140 is preferably formed thick so that static electricity is effectively diffused. That is because if the conductive shield 140 is formed to be too thin using a conductive material whose resistivity is high, the sheet resistance is increased, static electricity cannot be effectively diffused in the case where electrostatic discharge is generated, and a large amount of current flows in the semiconductor integrated circuit 100, which can cause damage to the semiconductor integrated circuit 100.

Therefore, for the purpose of effectively preventing damage to the semiconductor device due to static electricity, the thickness of the conductive shield 140 is preferably set so that the sheet resistance of the conductive shield 140 is less than or equal to $1.0 \times 10^7$ $\Omega$/square, preferably $1.0 \times 10^4$ $\Omega$/square, more preferably $1.0 \times 10^2$ $\Omega$/square.

In order to transmit electromagnetic waves, it is preferable that the thickness of the conductive shield 140 be as small as possible as long as the sheet resistance of the conductive shield 140 is within the above range.

In the case of using titanium or the like the resistivity of which is low as a conductive material, even if the conductive shield 140 is formed to be extremely thin, the sheet resistance can be sufficiently decreased and electromagnetic waves can be easily transmitted; however, when a manufacturing process and the like are taken into consideration, the conductive shield 140 may be formed to a thickness of about greater than or equal to 5 nm (preferably greater than or equal to 100 nm).

On the other hand, in the case of using a compound of silicon oxide and indium tin oxide, the resistivities of which are relatively high, or the like, the thickness of the conductive shield 140 is preferably at least greater than or equal to 5 nm, more preferably greater than or equal to 5 nm and less than or equal to 100 nm.

The above conductive shield 140 is formed, whereby damage to the semiconductor device resulted from electrostatic discharge can be effectively suppressed and a semiconductor device which is capable of favorably performing communication with the outside can be obtained.

Next, materials and the like which can be applied to the structures illustrated in FIGS. 1A and 1B will be described in detail.

The conductive shield 140 may have conductivity, and therefore a conductive layer formed using a conductive material can be used.

Such a conductive shield 140 is formed to a thickness and formed using a material which transmit electromagnetic waves to be transmitted and received by the antenna 101 and the semiconductor integrated circuit 100 which are covered with the conductive shield 140 and also block static electricity. Accordingly, a highly reliable semiconductor device which has resistance to electrostatic breakdown and is capable of transmitting and receiving data through the antenna by wireless communication can be provided.

As the conductive shield 140, a film of metal, metal nitride, metal oxide, or the like, and a stacked layer of such a film can be used.

The conductive shield 140 may be formed using, for example, an element selected from titanium, molybdenum, tungsten, aluminum, copper, silver, gold, nickel, platinum, palladium, iridium, rhodium, tantalum, cadmium, zinc, iron, silicon, germanium, zirconium, and barium; or an alloy material, a compound material, a nitride material, or an oxide material containing the above element as its main component.

As the nitride material, tantalum nitride, titanium nitride, or the like can be used.

As the oxide material, indium tin oxide (ITO), indium tin oxide containing silicon oxide (ITSO), organic indium, organic tin, zinc oxide, or the like can be used. Alternatively, indium zinc oxide (IZO) containing zinc oxide (ZnO), zinc oxide (ZnO), zinc oxide containing gallium (Ga), tin oxide ($SnO_2$), indium oxide containing tungsten oxide, indium zinc oxide containing tungsten oxide, indium oxide containing titanium oxide, indium tin oxide containing titanium oxide, or the like may be used.

Alternatively, a semiconductor film formed of a semiconductor doped with an impurity element or the like to have conductivity, or the like can be used. For example, a polycrystalline silicon film doped with an impurity element such as phosphorus, or the like can be used.

Further alternatively, a conductive polymer may be used as the conductive shield 140. As the conductive polymer, a so-called π-electron conjugated conductive polymer can be used. For example, polyaniline and/or a derivative thereof, polypyrrole and/or a derivative thereof, polythiophene and/or a derivative thereof, a copolymer of two or more kinds of those materials, and the like can be given.

Specific examples of a conjugated conductive polymer are given below: polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxypyrrole), poly(3-methyl-4-hydroxypyrrole), poly(3-methoxypyrrole), poly(3-ethoxypyrrole), poly(3-octoxypyrrole), poly(3-carboxylpyrrole), poly(3-methyl-4-carboxylpyrrole), polyN-methylpyrrole, polythiophene, poly (3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid), and poly(3-anilinesulfonic acid).

An organic resin or a dopant (a halogen, a Lewis acid, an inorganic acid, an organic acid, a halide of a transition metal, an organic cyano compound, and a nonionic surfactant or the like) may be contained in the conductive shield 140 containing a conductive polymer.

The conductive shield 140 can be formed by a dry process such as a sputtering method, a plasma CVD method, or an evaporation method or a wet process such as a coating method, a printing method, or a droplet discharge method (an ink jet method).

Further, a protective layer may be stacked on the conductive shield 140. For example, a titanium film (thickness: about greater than or equal to 5 nm and less than or equal to 100 nm) is formed as the conductive shield 140, and then a titanium oxide film may be stacked as the protective layer on the titanium film. By formation of the protective layer, even in the case where the conductive shield 140 is provided for a surface of the semiconductor device, the protective layer is the outermost surface, and thus the conductive shield 140 can be prevented from being deteriorated. The thickness of the protective layer may be about greater than or equal to 10 nm and less than or equal to 200 nm.

Figure 2A:
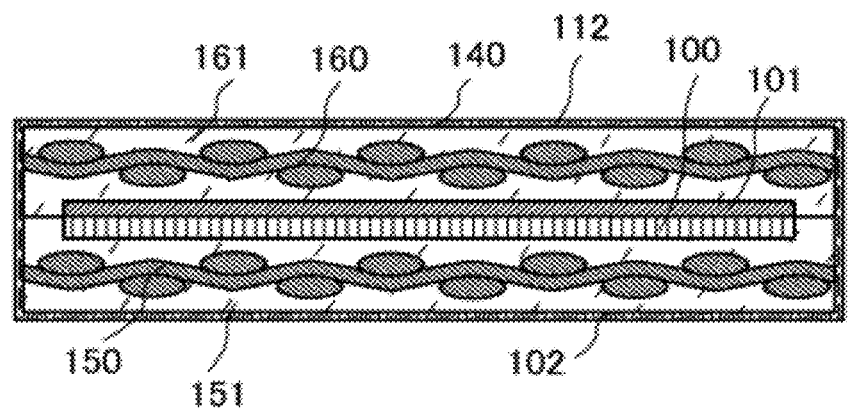
FIGS. 2A to 2C are views illustrating semiconductor devices according to an embodiment of the present invention.
Figure 2B:
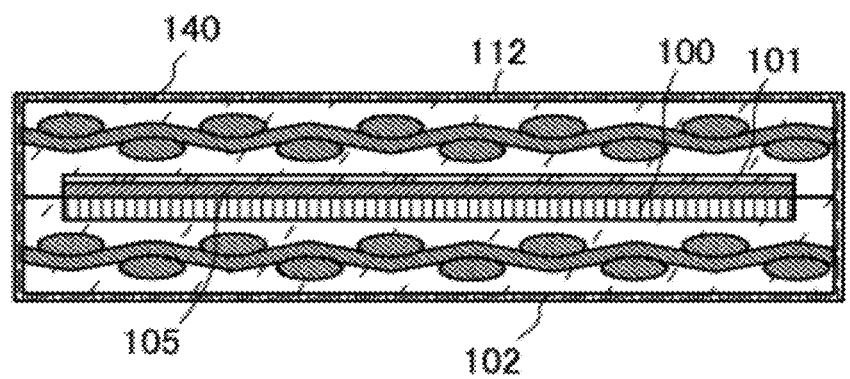
Figure 2C:
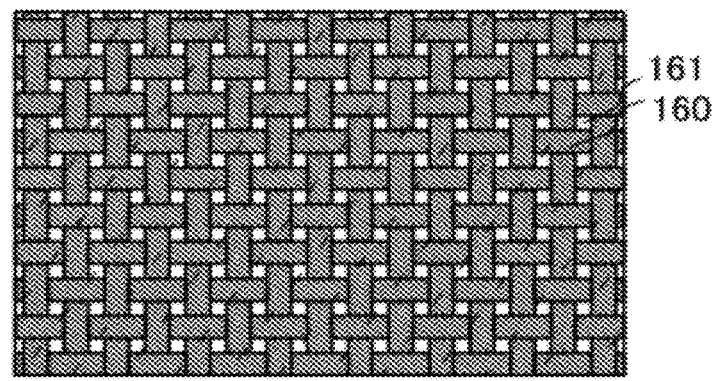

As the insulators, structure bodies in each of which a fibrous body is impregnated with an organic resin can be used. Examples in which structure bodies in each of which a fibrous body is impregnated with an organic resin are used for the first insulator 112 and the second insulator 102 are illustrated in FIGS. 2A to 2C. FIGS. 2A and 2B correspond to FIGS. 1A and 1B, respectively.

Structure bodies in each of which a fibrous body is impregnated with an organic resin is used for the first insulator 112 and the second insulator 102: the structure body in which a fibrous body 160 is impregnated with an organic resin 161 is used as the first insulator 112 and the structure body in which a fibrous body 150 is impregnated with an organic resin 151 is used as the second insulator 102.

FIG. 2C is a plan view of a woven fabric as the fibrous body 160 which is woven using fiber yarn bundles for warp and weft.

As illustrated in FIG. 2C, the fibrous body 160 is woven using warp yarns spaced at regular intervals and weft yarns spaced at regular intervals. Such a fibrous body which is woven using the warp yarns and the weft yarns has regions without the warp yarns and the weft yarns. In such a fibrous body 160, the fibrous body is more easily impregnated with the organic resin 161, so that adhesiveness between the fibrous body 160 and the semiconductor integrated circuit 100 can be increased.

As illustrated in FIG. 2C, fibers using glass or the like which are arranged on a plan surface are woven by being crossed with each other into fabric form and the woven fabric is impregnated with an organic resin, whereby expansion and contraction of the structure body in the surface direction can be suppressed and flexibility in the vertical direction can be obtained.

Further, in the fibrous body 160, density of the warp yarns and the weft yarns may be high and a proportion of the regions without the warp yarns and the weft yarns may be low.

The structure body in which the fibrous body 160 is impregnated with the organic resin 161 is also referred to as a "prepreg". A prepreg is specifically formed in the following manner: after a fibrous body is impregnated with a varnish in which a matrix resin is diluted with an organic solvent, drying is performed so that the organic solvent is volatilized and the matrix resin is semi-cured. The thickness of the structure body is preferably greater than or equal to 10 µm and less than or equal to 100 µm, more preferably greater than or equal to 10 µm and less than or equal to 30 µm. A structure body with such a thickness is used, whereby a thin semiconductor device which is thin and capable of being curved can be manufactured. For example, a prepreg, the modulus of elasticity of which is greater than or equal to 13 GPa and less than or equal to 15 GPa and the modulus of rupture of which is 140 MPa, can be used as the insulators.

Note that in this embodiment, the structure body in which a fibrous body is impregnated with an organic resin may have a layered structure. In that case, the structure body may be a stack of a plurality of structure bodies in each of which a single-layer fibrous body is impregnated with an organic resin or may be a structure body formed in which a plurality of fibrous bodies stacked are impregnated with an organic resin. In stacking a plurality of structure bodies in each of which a fibrous body of a single layer is impregnated with an organic resin, another layer may be interposed between the structure bodies.

A thermosetting resin such as an epoxy resin, an unsaturated polyester resin, a polyimide resin, a bismaleimide-triazine resin, or a cyanate resin can be used as the organic resin 161. Alternatively, a thermoplastic resin such as a polyphenylene oxide resin, a polyetherimide resin, or a fluorine resin can be used for the organic resin 161. Further alternatively, a plurality of resins selected from the above-described thermosetting resin and thermoplastic resin may be used as the organic resin 161. With use of the above organic resin, the fibrous body 160 can be firmly bonded to the semiconductor integrated circuit 100 by heat treatment. Note that the higher the glass transition temperature of the organic resin 161 is, the less the organic resin 161 is damaged by local pressing force, which is preferable.

Highly thermally-conductive filler may be dispersed in the organic resin 161 or the yarn bundles of fibers. As the highly thermally-conductive filler, aluminum nitride, boron nitride, silicon nitride, alumina, or the like can be given. As the highly thermally-conductive filler, a metal particle such as silver or copper can also be given. In the case where the highly thermally-conductive filler is included in the organic resin or the yarn bundles of fibers, heat generated in the semiconductor integrated circuit 100 can be easily released to the outside. Accordingly, thermal storage in the semiconductor device can be suppressed and thus the semiconductor device can be prevented from being damaged.

The fibrous body 160 is a woven or nonwoven fabric using high-strength fibers of an organic compound or an inorganic compound and provided so as to overlap part of the semiconductor integrated circuit 100. A high-strength fiber is specifically a fiber with a high tensile modulus of elasticity or a fiber with a high Young's modulus. As typical examples of a high-strength fiber, a polyvinyl alcohol fiber, a polyester fiber, a polyamide fiber, a polyethylene fiber, an aramid fiber, a polyparaphenylene benzobisoxazole fiber, a glass fiber, a carbon fiber, and the like can be given. As a glass fiber, a glass fiber using E glass, S glass, D glass, Q glass, or the like can be given. Note that the fibrous body 160 may be formed from one kind of the above high-strength fibers or a plurality of the above high-strength fibers.

The fibrous body 160 may be a woven fabric which is woven using bundles of fibers (single yarns) (hereinafter, the bundles of fibers are referred to as "yarn bundles") for warp yarns and weft yarns, or a nonwoven fabric obtained by stacking yarn bundles of plural kinds of fibers in a random manner or in one direction. In the case of a woven fabric, a plain-woven fabric, a twilled fabric, a satin-woven fabric, or the like can be used as appropriate.

The yarn bundle may have a circular shape or an elliptical shape in cross section. As the yarn bundle of fibers, a yarn bundle of fibers may be used which has been subjected to fiber opening with a high-pressure water stream, high-frequency vibration using liquid as a medium, continuous ultrasonic vibration, pressing with a roller, or the like. A yarn bundle of fibers which is subjected to fabric opening has a large width, has a smaller number of single yarns in the thickness direction, and has an elliptical shape or a flat shape in its cross section. Further, with use of a loosely twisted yarn as the yarn bundle of fibers, the yarn bundle is easily flattened and has an elliptical shape or a flat shape in cross section. A yarn bundle having an elliptical shape or a flat shape in cross section in this manner is used, whereby the thickness of the fibrous body 160 can be reduced. Accordingly, the structure body can be made to be thin, and thus a thin semiconductor device can be manufactured.

In the drawings of this embodiment, the fibrous body 160 is illustrated as a woven fabric which is plain-woven using a yarn bundle having an elliptical shape in cross section.

Further, in order to enhance permeability of an organic resin into the inside of the yarn bundle of fibers, the fiber may be subjected to surface treatment. For example, as the surface treatment, corona discharge, plasma discharge, or the like for activating a surface of the fiber can be given. Further, surface treatment using a silane coupling agent or a titanate coupling agent can be given.

Alternatively, a material, the modulus of elasticity of which is low and the breaking strength of which is high, may be used as the first insulator 112 and the second insulator 102. For example, as the first insulator 112 and the second insulator 102, a film having rubber elasticity, the modulus of elasticity of which is greater than or equal to 5 GPa and less than or equal to 12 GPa and the modulus of rupture of which is greater than or equal to 300 MPa, can be used.

The first insulator 112 and the second insulator 102 are preferably formed using a high-strength material. As typical examples of the high-strength material, the following can be given: a polyvinyl alcohol resin, a polyester resin, a polyamide resin, a polyethylene resin, an aramid resin, a polyparaphenylene benzobisoxazole resin, a glass resin, and the like. If the first insulator 112 and the second insulator 102 which are formed using a high-strength material having elasticity are provided, burden such as local pressing force is diffused in the entire layer and absorbed; accordingly, the semiconductor device can be prevented from being damaged.

More specifically, as the first insulator 112 and the second insulator 102, the following can be used: an aramid resin, a polyethylene naphthalate (PEN) resin, a polyether sulfone (PES) resin, a polyphenylene sulfide (PPS) resin, a polyimide (PI) resin, or the like.

An adhesive layer may be used in order to bond the semiconductor integrated circuit 100 and the first insulator 112 and the second insulator 102. An adhesive layer which is capable of firmly bonding the insulator and the semiconductor integrated circuit may be used. For example, a thermosetting resin, an ultraviolet curable resin, an acrylic resin, a urethane resin, an epoxy resin, a silicone resin, or the like can be used. The thickness of the adhesive layer may be about greater than or equal to 3 μm and less than or equal to 15 μm.

The adhesive layer is unnecessary in the case where the semiconductor integrated circuit 100 and the first insulator 112 and the second insulator 102 are bonded by heat and pressure treatment.

Further, a protective layer may be formed over the semiconductor integrated circuit 100. FIG. 1B and FIG. 2B illustrate an example in which an inorganic insulating layer 105 is formed as a protective layer over the semiconductor integrated circuit 100. In each of FIG. 1B and FIG. 2B, an example in which the antenna 101 is formed over the semiconductor integrated circuit 100 and the inorganic insulating layer 105 is formed over the antenna 101 is illustrated. The antenna 101 is covered with the inorganic insulating layer 105, whereby oxidation or the like of a conductive layer which functions as the antenna 101 can be prevented.

The inorganic insulating layer 105 is formed to have a single layer or a stacked layer using an inorganic compound by a sputtering method, a plasma CVD method, a coating method, a printing method, or the like. As typical examples of the inorganic compound, oxidized silicon and nitrided silicon can be given. Typical examples of the oxidized silicon are silicon oxide, silicon oxynitride, and the like, and typical examples of the nitrided silicon are silicon nitride, silicon nitride oxide, and the like. Note that in this specification, silicon oxynitride contains more oxygen than nitrogen, and in the case where measurements are conducted using Rutherford backscattering spectrometry (RBS) or hydrogen forward scattering (HFS), silicon oxynitride preferably contains oxygen, nitrogen, silicon, and hydrogen at concentrations ranging from 55 to 65 at. %, 1 to 20 at. %, 25 to 35 at. %, and 0.1 to 10 at. %, respectively. Further, silicon nitride oxide contains more nitrogen than oxygen, and in the case where measurements are conducted using RBS and HFS, silicon nitride oxide preferably contains oxygen, nitrogen, silicon, and hydrogen at concentrations ranging from 15 to 30 at. %, 20 to 35 at. %, 25 to 35 at. %, and 15 to 25 at. %, respectively.

The inorganic insulating layer 105 may have a stacked-layer structure. For example, the inorganic insulating layer 105 may be formed in such a manner that inorganic compounds, typically silicon oxide, silicon nitride oxide, and silicon oxynitride, are stacked.

A method for manufacturing a semiconductor device according to an embodiment of this embodiment will be described with reference to FIGS. 3A to 3D. The antenna 101 and the semiconductor integrated circuit 100 are formed over a substrate 110 with an insulating surface which is a manufacturing substrate, with a separation layer 111 therebetween (see FIG. 3A).

As the substrate 110 which is a manufacturing substrate, a glass substrate, a quartz substrate, a sapphire substrate, a ceramic substrate, a metal substrate having an insulating layer formed on its surface, or the like can be used. Alternatively, a plastic substrate which can withstand the processing temperature of this embodiment may be used. In a manufacturing process of the semiconductor device, the manufacturing substrate can be selected as appropriate in accordance with steps to be performed.

The separation layer 111 is formed by a sputtering method, a plasma CVD method, a coating method, a printing method, or the like, using a single layer or a stacked layer of a layer formed of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir) and silicon (Si); or an alloy material or a compound material containing any of the elements as its main component. A crystalline structure of a layer containing silicon may be any one of an amorphous structure, a microcrystalline structure, or a polycrystalline structure. Note that a coating method here includes a spin-coating method, a droplet discharge method, and a dispensing method in its category.

If the case where the separation layer 111 has a single layer structure, it is preferable to form a tungsten layer, a molybdenum layer, or a layer containing a mixture of tungsten and molybdenum. Alternatively, a layer containing oxide or oxynitride of tungsten, a layer containing oxide or oxynitride of molybdenum, or a layer containing oxide or oxynitride of a mixture of tungsten and molybdenum may be formed. Note that the mixture of tungsten and molybdenum corresponds, for example, to an alloy of tungsten and molybdenum.

In the case where the separation layer 111 has a stacked-layer structure, a tungsten layer, a molybdenum layer, or a layer containing a mixture of tungsten and molybdenum is preferably formed as a first layer. Oxide of tungsten, molybdenum, or a mixture of tungsten and molybdenum; nitride of tungsten, molybdenum, or a mixture of tungsten and molybdenum; oxynitride of tungsten, molybdenum, or a mixture of tungsten and molybdenum; or nitride oxide of tungsten, molybdenum, or a mixture of tungsten and molybdenum is preferably formed as a second layer.

In the case where the separation layer 111 has a stacked-layer structure of a layer containing tungsten and a layer containing tungsten oxide, the layer containing tungsten may be formed first and an insulating layer formed of oxide may be formed on the layer containing tungsten so that a layer containing tungsten oxide can be formed at an interface between the tungsten layer and the insulating layer. Further, the surface of the tungsten layer may be subjected to thermal oxidation treatment, oxygen plasma treatment, or treatment using a strong oxidizing solution such as ozone water to form a layer containing an oxide of tungsten. Plasma treatment or heat treatment may be performed in an atmosphere of oxygen, nitrogen, dinitrogen monoxide, an elementary substance of dinitrogen monoxide, or a mixed gas of the gas and another gas. The same applies to the case of forming a layer containing nitride, oxynitride and nitride oxide of tungsten. After a layer containing tungsten is formed, a silicon nitride layer, a silicon oxynitride layer and a silicon nitride oxide layer may be formed thereover.

Note that, although the separation layer 111 is formed so as to be in contact with the substrate 110 according to the above step, the embodiment of the present invention is not limited to the above step. An insulating layer which serves as a base may be formed so as to be in contact with the substrate 110 with an insulating surface, and the separation layer 111 may be provided so as to be in contact with the insulating layer.

The semiconductor integrated circuit 100 and the first insulator 112 are bonded. The semiconductor integrated circuit 100 is separated from the substrate 110, using the separation layer 111. Accordingly, the semiconductor integrated circuit 100 is provided on the first insulator 112 side (see FIG. 3B).

In this embodiment, the structure body in which the fibrous body 160 is impregnated with the organic resin 161 is used as the first insulator 112. A structural body is subjected to heat and pressure bonding treatment so that the organic resin of the structure body is plasticized or cured. In the case where the organic resin is an organic plastic resin, the organic resin which is plasticized is then cured by being cooled to room temperature. When the heat and pressure bonding treatment is performed, the organic resin is uniformly diffuse so as to be in close contact with a semiconductor integrated circuit and is cured. A step in which the structure body is subjected to heat and pressure treatment is performed under an atmospheric pressure or a reduced pressure.

Note that for a step of transfer to another substrate, the following method can be used as appropriate: a method in which a separation layer is formed between a substrate and a semiconductor integrated circuit, a metal oxide film is provided between the separation layer and the semiconductor integrated circuit, and the metal oxide film is crystallized to be embrittled, whereby a semiconductor element layer is separated; a method in which an amorphous silicon film containing hydrogen is formed between a substrate with high heat resistance and a semiconductor integrated circuit, and the amorphous silicon film is removed by laser light irradiation or etching, whereby the semiconductor integrated circuit is separated; a method in which a separation layer is formed between a substrate and a semiconductor integrated circuit, a metal oxide film is provided between the separation layer and the semiconductor integrated circuit, the metal oxide film is crystallized to be embrittled, part of the separation layer is removed by etching using a solution or a fluoride halogen gas such as $NF_3$, $BrF_3$, or $ClF_3$, and then the semiconductor integrated circuit is separated at the embrittled metal oxide film; a method in which a substrate over which a semiconductor integrated circuit is formed is mechanically removed or is removed by etching using a solution or a fluoride halogen gas such as $NF_3$, $BrF_3$, or $ClF_3$. Alternatively, a method may be used in which a film containing nitrogen, oxygen, hydrogen, or the like (e.g., an amorphous silicon film containing hydrogen, a hydrogen-containing alloy film, or an alloy film containing oxygen) is used as a separation layer, and the separation layer is irradiated with laser light so that nitrogen, oxygen, or hydrogen contained in the separation layer is discharged as a gas, whereby separation of a semiconductor integrated circuit from a substrate is promoted.

The above separation methods are combined, whereby the transfer step can be performed more easily. That is, the separation can also be performed with physical force (by a machine or the like) after performing laser light irradiation; etching to the separation layer with a gas, a solution, or the like; or mechanical removal with a sharp knife, scalpel, or the like; so as to make a condition where the separation layer and the semiconductor element layer can be easily separated from each other.

Alternatively, the semiconductor integrated circuit may be separated from the manufacturing substrate after an interface between the separation layer and the semiconductor integrated circuit is impregnated with liquid.

As in the case of the first insulator 112, the structure body in which the fibrous body 150 is impregnated with the organic resin 151 is used as the second insulator 102.

Figure 3A:
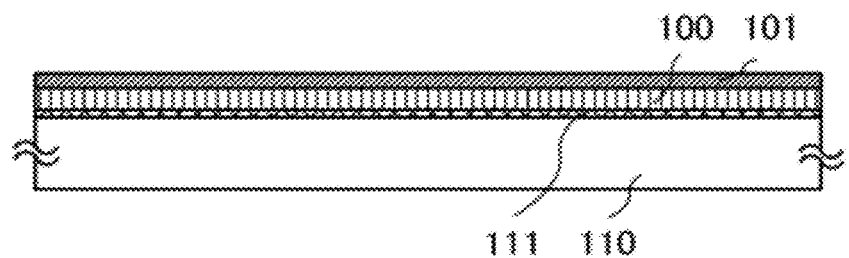
FIGS. 3A to 3D are views illustrating a method for manufacturing a semiconductor device according to an embodiment of the present invention.
Figure 3B:
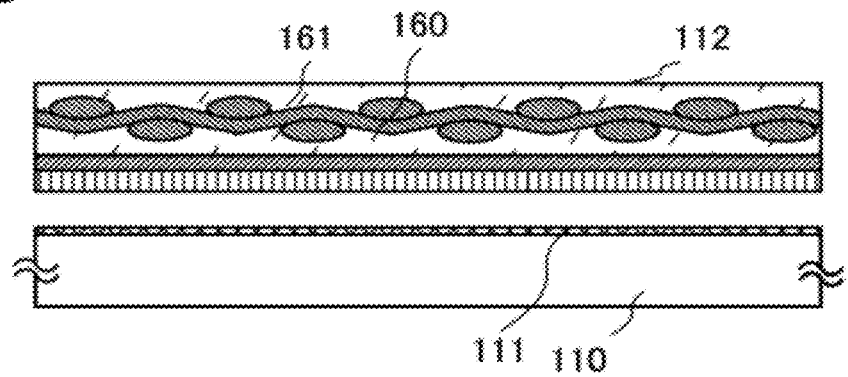
Figure 3C:
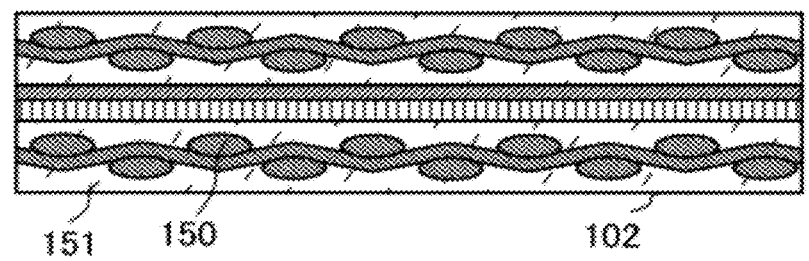
Figure 3D:
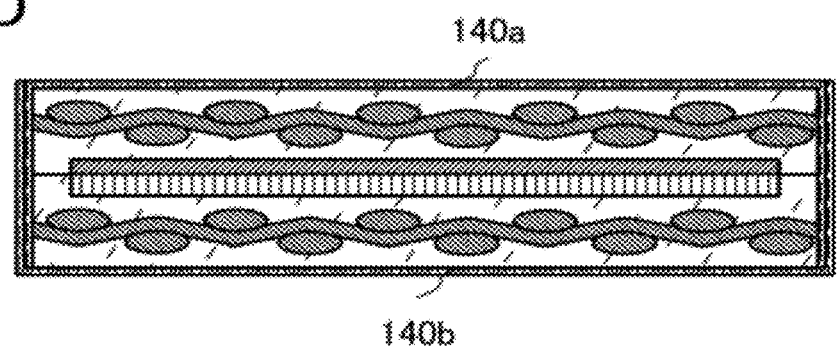

The structure body is subjected to heat and pressure bonding treatment, whereby the second insulator 102 is bonded to the exposed separation surface of the semiconductor integrated circuit 100, and accordingly the antenna 101 and the semiconductor integrated circuit 100 are sandwiched between the first insulator 112 and the second insulator 102 (see FIG. 3C).

Although not illustrated, a plurality of semiconductor integrated circuits 100 are sandwiched between the first insulator 112 and the second insulator 102. The plurality of the semiconductor integrated circuits 100 are cut off into individual semiconductor integrated circuits, and accordingly a semiconductor integrated circuit chips are manufactured. Although there is no particular limitation on a cut-off method as long as the semiconductor integrated circuits 100 can be physically cut off, laser light irradiation is used for cutting off the semiconductor integrated circuits in this embodiment.

The semiconductor integrated circuits 100 are cut off, whereby the antenna 101 and the semiconductor integrated circuit 100 are sealed by the first insulator 112 and the second insulator 102. Therefore, the first insulator 112 and the second insulator 102 are aligned with cut surfaces (side surfaces generated due to the cut-off of the semiconductor integrated circuits).

Next, the conductive shields 140a and 140b are formed so as to cover (surround) the first insulator 112 and the second insulator 102. First, a conductive shield 140a is formed on the surface and cut surfaces of the first insulator 112, and then a conductive shield 140b is formed on the surface and cut surfaces of the second insulator 102 (see FIG. 3D). In this embodiment, as the conductive shields 140a and 140b, a titanium film is formed by a sputtering method to a thickness of 10 nm (greater than 0 and less than or equal to 1 μm, preferably greater than or equal to 5 nm and less than or equal to 100 nm).

Through the above formation steps, a structure is obtained in which the antenna 101 and the semiconductor integrated circuit 100 are sealed by the first insulator 112 and the second insulator 102. The antenna 101 and the semiconductor integrated circuit 100 are also protected against electrostatic discharge by the conductive shields 140a and 140b which are provided outside the first insulator 112 and the second insulator 102, which correspond to top surface and bottom surface of the semiconductor device, and on the cut surfaces of the first insulator 112 and the second insulator 102.

The conductive shields covering the semiconductor integrated circuit prevent electrostatic breakdown of the semiconductor integrated circuit (e.g., malfunction of the circuit and damage to a semiconductor element) due to electrostatic discharge. In addition, with use of the pair of insulators between which the semiconductor integrated circuit is sandwiched, a highly reliable semiconductor device which has resistance can be provided while achieving reduction in the thickness and size. Moreover, the semiconductor device can be manufactured with high yield by prevention of external stress, or defective shapes or deterioration in characteristics resulted from electrostatic discharge also in a manufacturing process.

Embodiment 2

In this embodiment, other examples of semiconductor devices for achieving high reliability will be described with reference to FIGS. 14A and 14B, FIGS. 15A and 15B, and FIGS. 16A and 16D. In structures described below, the same portions or portions having similar functions are denoted by the same references numerals in different drawings, and repetitive description thereof is omitted.

Figure 14A:
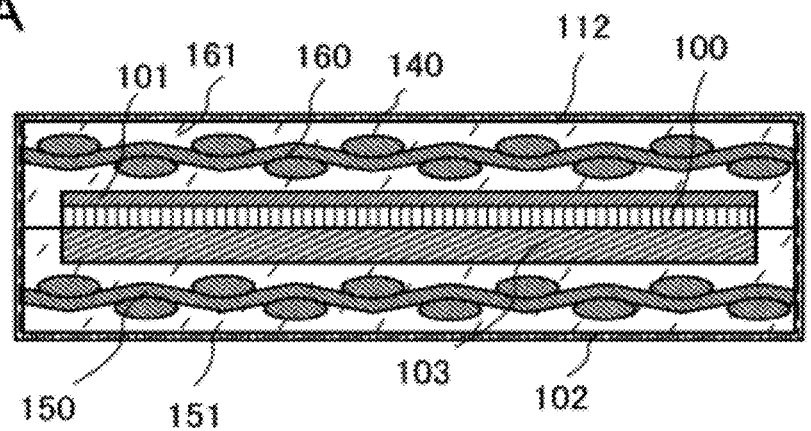
FIGS. 14A and 14B are views each illustrating a semiconductor device according to an embodiment of the present invention.

In this embodiment, an example in which an insulator has a stacked-layer structure will be described. In FIG. 14A, the antenna 101 and the semiconductor integrated circuit 100 which is connected to the antenna 101 are sandwiched between the first insulator 112 and the second insulator 102; a third insulator 103 is provided between the semiconductor integrated circuit 100 and the second insulator 102; and the conductive shield 140 is provided on an outer side (on the side opposite to the side where the semiconductor integrated circuit 100 is provided) of each of the first insulator 112 and the second insulator 102 and on cut surfaces of the first insulator 112 and the second insulator 102.

Figure 14B:
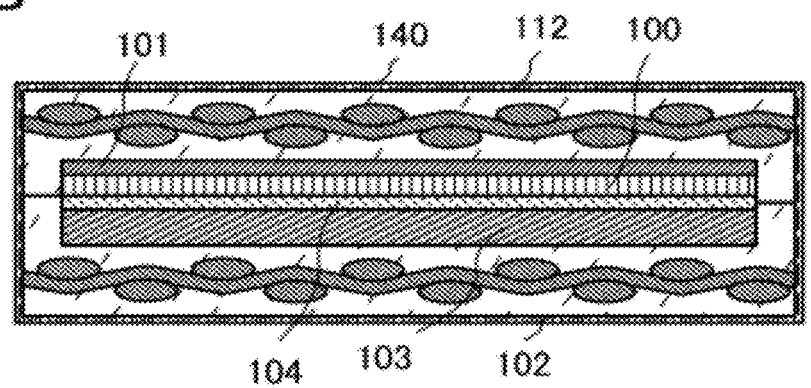

FIG. 14B illustrates an example in which the semiconductor integrated circuit 100 and the third insulator 103 are firmly bonded using an adhesive layer 104. In FIG. 14B, an acrylic resin is used for the adhesive layer 104.

The third insulator 103 which is provided between the semiconductor integrated circuit 100 and the second insulator 102 functions as an impact diffusion layer; therefore, it is preferable that the third insulator 103 have lower modulus of elasticity and higher breaking strength than the first insulator 112 and the second insulator 102.

The third insulator 103 is provided near, preferably in contact with the semiconductor integrated circuit 100, whereby an effect of diffusing more force applied from the outside to the semiconductor integrated circuit 100 so that the force is reduced is obtained.

A structure body in which a fibrous body is impregnated with an organic resin can be used as the first insulator 112 and the second insulator 102 in FIGS. 14A and 14B. The first insulator 112 and the second insulator 102 in FIGS. 14A and 14B preferably have a modulus of elasticity of greater than or equal to 13 GPa and a modulus of rupture of less than 300 MPa.

As the third insulator 103, a material, the modulus of elasticity of which is low and the breaking strength of which is high, is preferably used. For example, a film having a rubber elasticity, the modulus of elasticity of which is greater than or equal to 5 GPa and less than or equal to 12 GPa and the modulus of rupture of which is greater than or equal to 300 MPa, can be used.

The third insulator 103 is preferably formed using a high-strength material. As typical examples of the high-strength material, there are a polyvinyl alcohol resin, a polyester resin, a polyamide resin, a polyethylene resin, an aramid resin, a polyparaphenylene benzobisoxazole resin, a glass resin, and the like. If the third insulator 103 which is formed using a high-strength material having elasticity is provided, burden such as local pressing force is diffused in the entire layer and absorbed; accordingly, the semiconductor device can be prevented from being damaged.

More specifically, as the third insulator 103, the following can be used: an aramid resin, a polyethylene naphthalate (PEN) resin, a polyether sulfone (PES) resin, a polyphenylene sulfide (PPS) resin, a polyimide (PI) resin, or the like. In this embodiment, an aramid resin film (the modulus of elasticity: 10 GPa and the modulus of rupture: 480 MPa) is used as the third insulator 103.

Figure 15A:
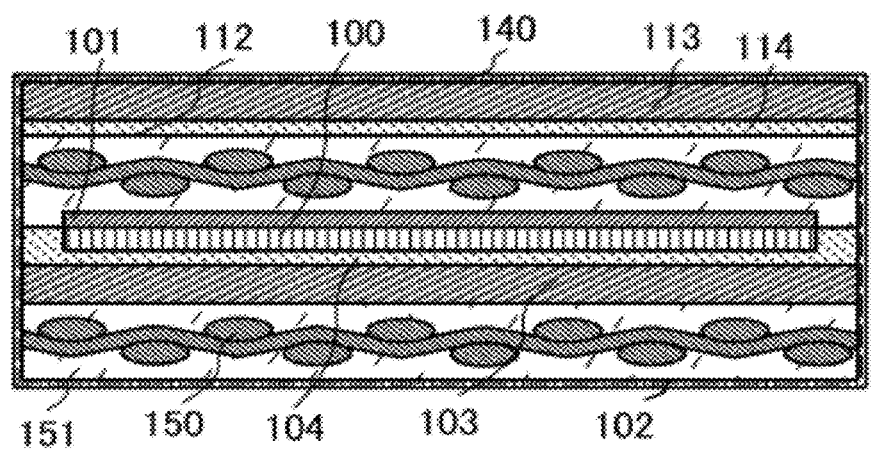
FIGS. 15A and 15B are views each illustrating a semiconductor device according to an embodiment of the present invention.
Figure 15B:
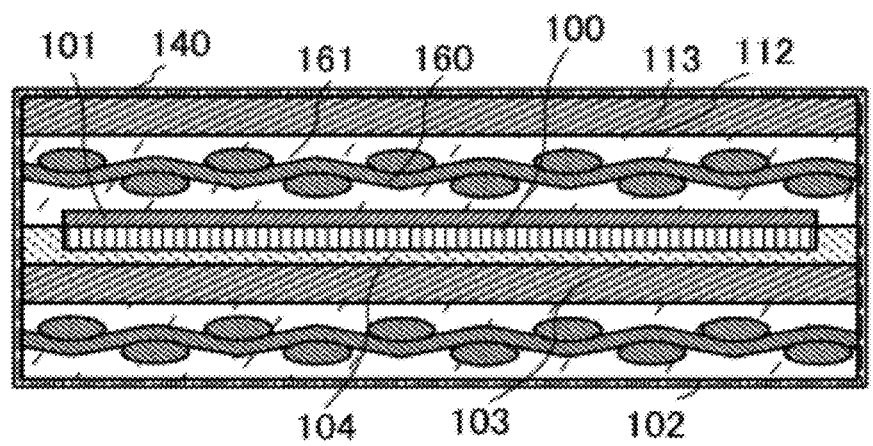

As illustrated in FIGS. 15A and 15B, a fourth insulator 113 which is similar to the third insulator 103 may also be provided on an outer side (on the side opposite to the side where antenna 101 is provided) of the first insulator 112.

FIG. 15A illustrates an example in which the fourth insulator 113 which is similar to the third insulator 103 is firmly bonded to the outside of the first insulator 112 using an adhesive layer 114. In this embodiment, an aramid film is used as the fourth insulator 113 and an acrylic resin is used as the adhesive layer 114. The adhesive layer 114 does not have to be used in the case where the first insulator 112 and the fourth insulator 113 are bonded by heat and pressure treatment. In that case, the antenna 101, the first insulator 112, and the fourth insulator 113 are directly bonded as in FIG. 15B. A step of bonding the antenna 101 and the first insulator 112 and a step of bonding the first insulator 112 and the fourth insulator 113 may be performed at the same time or separately.

A method for manufacturing a semiconductor device according to an embodiment of this embodiment will be described with reference to FIGS. 16A to 16D. The antenna 101 and the semiconductor integrated circuit 100 are formed over the substrate 110 with an insulating surface which is a manufacturing substrate, with a separation layer 111 therebetween (see FIG. 16A).

The antenna 101 and the semiconductor integrated circuit 100 are bonded to the first insulator 112. The semiconductor integrated circuit 100 is separated from the substrate 110, using the separation layer 111. Accordingly, the semiconductor integrated circuit 100 is provided on the first insulator 112 side (see FIG. 16B).

Figure 16A:
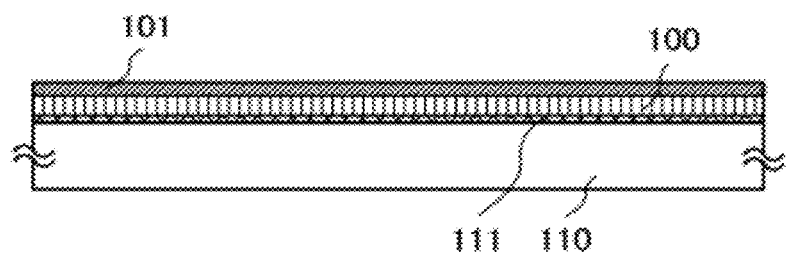
FIGS. 16A to 16D are views illustrating a method for manufacturing a semiconductor device according to an embodiment of the present invention.
Figure 16B:
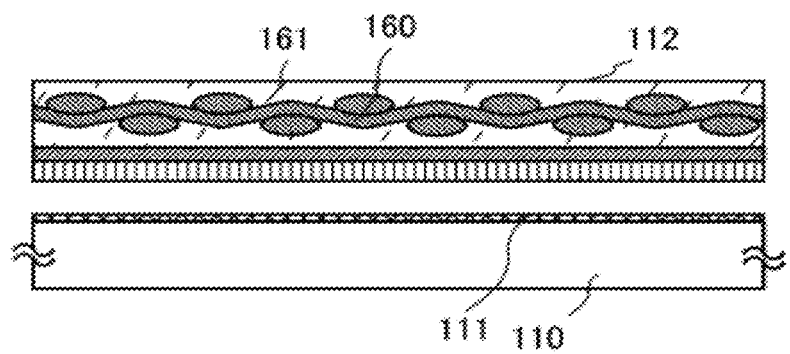
Figure 16C:
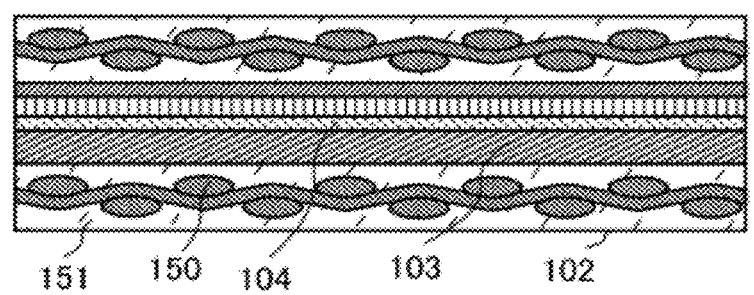
Figure 16D:
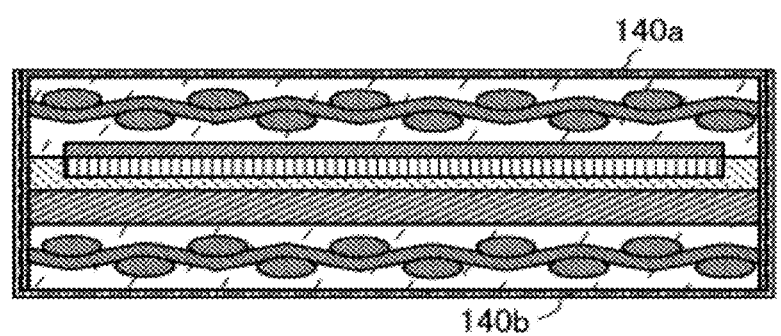

Also in FIGS. 16B to 16D, the structure body in which a fibrous body 160 is impregnated with the organic resin 161 is used as the first insulator 112. A structure body is subjected to heat and pressure bonding treatment, whereby the organic resin of the structure body is plasticized or cured.

As in the case of the first insulator 112, the structure body in which the fibrous body 150 is impregnated with the organic resin 151 is used as the second insulator 102. The structure body is subjected to heat and pressure bonding treatment, whereby the second insulator 102 is bonded to the third insulator 103. The adhesive layer 104 is provided on a surface of the third insulator 103, which is on the side opposite to the side where the second insulator 102 is provided.

The adhesive layer 104 is bonded to an exposed separation surface of the semiconductor integrated circuit 100 (see FIG. 16C).

Although not illustrated, a plurality of semiconductor integrated circuits 100 are sandwiched between the first insulator 112 and the second insulator 102. The plurality of the semiconductor integrated circuits 100 are cut off into individual semiconductor integrated circuits and the conductive shield 140 is formed on an outer side of the first insulator 112 and the second insulator 102, and accordingly a semiconductor integrated circuit chips are manufactured. Although there is no particular limitation on a separation method as long as the semiconductor integrated circuits 100 can be physically separated, laser light irradiation is used for separation in this embodiment.

Next, the conductive shields 140a and 140b are formed so as to cover (surround) the first insulator 112 and the second insulator 102 (see FIG. 16D). First, the conductive shield 140a is formed on a surface and cut surfaces of the first insulator 112, and then the conductive shield 140b is formed on a surface and cut surfaces of the second insulator 102. In this embodiment, as the conductive shields 140a and 140b, a titanium film is formed by a sputtering method to a thickness of 10 nm (preferably greater than or equal to 5 nm and less than or equal to 100 nm) on the surfaces of the first insulator 112 and the second insulator 102.

Through the formation in the above manner, a structure is obtained in which the antenna 101 and the semiconductor integrated circuit 100 are sealed by the first insulator 112 and the second insulator 102. The antenna 101 and the semiconductor integrated circuit 100 are also protected against electrostatic discharge by the conductive shields 140a and 140b which are provided outside the first insulator 112 and the second insulator 102, which correspond to top surface and bottom surface of the semiconductor device, and on the cut surfaces of the first insulator 112 and the second insulator 102.

The third insulator 103 and the fourth insulator 113 have an effect of increasing strength against external stress. In addition, the third insulator 103 diffuses force even if pressure treatment is performed in a manufacturing process especially in the case where the third insulator 103 is provided between the semiconductor integrated circuit 100 and the second insulator 102. Thus, the semiconductor integrated circuit 100 is not adversely affected, such as damage or deterioration in characteristics. Accordingly, the semiconductor device can be manufactured with high yield.

The conductive shields 140a and 140b transmit electromagnetic waves to be transmitted and received by the antenna 101 included in the semiconductor device and blocks application of external static electricity to the semiconductor integrated circuit 100 in the semiconductor device. Since the conductive shields 140a and 140b diffuse and release static electricity applied by electrostatic discharge or prevent electric charge from locally existing (localization of electric charge) (prevents local electric potential difference from occurring), the semiconductor integrated circuit 100 can be prevented from being damaged by static electricity.

The first insulator 112 and the second insulator 102 which can resist external force applied to the semiconductor device and furthermore the fourth insulator 113 and the third insulator 103 which diffuse the force are provided, whereby locally applied force can be reduced. Therefore, damage to the semiconductor device or deterioration in characteristics thereof can be prevented.

Further, in the structure of FIG. 15A of this embodiment, the number of insulators is four: the first insulator 112 and the second insulator 102 each of which mainly serves as an impact resistance layer and is a structure body in which the fibrous body is impregnated with the organic resin, and the third insulator 103 and the fourth insulator 113 each of which mainly serves as an impact diffusion layer and has low modulus of elasticity and high breaking strength are formed; however, at least two insulators between which the antenna 101 and the semiconductor integrated circuit 100 are sandwiched may be used. Therefore, a structure in which three or two insulators of the above four insulators are used may be employed. The conductive shield 140 may be provided on an outer side, which is on the side opposite to the side where the semiconductor integrated circuit 100 is provided, of the insulator or may be provided between stacked insulators in the case where the insulators are stacked.

The conductive shields covering (surrounding) the semiconductor integrated circuit prevent electrostatic breakdown of the semiconductor integrated circuit (e.g., malfunction of the circuit and damage to a semiconductor element) due to electrostatic discharge. In addition, with use of the pair of insulators between which the semiconductor integrated circuit is sandwiched, a highly reliable semiconductor device which has resistance can be provided while achieving reduction in the thickness and size. Moreover, the semiconductor device can be manufactured with high yield by prevention of external stress, or defective shapes or deterioration in characteristics resulted from electrostatic discharge also in a manufacturing process.

Embodiment 3

In this embodiment, a more highly reliable semiconductor device and a method for manufacturing a semiconductor device with high yield will be described in detail with reference to FIGS. 4A to 4C and FIGS. 5A and 5B. In this embodiment, as an example of the semiconductor device, a CMOS (complementary metal oxide semiconductor) will be described.

Figure 4A:
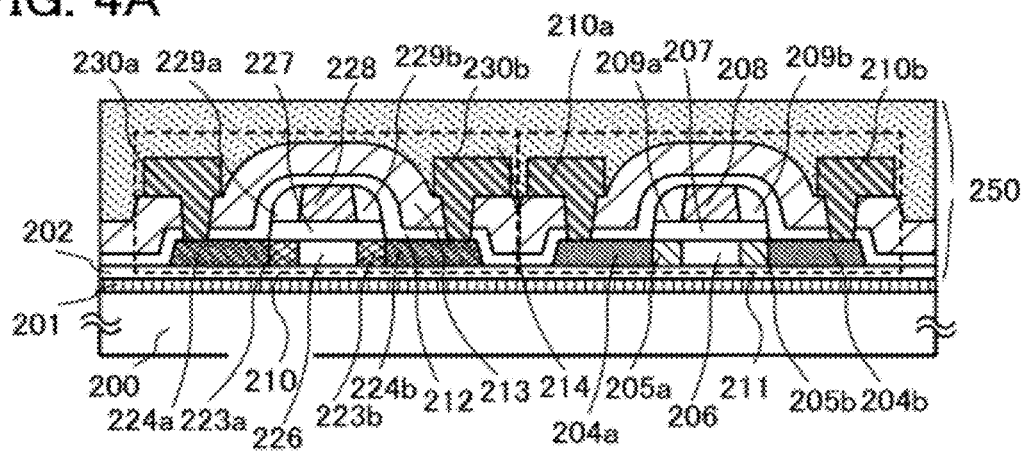
FIGS. 4A to 4C are views illustrating a method for manufacturing a semiconductor device according to an embodiment of the present invention.
Figure 4B:
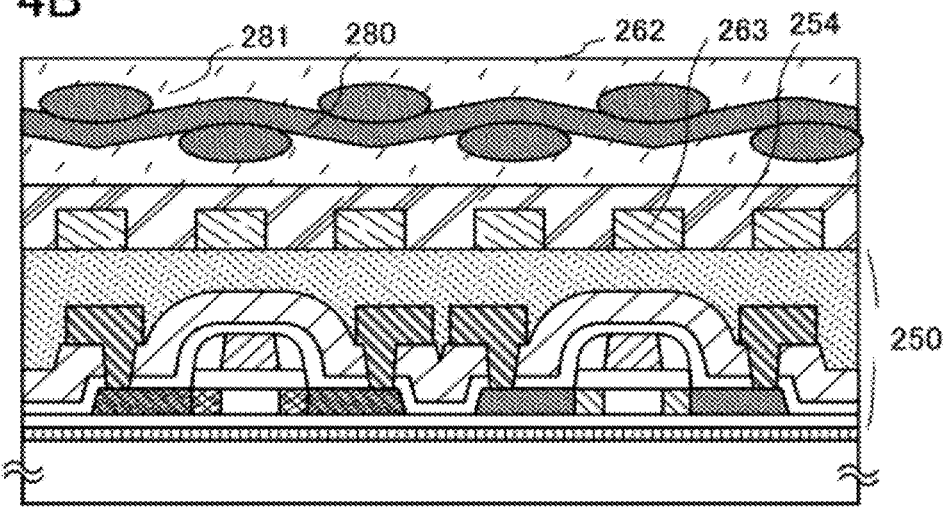
Figure 4C:
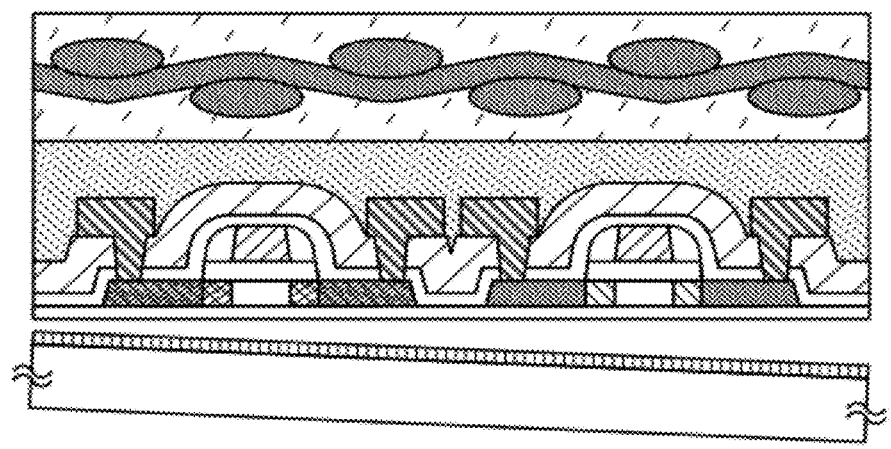

Transistors 210 and 211, an insulating film 212, an insulating film 213, and an insulating layer 214 are provided over a substrate 200 with an insulating surface which is a manufacturing substrate, with a separation layer 201 and a base film 202 therebetween; accordingly, a semiconductor integrated circuit 250 is formed (see FIG. 4A).

The transistor 210 is a thin film transistor and includes source and drain regions 224a and 224b; impurity regions 223a and 223b the concentrations of impurity of which are lower than those of the source and drain regions 224a and 224b; a channel formation region 226; a gate insulating layer 227; a gate electrode layer 228; and insulating layers 229a and 229b with a sidewall structure. The source and drain regions 224a and 224b are respectively in contact with wiring layers 230a and 230b which function as source and drain electrode layers to be electrically connected. In this embodiment, the transistor 210 is a p-channel thin film transistor, in which an impurity element imparting p-type conductivity (e.g., boron (B), aluminum (Al), or gallium (Ga)) is contained in the source and drain regions 224a and 224b and the impurity regions 223a and 223b which are LDD (lightly doped drain) regions.

The transistor 211 is a thin film transistor and includes source and drain regions 204a and 204b; impurity regions 205a and 205b the concentrations of impurity of which are lower than those of the source and drain regions 204a and 204b; a channel formation region 206; a gate insulating layer 207; a gate electrode layer 208; and insulating layers 209a and 209b with a sidewall structure. The source and drain regions 204a and 204b are respectively in contact with wiring layers 210a and 210b which function as source and drain electrode layers to be electrically connected. In this embodiment, the transistor 211 is an n-channel thin film transistor, in which an impurity element imparting n-type conductivity (e.g., phosphorus (P) or arsenic (As)) is contained in the source and drain regions 204a and 204b and the impurity regions 205a and 205b which are LDD (lightly doped drain) regions.

Next, a conductive layer 263 which functions as an antenna is formed over the insulating layer 214, and an inorganic insulating layer 254 is formed as a protective layer over the conductive layer 263. In this embodiment, a silicon nitride film is formed as the inorganic insulating layer 254. The conductive layer 263 is electrically connected to the semiconductor integrated circuit 250.

As a first insulator 262, a structure body in which a fibrous body 280 is impregnated with an organic resin 281 is used. The inorganic insulating layer 254, the conductive layer 263, and the semiconductor integrated circuit 250 are bonded to the first insulator 262, and the inorganic insulating layer 254, the conductive layer 263, and the semiconductor integrated circuit 250 are separated from the substrate 200, using the separation layer 201. Accordingly, the semiconductor integrated circuit 250 is provided on the first insulator 262 side (see FIGS. 4B and 4C).

As in the case of the first insulator 262, a structure body in which a fibrous body 270 is impregnated with an organic resin 271 is used as a second insulator 252.

Figure 5A:
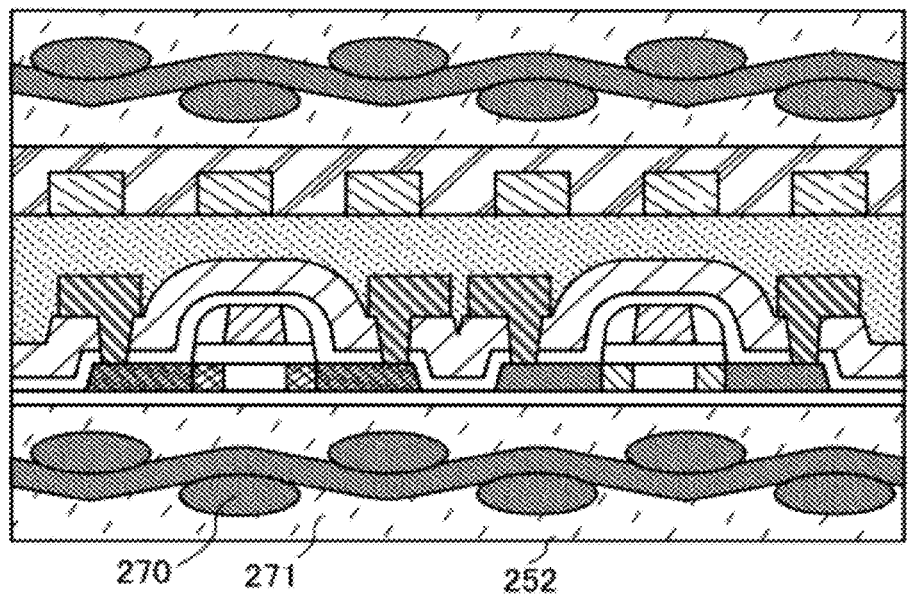
FIGS. 5A and 5B are views illustrating a method for manufacturing a semiconductor device according to an embodiment of the present invention.
Figure 5B:
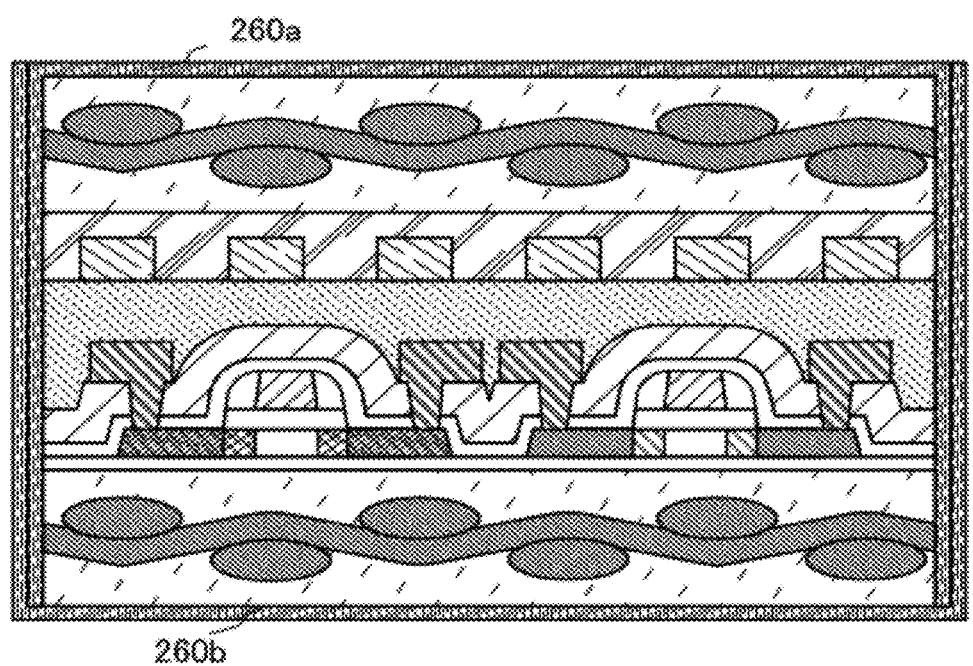

The structure body and the second insulator 252 are subjected to heat and pressure bonding treatment, whereby the second insulator 252 is bonded to an exposed separation surface of the semiconductor integrated circuit 250; accordingly, the inorganic insulating layer 254, the conductive layer 263, and the semiconductor integrated circuit 250 are sandwiched between the first insulator 262 and the second insulator 252 (see FIG. 5A).

Although not illustrated, a plurality of semiconductor integrated circuits are sandwiched between the first insulator 262 and the second insulator 252. The plurality of semiconductor integrated circuits 250 are cut off into individual semiconductor integrated circuits. Accordingly, semiconductor integrated circuit chips are manufactured. Although there is no particular limitation on a cut-off method as long as the semiconductor integrated circuits 100 can be physically cut off, laser light irradiation is used for cutting off the semiconductor integrated circuits 100 in this embodiment. The semiconductor integrated circuits 100 are cut off, whereby the antenna and the semiconductor integrated circuit 100 are sealed by the first insulator 262 and the second insulator 252. Therefore, the first insulator 262 and the second insulator 252 are aligned with cut surfaces (side surfaces generated due to the cut-off of the semiconductor integrated circuits).

Next, conductive shields 260a and 260b are formed so as to cover (surround) the first insulator 262 and the second insulator 252. First, the conductive shield 260a is formed on a surface and cut surfaces of the first insulator 262, and then the conductive shield 260b is formed on a surface and cut surfaces of the second insulator 252 (see FIG. 5B). In this embodiment, as the conductive shields 260a and 260b, a titanium film is formed by a sputtering method to a thickness of 10 nm (preferably greater than or equal to 5 nm and less than or equal to 100 nm).

Through the formation in the above manner, a structure is obtained in which the conductive layer 263 which is an antenna and the semiconductor integrated circuit 250 are sealed by the first insulator 262 and the second insulator 252. The conductive layer 263 and the semiconductor integrated circuit 250 are also protected against electrostatic discharge by the conductive shields 260a and 260b which are provided on an outside the first insulator 262 and the second insulator 252, which correspond to top surface and bottom surface of the semiconductor device, and on the cut surfaces of the first insulator 262 and the second insulator 252.

The conductive shields 260a and 260b transmit electromagnetic waves to be transmitted and received by the conductive layer 263 which is the antenna included in the semiconductor device and block external static electricity applied to the semiconductor integrated circuit 250 in the semiconductor device. Since the conductive shields 260a and 260b diffuse and release static electricity applied by electrostatic discharge or prevent electric charge from locally existing (localization of electric charge) (prevents local electric potential difference from occurring), the semiconductor integrated circuit 250 can be prevented from being damaged by static electricity.

Further, since the insulators and the conductive shields are provided so as to sandwich the semiconductor integrated circuit, adverse effects on the semiconductor integrated circuit due to external stress or electrostatic discharge, such as damage or deterioration in characteristics can be prevented also in a manufacturing process. Thus, the semiconductor device can be manufactured with high yield.

The semiconductor device manufactured in this embodiment can be a semiconductor device with flexibility if a flexible insulator is used.

As a material for forming a semiconductor layer included in the transistors 210 and 211, an amorphous semiconductor (hereinafter also referred to as "AS") formed using a semiconductor material gas typified by silane or germane by a vapor phase growth method or a sputtering method; a polycrystalline semiconductor formed by crystallization of the amorphous semiconductor with utilization of light energy or thermal energy; a microcrystalline semiconductor (also referred to as "semi-amorphous semiconductor" or a "microcrystalline semiconductor"; hereinafter also referred to as "SAS"); or the like can be used. The semiconductor layer can be formed by a sputtering method, an LPCVD method, a plasma CVD method, or the like.

A microcrystalline semiconductor film belongs to a metastable state which is intermediate between an amorphous state and a single crystal state when Gibbs free energy is considered. In other words, the microcrystalline semiconductor film is a semiconductor having a third state which is stable in terms of free energy and has a short range order and lattice distortion. Columnar-like or needle-like crystals grow in a normal direction with respect to a substrate surface. The Raman spectrum of microcrystalline silicon, which is a typical example of a microcrystalline semiconductor, is located in lower wave numbers than 520 cm$^{-1}$, which represents a peak of the Raman spectrum of single crystal silicon. That is, the peak of the Raman spectrum of the microcrystalline silicon is located between 480 cm$^{-1}$, which represents amorphous silicon, and 520 cm$^{-1}$, which represents the single crystal silicon. The semiconductor includes hydrogen or halogen of at least 1 at. % to terminate a dangling bond. Furthermore, a rare gas element such as helium, argon, krypton, or neon may be contained to further promote lattice distortion, so that stability is increased and a favorable microcrystalline semiconductor film can be obtained.

The microcrystalline semiconductor film can be formed by a high-frequency plasma CVD method with a frequency of several tens to several hundreds of megahertz or with a microwave plasma CVD apparatus with a frequency of 1 GHz or more. The microcrystalline semiconductor film can be typically formed using a dilution of silicon hydride such as SiH$_4$, Si$_2$H$_6$, SiH$_2$Cl$_2$, SiHCl$_3$, SiCl$_4$, or SiF$_4$ with hydrogen. With a dilution with one or plural kinds of rare gas elements selected from helium, argon, krypton, and neon in addition to silicon hydride and hydrogen, the microcrystalline semiconductor film can be formed. In that case, the flow rate ratio of hydrogen to silicon hydride is set to be 5:1 to 200:1, preferably, 50:1 to 150:1, more preferably, 100:1.

Hydrogenated amorphous silicon can be typically given as the amorphous semiconductor, while polysilicon or the like can be typically given as crystalline semiconductor. Examples of polysilicon (polycrystalline silicon) include so-called high-temperature polysilicon which contains polysilicon as a main component and is formed at a process temperature of greater than or equal to 800° C., so-called low-temperature polysilicon which contains polysilicon as a main component and is formed at a process temperature of less than or equal to 600° C., polysilicon obtained by crystallization of amorphous silicon using an element which promotes crystallization or the like, and the like. Needless to say, as described above, a microcrystalline semiconductor, or a semiconductor which includes a crystalline phase in part of a semiconductor layer can be used.

As a material of the semiconductor, as well as an element of silicon (Si), germanium (Ge), or the like, a compound semiconductor such as GaAs, InP, SiC, ZnSe, GaN, or SiGe can be used. Alternatively, an oxide semiconductor such as zinc oxide (ZnO), tin oxide (SnO$_2$), magnesium oxide zinc, gallium oxide, or indium oxide; an oxide semiconductor formed using a plural elements of the above oxide semiconductors; or the like can be used. For example, an oxide semiconductor formed using zinc oxide, indium oxide, and gallium oxide; or the like can be used. Note that in the case of using zinc oxide for the semiconductor layer, a single layer or a stacked layer of Y$_2$O$_3$, Al$_2$O$_3$, or TiO$_2$ is preferably used as the gate insulating layer, and ITO, Au, Ti, or the like is preferably used for the gate electrode layer, the source electrode layer, or the drain electrode layer. In addition, In, Ga, or the like can be added to ZnO.

In the case of using a crystalline semiconductor layer as the semiconductor layer, the crystalline semiconductor film may be formed by a variety of methods (e.g., a laser crystallization method, a thermal crystallization method, and a thermal crystallization method using an element which promotes crystallization such as nickel). Further, a microcrystalline semiconductor, which is an SAS, can be crystallized by being irradiated with laser light to increase its crystallinity. In the case where the element which promotes crystallization is not introduced, prior to irradiation of an amorphous silicon film with laser light, the amorphous silicon film is heated at 500° C. for one hour under a nitrogen atmosphere to release hydrogen contained in the amorphous silicon film such that the concentration of hydrogen becomes less than or equal to $1 \times 10^{20}$ atoms/cm$^3$ or less. This is because the amorphous silicon film is destroyed when the amorphous silicon film containing a high amount of hydrogen is irradiated with laser light.

There is no particular limitation on a method of introducing a metal element into the amorphous semiconductor layer as long as a method of introducing the metal element into a surface or inside of the amorphous semiconductor layer is used. For example, a sputtering method, a CVD method, a plasma treatment method (including a plasma CVD method), an adsorption method, or a method in which a solution of metal salt is applied can be used. Among the above methods, a method using a solution is simple and advantageous in that the concentration of the metal element can be easily controlled. Further, in order to improve the wettability of the surface of the amorphous semiconductor layer to spread an aqueous solution on the entire surface of the amorphous semiconductor layer, an oxide film is preferably formed by UV light irradiation in an oxygen atmosphere, thermal oxidation, treatment using ozone water containing hydroxy radical or hydrogen peroxide solution, or the like.

In the crystallization step for forming the crystalline semiconductor layer by crystallization of the amorphous semiconductor layer, the crystallization may also be performed in such a manner that an element which promotes crystallization (also referred to as a "catalytic element" or a "metal element") is added to the amorphous semiconductor layer and thermal treatment (550° C. to 750° C. for 3 minutes to 24 hours) is performed. As the element that promotes crystallization, one or plural kinds of elements selected from iron (Fe), nickel (Ni), cobalt (Co), ruthenium (Ru), rhodium (Rh), palladium (Pd), osmium (Os), iridium (Ir), platinum (Pt), copper (Cu), and gold (Au) can be used.

In order to remove or reduce the element which promotes crystallization from the crystalline semiconductor layer, a semiconductor film containing an impurity element is formed in contact with the crystalline semiconductor layer and is made to function as a gettering sink. As the impurity element, an impurity element imparting n-type conductivity, an impurity element imparting p-type conductivity, a rare gas element, or the like can be used. For example, one or plural kinds of elements selected from phosphorus (P), nitrogen (N), arsenic (As), antimony (Sb), bismuth (Bi), boron (B), helium (He), neon (Ne), argon (Ar), krypton (Kr), and xenon (Xe) can be used. The semiconductor layer containing a rare gas element is formed over the crystalline semiconductor layer containing an element which promotes crystallization, and heat treatment (at 550° C. to 750° C. for 3 minutes to 24 hours) is performed. The element which promotes crystallization in the crystalline semiconductor layer moves into the semiconductor layer containing a rare gas element, and the element which promotes crystallization in the crystalline semiconductor layer is removed or reduced. After that, the semiconductor layer containing a rare gas element, which serves as a gettering sink, is removed.

The amorphous semiconductor layer may be crystallized using a combination of a heat treatment and a laser light irradiation treatment. The heat treatment or the laser light irradiation treatment may be carried out several times, separately.

Further, the crystalline semiconductor layer may be formed over a substrate directly by a plasma method. Alternatively, the crystalline semiconductor layer may be selectively formed over a substrate, using a plasma method.

The gate insulating layers 207 and 227 may be formed of silicon oxide or a stacked layer of silicon oxide and silicon nitride. The gate insulating layers 207 and 227 may be formed by deposition of an insulating film by a plasma CVD method or a low pressure CVD method or may be formed by solid phase oxidation or solid phase nitridation by plasma treatment. This is because a gate insulating layer formed by oxidation or nitridation of a single crystal semiconductor layer by plasma treatment is dense, has high withstand voltage, and is excellent in reliability. For example, a surface of the semiconductor layer is oxidized or nitrided using nitrous oxide ($N_2O$) diluted with Ar by 1 to 3 times (flow ratio) by application of a microwave (2.45 GHz) power of 3 kW to 5 kW at a pressure of 10 Pa to 30 Pa. Through this process, an insulating film with a thickness of 1 nm to 10 nm (preferably 2 nm to 6 nm) is formed. Further, nitrous oxide ($N_2O$) and silane ($SiH_4$) are introduced, and a microwave (2.45 GHz) with a power of 3 kW to 5 kW is applied at a pressure of 10 Pa to 30 Pa to form a silicon oxynitride film by a vapor deposition method, whereby the gate insulating layer is formed. The combination of the solid phase reaction and the reaction by the vapor deposition method can form a gate insulating layer with a low interface state density and an excellent withstand voltage.

As the gate insulating layers 207 and 227, a high dielectric constant material such as zirconium dioxide, hafnium oxide, titanium dioxide, tantalum pentoxide, or the like may be used. If a high dielectric constant material is used for the gate insulating layers 207 and 227, gate leakage current can be reduced.

The gate electrode layers 208 and 228 can be formed by a CVD method, a sputtering method, a droplet discharge method, and the like. The gate electrode layer may be formed of an element selected from Ag, Au, Cu, Ni, Pt, Pd, Ir, Rh, W, Al, Ta, Mo, Cd, Zn, Fe, Ti, Si, Ge, Zr, and Ba; or an alloy material or a compound material containing any of the elements as its main component. Alternatively, a semiconductor film typified by a polycrystalline silicon film doped with an impurity element such as phosphorus, or AgPdCu alloy may be used. Further, either a single-layer structure or a multilayer structure may be employed; for example, a two-layer structure of a tungsten nitride film and a molybdenum film may be employed or a three-layer structure in which a tungsten film with a thickness of 50 nm, a film of an aluminum-silicon alloy (Al—Si) with a thickness of 500 nm, and a titanium nitride film with a thickness of 30 nm are stacked in this order may be employed. In the case of the three-layer structure, a tungsten nitride film may be used instead of the tungsten film as the first conductive film, an aluminum-titanium alloy (Al—Ti) film may be used instead of the aluminum-silicon alloy (Al—Si) film as the second conductive film, and a titanium film may be used instead of the titanium nitride film as the third conductive film.

A light-transmitting material having a property of transmitting visible light can be used for the gate electrode layers 208 and 228. As a light-transmitting conductive material, indium tin oxide (ITO), indium tin oxide containing silicon oxide (ITSO), organic indium, organic tin, zinc oxide, or the like can be used. Alternatively, indium zinc oxide (IZO) containing zinc oxide (ZnO); zinc oxide (ZnO); ZnO doped with gallium (Ga); tin oxide ($SnO_2$); indium oxide containing tungsten oxide; indium zinc oxide containing tungsten oxide; indium oxide containing titanium oxide; indium tin oxide containing titanium oxide; or the like may be used.

In the case where etching processing is needed for forming the gate electrode layers 208 and 228, a mask may be formed and dry etching or wet etching may be performed. The gate electrode layers can be etched into a tapered shape by ICP (inductively coupled plasma) etching and by appropriate adjustment of etching conditions (e.g., the amount of electric power applied to a coiled electrode, the amount of electric power applied to an electrode on the substrate side, and the electrode temperature on the substrate side). Note that a chlorine-based gas typified by $Cl_2$, $BCl_3$, $SiCl_4$, $CCl_4$, or the like; a fluorine-based gas typified by $CF_4$, $SF_6$, $NF_3$, or the like; or $O_2$ can be used as appropriate as an etching gas.

The insulating layers 209a, 209b, 229a, and 229b having a sidewall may be formed in a self-aligned manner in the following manner: an insulating layer covering the gate electrode layer and the semiconductor layer is formed, and then the insulating layer is processed by anisotropic etching using an RIE (reactive ion etching) method. Here, although there is no particular limitation on the insulating layers, the insulating layers are preferably formed using silicon oxide with favorable step coverage, which is formed by reaction of TEOS (tetra-ethyl-ortho-silicate) or silane with oxygen, nitrous oxide, or the like. The insulating layer can be formed by a thermal CVD method, a plasma CVD method, an atmospheric pressure CVD method, a bias ECR CVD method, a sputtering method, or the like.

Although a single gate structure is described in this embodiment, a multi-gate structure such as a double gate structure may also be employed. In that case, gate electrode layers may be provided above and below the semiconductor layer or a plurality of gate electrode layers may be provided only on one side (above or below) of the semiconductor layer.

Further, a structure in which a silicide is provided for the source and drain regions of the transistor may be employed. The silicide is formed in such a manner that a conductive film is formed over the source and drain regions of the semiconductor layer, and silicon of exposed source and drain regions of the semiconductor layer is made to react with the conductive film by heat treatment, a GRTA method, an LRTA method, or the like. Alternatively, the silicide may be formed by light irradiation using a laser or lamp. As a material of the conductive film which forms the silicide, the following can be used: titanium (Ti), nickel (Ni), tungsten (W), molybdenum (Mo), cobalt (Co), zirconium (Zr), hafnium (Hf), tantalum (Ta), vanadium (V), neodymium (Nd), chromium (Cr), platinum (Pt), palladium (Pd), or the like.

The wiring layers 210a, 210b, 230a, and 230b which function as source and drain electrode layers can be formed in such a manner that a conductive film is formed by a PVD method, a CVD method, an evaporation method, or the like and then the conductive film is etched into a desired shape. Alternatively, the wiring layer can be selectively formed at a predetermined place by a printing method, an electroplating method, or the like. Further, a reflow method and a damascene method may be used as well. As a material of the wiring layers 210a, 210b, 230a, and 230b, the following can be used: metal such as Ag, Au, Cu, Ni, Pt, Pd, Ir, Rh, W, Al, Ta, Mo, Cd, Zn, Fe, Ti, Zr, or Ba, a semiconductor such as Si or Ge, or an alloy or a nitride thereof. Alternatively, a light-transmitting material can be used.

If a light-transmitting conductive material is used, the following can be used: indium tin oxide (ITO), indium tin oxide containing silicon oxide (ITSO), indium zinc oxide (IZO) containing zinc oxide (ZnO), zinc oxide (ZnO), ZnO doped with gallium (Ga), tin oxide ($SnO_2$), indium oxide containing tungsten oxide, indium zinc oxide containing tungsten oxide, indium oxide containing titanic oxide, indium tin oxide containing titanic oxide, or the like.

An inorganic insulating material such as silicon oxide, silicon nitride, silicon oxynitride, aluminum oxide, aluminum nitride, or aluminum oxynitride can be used for forming the insulating films 212 and 213 and the insulating layer 214.

The conductive shields covering the semiconductor integrated circuit prevent electrostatic breakdown of the semiconductor integrated circuit (e.g., malfunction of the circuit and damage to a semiconductor element) due to electrostatic discharge. In addition, with use of the pair of insulators by which the semiconductor integrated circuit is sandwiched, a highly reliable semiconductor device which has resistance can be provided while achieving reduction in the thickness and size. Moreover, the semiconductor device can be manufactured with high yield by prevention of external stress, or defective shapes or deterioration in characteristics resulted from electrostatic discharge also in a manufacturing process.

As a semiconductor element, not to mention a field-effect transistor, a memory element which uses a semiconductor layer can be applied to the semiconductor device according to an embodiment of the present invention; accordingly, a semiconductor device which can meet functions required for various applications can be manufactured and provided.

Embodiment 4

In this embodiment, as for a semiconductor device for achieving higher reliability and a method for manufacturing a semiconductor device, an example of a semiconductor device having a memory will be described with reference to FIGS. 6A to 6E, FIGS. 7A to 7C, and FIGS. 8A and 8B.

A semiconductor device of this embodiment includes a memory including a memory cell array and a driver circuit portion which drives the memory cell array.

A separation layer 301 is formed over a substrate 300 with an insulating surface which is a manufacturing substrate, and an insulating film 302 which functions as a base film is formed over the separation layer 301.

Next, a semiconductor film is formed over the insulating film 302. The semiconductor film may be formed to a thickness of 25 nm to 200 nm (preferably 30 nm to 150 nm) by a means (e.g., a sputtering method, an LPCVD method, or a plasma CVD method).

In this embodiment, an amorphous semiconductor film is formed over the insulating film 302 and the amorphous semiconductor film is crystallized by laser light; accordingly, a semiconductor film which is a crystalline semiconductor film is formed.

The semiconductor film obtained in the above manner is selectively doped with a slight amount of impurity element (boron or phosphorus) for controlling threshold voltage of a thin film transistor. This doping with the impurity element may be performed on the amorphous semiconductor film before the crystallization step. When the amorphous semiconductor film is doped with the impurity element, the impurity can be activated by heat treatment for crystallization which is to be performed later. Further, defects and the like generated during the doping can be reduced as well.

Next, the semiconductor film is processed into a desired shape using a mask. In this embodiment, after an oxide film formed over the semiconductor film is removed, another oxide film is formed. Then, photomasks are formed, and semiconductor layers 303, 304, 305, and 306 are formed by processing treatment using photolithography. The semiconductor layers may be processed so as to have inclination angles (taper angles) at their end portions.

Although either plasma etching (dry etching) or wet etching may be employed for etching treatment, plasma etching is more suitable for processing a large-sized substrate. As an etching gas, a gas containing fluorine such as $CF_4$ or $NF_3$, or a gas containing chlorine such as $Cl_2$ or $BCl_3$ may be used, and an inert gas such as He and Ar may further be added thereto as appropriate. Further, if etching treatment by atmospheric pressure discharge is employed, local electric discharge processing can also be realized, and in that case, a mask does not need to be formed on an entire surface of the substrate.

An insulating film 310 is formed over the semiconductor layer 305. The insulating film 310 may be formed using silicon oxide or a stacked structure of silicon oxide and silicon nitride. The insulating film 310 may be formed by deposition of an insulating layer by a plasma CVD method or a low-pressure CVD method, or preferably, the insulating film 310 may be formed by solid phase oxidation or solid phase nitridation by plasma treatment. This is because an insulating layer which is formed through oxidation or nitridation of the semiconductor layer (typically, a silicon layer) by plasma treatment has a dense film quality, high withstand voltage, and high reliability. Since the insulating film 310 is used as a tunnel insulating layer for injecting charges into a charge accumulation layer 311, it is preferable that the insulating film be dense and have high dielectric strength voltage and high reliability. The insulating film 310 is preferably formed to a thickness of 1 nm to 20 nm, preferably 3 nm to 6 nm.

The insulating film 310 is preferably formed by plasma treatment in such a manner that, for example, a silicon oxide layer is formed to a thickness of 3 nm to 6 nm over the semiconductor layer by plasma treatment under an oxygen atmosphere, and a nitrogen plasma treated layer is formed in such a manner that the surface of the silicon oxide layer is treated with nitrogen plasma under a nitrogen atmosphere. Specifically, first, a silicon oxide layer with a thickness of 3 nm to 6 nm is formed over the semiconductor layer by plasma treatment under an oxygen atmosphere. Subsequently, a nitrogen plasma treated layer with a high concentration of nitrogen is formed over the surface or near the surface of the silicon oxide layer by performance of plasma treatment under a nitrogen atmosphere successively. Note that "near the surface" refers to a depth of approximately 0.5 nm to 1.5 nm from the surface of the silicon oxide layer. For example, when plasma treatment is performed in a nitrogen atmosphere, a structure is obtained in which the silicon oxide layer contains 20 atomic % to 50 atomic % nitrogen at a depth of about 1 nm from its surface, in the case where measurement using Rutherford backscattering spectrometry (RBS) or hydrogen forward scattering (HFS) is performed.

A surface of a silicon layer as a typical example of the semiconductor layer is oxidized by plasma treatment, whereby a dense oxide layer which has no distortion in an interface can be formed. Further, by nitridation of the oxide layer with plasma treatment, by which oxygen is substituted for nitrogen in the outermost surface of the oxide layer to form a nitride layer, further densification can be performed. Accordingly, an insulating layer with high withstand voltage can be formed.

In any case, by the solid phase oxidation or solid phase nitridation with the above plasma treatment, even if a glass substrate with an upper temperature limit of less than or equal to 700° C. is used, an insulating layer which is equivalent to a thermal oxide film which is formed at a temperature of 950° C. to 1050° C. can be obtained. Thus, a highly reliable tunnel insulating layer can be formed as the tunnel insulating layer of a nonvolatile memory element.

The charge accumulation layer 311 is formed over the insulating film 310. The charge accumulation layer 311 may have a single layer or a stacked layer of plural layers.

The charge accumulation layer 311 can be a floating gate formed of a layer or particles of a semiconductor material or a conductive material. As the semiconductor material, silicon, silicon germanium, or the like can be given. In the case of using silicon, amorphous silicon or polysilicon can be used. Further, polysilicon doped with phosphorus can also be used. As the conductive material, an element selected from tantalum (Ta), titanium (Ti), molybdenum (Mo), and tungsten (W); an alloy containing the above element as its main component; an alloy film in which the above elements are combined (typically, an Mo—W alloy film or an Mo—Ta alloy film); or a silicon film provided with conductivity can be used. Under the conductive layer formed of such a material, nitride such as tantalum nitride, tungsten nitride, titanium nitride, or molybdenum nitride; or silicide such as tungsten silicide, titanium silicide, or molybdenum silicide may be formed. Furthermore, a stacked structure of the above semiconductor materials, conductive materials, or the semiconductor material and the conductive material may be employed. For example, a stacked structure of a silicon layer and a germanium layer may be used.

Alternatively, the charge accumulation layer 311 may be formed as an insulating layer having a trap which holds charges. As typical examples of materials of such a layer, there are a silicon compound and a germanium compound. As the silicon compound, silicon nitride, silicon oxynitride, silicon oxynitride to which hydrogen is added, or the like can be given. As examples of the germanium compound, germanium nitride, germanium nitride to which oxygen is added, germanium oxide to which nitrogen is added, germanium nitride to which oxygen and hydrogen are added, germanium oxide to which nitrogen and hydrogen are added, and the like can be given.

Next, masks for covering the semiconductor layers 303, 304, and 306 are formed. An impurity element imparting n-type conductivity is added to the semiconductor layer 305, using the mask and the charge accumulation layer 311 as a mask, to form an n-type impurity region 362a and an n-type impurity region 362b. In this embodiment, phosphorus (P) which imparts n-type conductivity is used as the impurity element. Here, the impurity element imparting n-type conductivity is added so that the impurity element is contained in the n-type impurity region 362a and the n-type impurity region 362b at a concentration of approximately $1 \times 10^{17}/cm^3$ to $5 \times 10^{18}/cm^3$. The masks covering the semiconductor layers 303, 304, and 306 are removed.

The oxide film over the semiconductor layer 306 is removed, and a gate insulating layer 309 for covering the semiconductor layer 305, the semiconductor layer 306, the insulating film 310, and the charge accumulation layer 311 is formed. When the gate insulating layer 309 is thick in the memory cell array, a thin film transistor and a memory element can have high resistance to high voltage; accordingly reliability can be improved.

Note that, although the gate insulating layer 309 formed above the semiconductor layer 305 functions as a control insulating layer in a memory element which is to be completed later, the gate insulating layer 309 functions as a gate insulating layer in a thin film transistor formed using the semiconductor layer 306; therefore, the gate insulating layer 309 is referred to as the "gate insulating layer" 309 in this specification.

The oxide films over the semiconductor layers 303 and 304 are removed, and a gate insulating layer 308 for covering the semiconductor layers 303 and 304 is formed (see FIG. 6A). The gate insulating layer 308 can be formed by a plasma CVD method, a sputtering method, or the like. The thickness of the gate insulating layer 308 of a thin film transistor provided in the driver circuit portion may be greater than or equal to 1 nm and less than or equal to 10 nm, preferably about 5 nm. When the thickness of the gate insulating layer 308 is reduced, an effect of driving the transistor in the driver circuit portion at low voltage at high speed is obtained.

The gate insulating layer 308 may be formed of silicon oxide or a stacked layer of silicon oxide and silicon nitride. The gate insulating layer 308 may be formed by deposition of an insulating film by a plasma CVD method or a low pressure CVD method or may be formed by solid phase oxidation or solid phase nitridation by plasma treatment. This is because a gate insulating layer formed by oxidation or nitridation of a semiconductor layer by plasma treatment is dense, has high withstand voltage, and is excellent in reliability.

Alternatively, a high dielectric constant material may be used for the gate insulating layer 308. If a high dielectric constant material is used for the gate insulating layer 308, gate leakage current can be reduced. As the high dielectric constant material, zirconium dioxide, hafnium oxide, titanium dioxide, tantalum pentoxide, or the like can be used. Further, a silicon oxide layer may be formed by solid-phase oxidation by plasma treatment.

Further, a thin silicon oxide film can also be formed by oxidation of the surface of the semiconductor region by a GRTA method, an LRTA method, or the like, so that a thermal oxide film is formed. Note that in order to form a dense insulating film with little gate leakage current at a low film formation temperature, it is preferable to mix a rare gas element such as argon into a reactive gas so that the rare gas element can be mixed into the insulating film to be formed.

Next, a first conductive film with a thickness of 20 nm to 100 nm and a second conductive film with a thickness of 100 nm to 400 nm, each of which serves as a gate electrode layer, are stacked over the gate insulating layers 308 and 309. The first conductive film and the second conductive film can be formed by a sputtering method, an evaporation method, a CVD method, or the like. The first conductive film and the second conductive film may be formed using an element selected from tantalum (Ta), tungsten (W), titanium (Ti), molybdenum (Mo), aluminum (Al), copper (Cu), chromium (Cr), and neodymium (Nd), or an alloy or compound material containing the above element as its main component. Alternatively, the first conductive film and the second conductive film may be formed of a semiconductor film typified by a polycrystalline silicon film doped with an impurity element such as phosphorus, or an AgPdCu alloy film. Without limitation to the two-layer structure, for example, a three-layer structure may alternatively be employed in which a tungsten film with a thickness of 50 nm as the first conductive film, an alloy film of aluminum and silicon (an Al—Si film) with a thickness of 500 nm as the second conductive film, and a titanium nitride film with a thickness of 30 nm as a third conductive film are stacked. In the case of the three-layer structure, a tungsten nitride film may be used instead of the tungsten film as the first conductive film, an aluminum-titanium alloy (Al—Ti) film may be used instead of the aluminum-silicon alloy (Al—Si) film as the second conductive film, and a titanium film may be used instead of the titanium nitride film as the third conductive film. Further alternatively, a single-layer structure may be employed. In this embodiment, tantalum nitride is formed to a thickness of 30 nm as the first conductive film and tungsten (W) is formed to a thickness of 370 nm as the second conductive film.

The first conductive film and the second conductive film are processed by etching to form first gate electrode layers 312, 313, and 314; second gate electrode layers 316, 317, and 318; a first control gate electrode layer 315; and a second control gate electrode layer 319 (see FIG. 6B).

In this embodiment, although an example is described in which the first gate electrode layer and the second gate electrode layer (the first control gate electrode layer and the second control gate electrode layer) are formed to have vertical side surfaces, the embodiment of the present invention is not limited thereto: both the first gate electrode layer and the second gate electrode layer (the first control gate electrode layer and the second control gate electrode layer) may have a tapered shape; or only one of the first gate electrode layer and the second gate electrode layer (the first control gate electrode layer and the second control gate electrode layer) may have a tapered shape and the other may have a vertical side surface by anisotropic etching. The taper angles may be different or the same between the stacked gate electrode layers. The first gate electrode layer and the second gate electrode layer have the tapered shape, whereby coverage with a film which is stacked thereover is improved and defects are reduced; accordingly, reliability is improved.

In some cases, the gate insulating layers 308 and 309 may be etched to some extent and thinned (so-called film reduction) due to the etching step for forming the gate electrode layers (and the control gate electrode layers).

Next, a mask 321 for covering the semiconductor layer 304 and a mask 363 for covering the semiconductor layers 305 and 306 are formed. An impurity element 320 imparting p-type conductivity is added using the masks 321 and 363 and the first gate electrode layer 312 and the second gate electrode layer 316 as masks to form a p-type impurity region 322a and a p-type impurity region 322b. In this embodiment, boron (B) is used as the impurity element. Here, the impurity element 320 is added so as to be contained in the p-type impurity region 322a and the p-type impurity region 322b at a concentration of approximately $1 \times 10^{20}/cm^3$ to $5 \times 10^{21}/cm^3$. In addition, a channel formation region 323 is formed in the semiconductor layer 303 (see FIG. 6C).

The p-type impurity region 322a and the p-type impurity region 322b are high-concentration p-type impurity regions and function as source and drain regions.

Next, the masks 321 and 363 are removed by $O_2$ ashing or with separation liquid. Then, a mask 325 for covering the semiconductor layer 303 is formed. An impurity element 324 imparting n-type conductivity is added using the mask 325, and the first gate electrode layer 313, the second gate electrode layer 317, the first gate electrode layer 314, the second gate electrode layer 318, the first control gate electrode layer 315, and the second control gate electrode layer 319 as masks to form n-type impurity regions 326a, 326b, 364a, 364b, 327a, 327b, 328a, and 328b. In this embodiment, phosphorus (P) is used as the impurity element. Here, the impurity element imparting n-type conductivity is added so as to be contained in the n-type impurity regions 326a, 326b, 327a, 327b, 328a, and 328b at a concentration of approximately $5 \times 10^{19}/cm^3$ to $5 \times 10^{20}/cm^3$. In addition, a channel formation region 329 is formed in the semiconductor layer 304; a channel formation region 330 is formed in the semiconductor layer 305; and a channel formation region 331 is formed in the semiconductor layer 306 (see FIG. 6D).

The n-type impurity regions 326a, 326b, 327a, 327b, 328a, and 328b are high-concentration n-type impurity regions and function as source and drain regions. On the other hand, the n-type impurity regions 364a and 364b are low-concentration impurity regions and function as LDD regions.

The mask 325 is removed by $O_2$ ashing or with separation liquid, and the oxide film is also removed. After that, an insulating film, a so-called sidewall, may be formed so as to cover side surfaces of the gate electrode layers. The sidewall may be formed of an insulating film containing silicon by a plasma CVD method and a low pressure CVD (LPCVD) method.

In order to activate the impurity element, thermal treatment, strong light irradiation, or laser light irradiation may be performed. At the same time as the activation, plasma damage to the gate insulating layer and to an interface between the gate insulating layer and the semiconductor layer can be repaired.

Next, an interlayer insulating layer for covering the gate electrode layers and the gate insulating layers is formed. In this embodiment, a stacked structure of an insulating film 367 and an insulating film 368 is employed for the interlayer insulating layer. The insulating films 367 and 368 may be a silicon nitride film, a silicon nitride oxide film, a silicon oxynitride film, or a silicon oxynitride film formed by a sputtering method or a plasma CVD method. Alternatively, a single layer structure or a stacked-layer structure of three or more layers using another insulating film containing silicon may be employed.

Further, heat treatment is performed in a nitrogen atmosphere at 300° C. to 550° C. for 1 hour to 12 hours to hydrogenate the semiconductor layer. This step is preferably performed at 400° C. to 500° C. This step is a step for terminating a dangling bond of the semiconductor layers with hydrogen contained in the insulating film 367 which is the interlayer insulating layer. In this embodiment, the heat treatment is performed at 410° C. for 1 hour.

The insulating film 367 and the insulating film 368 can be formed using a material selected from aluminum nitride (AlN), aluminum oxynitride (AlON) containing more oxygen than nitrogen, aluminum nitride oxide (AlNO) containing more nitrogen than oxygen, aluminum oxide, diamond-like carbon (DLC), and nitrogen-containing carbon (CN) film, and other substances containing an inorganic insulating material. Alternatively, a siloxane resin may be used. Note that the siloxane resin corresponds to a resin including Si—O—Si bonding.

Next, contact holes (openings) reaching the semiconductor layers are formed in the insulating films 367 and 368 and the gate insulating layers 308 and 309. Etching may be performed once or plural times depending on the selectivity of the materials which are used. The insulating films 368 and 367 and the gate insulating layers 308 and 309 are removed by etching to form openings reaching the p-type impurity regions 322a and 322b and the n-type impurity regions 326a, 326b, 327a, 327b, 328a, and 328b which are source and drain regions. The etching may be performed by either wet etching or dry etching, or both wet etching and dry etching. A hydrofluoric acid-based solution such as a mixed solution of ammonium hydrogen fluoride and ammonium fluoride may be used as an etchant of wet etching. Note that as an etching gas, a chlorine-based gas typified by $Cl_2$, $BCl_3$, $SiCl_4$, $CCl_4$ or the like, a fluorine-based gas typified by $CF_4$, $SF_6$, $NF_3$ or the like, or $O_2$ can be appropriately used. Further, an inert gas may be added to an etching gas. As an inert element to be added, one or a plurality of elements selected from He, Ne, Ar, Kr, and Xe can be used.

A conductive film is formed so as to cover the openings, and the conductive film is etched to form wiring layers 369a, 369b, 370a, 370b, 371a, 371b, 372a, and 372b, which are source electrode layers and drain electrode layers electrically connected to parts of respective source regions and drain regions. The wiring layers can be formed in such a manner that the conductive film is formed by a PVD method, a CVD method, an evaporation method, or the like, and then, the conductive film is etched into a desired shape. In addition, the conductive layer can be selectively formed in a predetermined position by a droplet discharge method, a printing method, an electrolytic plating method, or the like. Alternatively, a reflow method and a damascene method may be used as well. As a material for the source electrode layer or the drain electrode layer, a metal such as Ag, Au, Cu, Ni, Pt, Pd, Ir, Rh, W, Al, Ta, Mo, Cd, Zn, Fe, Ti, Zr, or Ba, or Si or Ge, an alloy or nitride thereof can be used. Alternatively, a stacked-layer structure of these may be used. In this embodiment, titanium (Ti) is formed to a thickness of 60 nm, a titanium nitride film is formed to a thickness of 40 nm, aluminum is formed to a thickness of 700 nm, and titanium (Ti) is formed to a thickness of 200 nm, and then the stacked film is processed into a desired shape.

Through the above steps, a semiconductor integrated circuit 350 including: a thin film transistor 373 which is a p-channel thin film transistor including the p-type impurity region; a thin film transistor 374 which is an n-channel thin film transistor including the n-type impurity region; a memory element 375 including the n-type impurity region as the memory cell array; and a thin film transistor 376 which is an n-channel thin film transistor including the n-type impurity region can be manufactured as the driver circuit portion (see FIG. 6E).

Figure 7A:
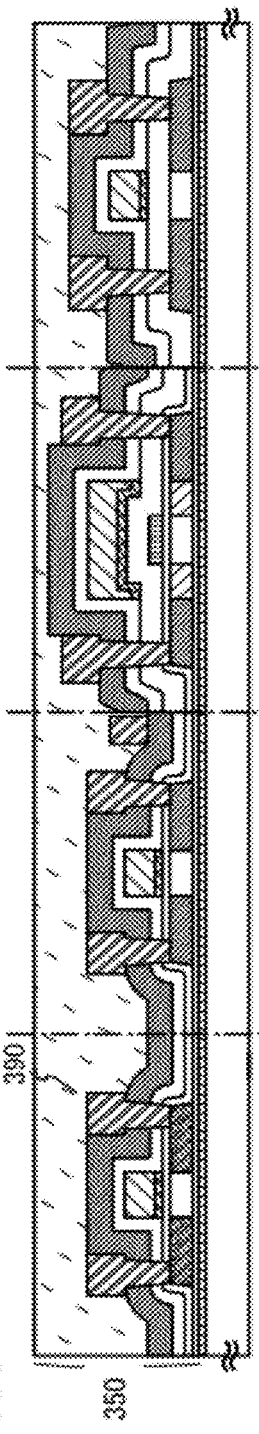
FIGS. 7A to 7C are views illustrating a method for manufacturing a semiconductor device according to an embodiment of the present invention.
Figure 7B:
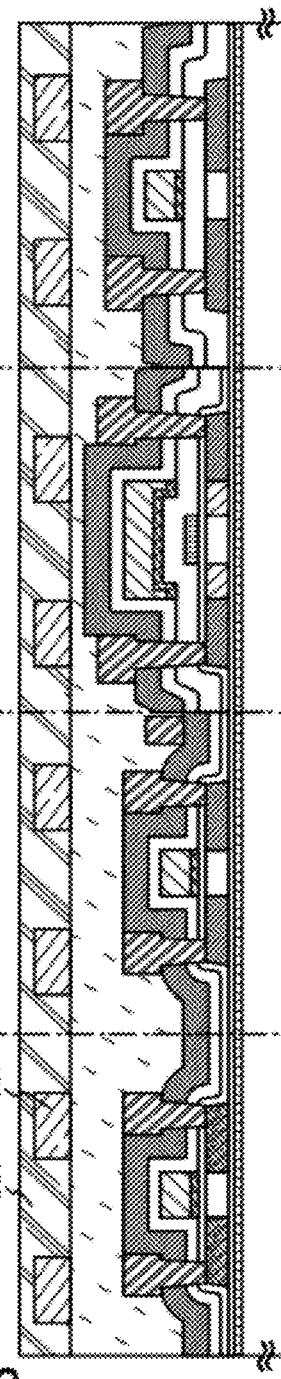
Figure 7C:
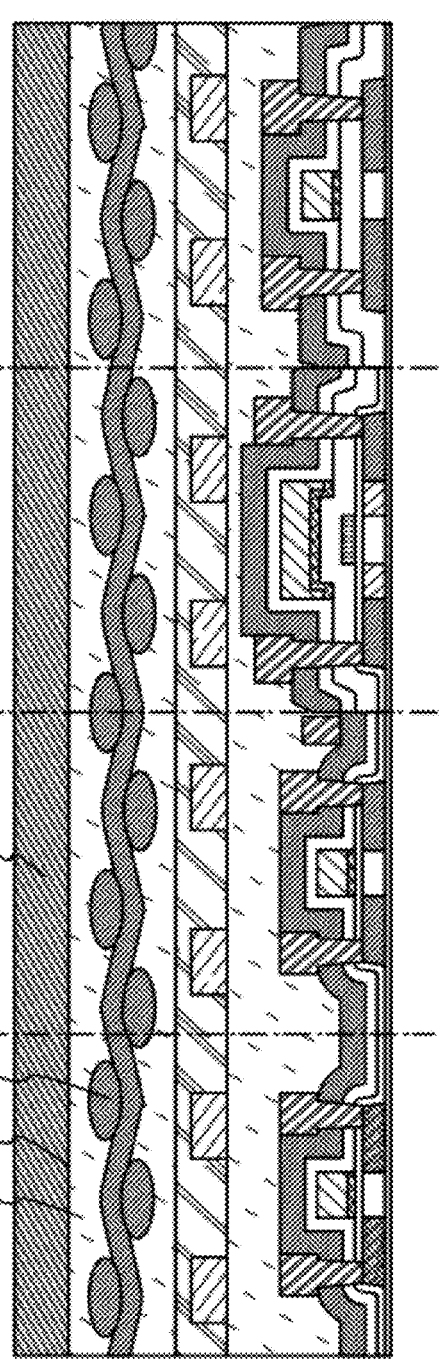

In this embodiment, an insulating layer 390 is formed over the semiconductor integrated circuit 350 (see FIG. 7A). Next, a conductive layer 380 which functions as an antenna is formed over the insulating layer 390, and an inorganic insulating layer 381 is formed as a protective layer over the conductive layer 380 (see FIG. 7B).

As a first insulator 382, a structure body in which a fibrous body 383 is impregnated with an organic resin 384 is used. The structure body is subjected to heat and pressure bonding treatment, whereby the semiconductor integrated circuit 350, the first insulator 382, and a fourth insulator 391 are bonded, and the semiconductor integrated circuit 350 is separated from the substrate 300, using the separation layer 301. Accordingly, the semiconductor integrated circuit 350 is provided on the first insulator 382 side (see FIG. 7C).

As in the case of the first insulator 382, a structure body in which a fibrous body 386 is impregnated with an organic resin 387 is used as a second insulator 385. The structure body is subjected to heat and pressure bonding treatment, whereby the second insulator 385 is bonded to a third insulator 388. An adhesive layer 389 is provided on a surface of the third insulator 388, which is on the side opposite to the side where the second insulator 385 is provided.

Figure 8A:
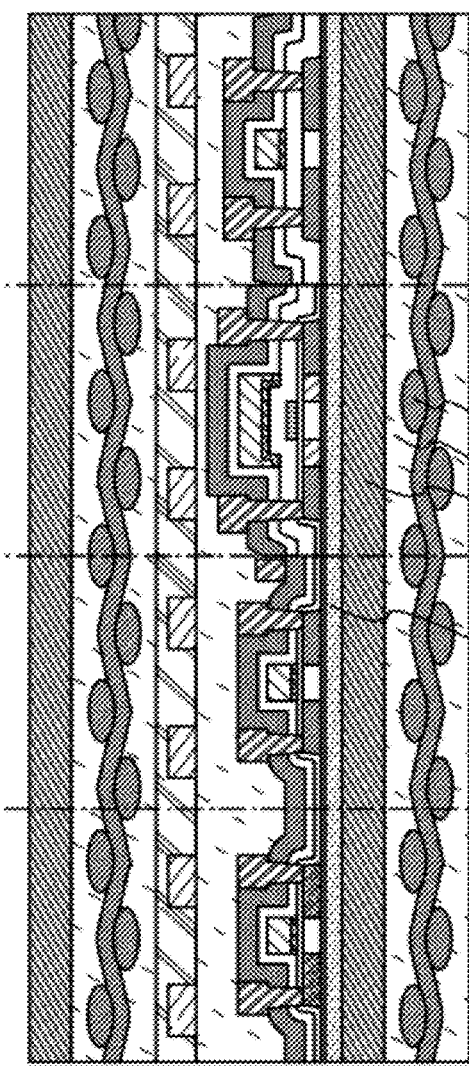
FIGS. 8A and 8B are views illustrating a method for manufacturing a semiconductor device according to an embodiment of the present invention.
Figure 8B:
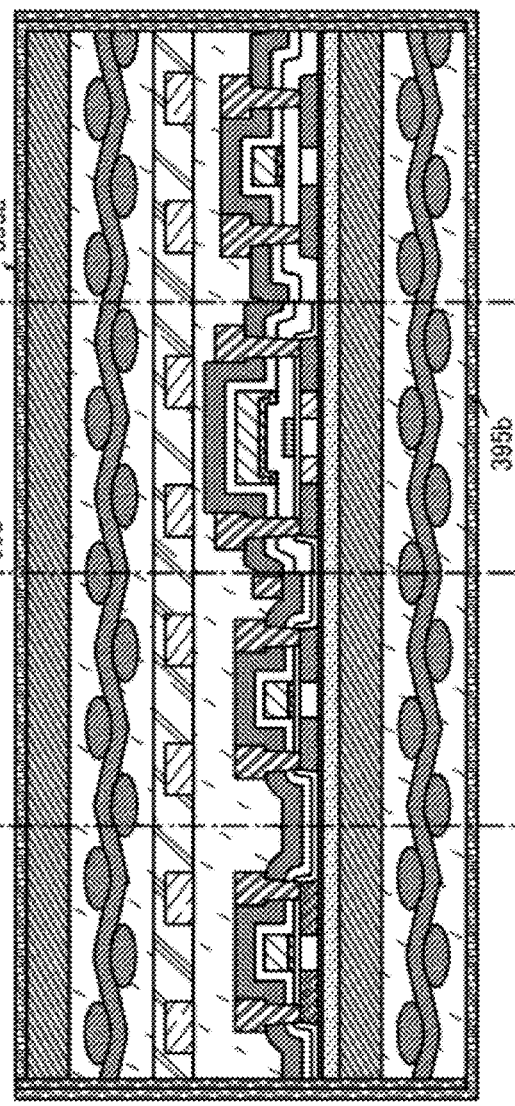

The adhesive layer 389 is bonded to an exposed separation surface of the semiconductor integrated circuit 350, whereby the semiconductor integrated circuit 350 is sandwiched between the fourth insulator 391 and the first insulator 382 and the third insulator 388 and the second insulator 385 (see FIG. 8A).

Although not illustrated, a plurality of semiconductor integrated circuits are sandwiched between the first insulator 382 and the second insulator 385, and the plurality of semiconductor integrated circuits 350 are cut off into individual semiconductor integrated circuits; accordingly, a semiconductor integrated circuit chips are manufactured. Although there is no particular limitation on a cut-off method as long as the semiconductor integrated circuits 350 can be physically cut off, laser light irradiation is used for cutting off the semiconductor integrated circuits 350 in this embodiment. The semiconductor integrated circuits 350 are cut off, whereby the conductive layer 380 which is the antenna and each semiconductor integrated circuit 350 are sealed by the first insulator 382 and the second insulator 385. Therefore, the first insulator 382 and the second insulator 385 are aligned with cut surfaces (side surfaces generated due to the cutting).

Next, conductive shields 395a and 395b are formed so as to cover (surround) the first insulator 382 and the second insulator 385. First, the conductive shield 395a is formed on a surface and cut surfaces of the first insulator 382, and then the conductive shield 395b is formed on a surface and cut surfaces of the second insulator 385 (see FIG. 8B). In this embodiment, as the conductive shields 395a and 395b, a titanium film is formed by a sputtering method to a thickness of 10 nm (preferably greater than or equal to 5 nm and less than or equal to 100 nm).

Through the formation in the above manner, a structure is obtained in which the conductive layer 380 which is an antenna and the semiconductor integrated circuit 350 are sealed by the first insulator 382 and the second insulator 385 and are also protected against electrostatic discharge by the conductive shields 395a and 395b which are provided outside the first insulator 382 and the second insulator 385, which correspond to top surface and bottom surface of the semiconductor device, and on the cut surfaces of the first insulator 382 and the second insulator 385.

The semiconductor device manufactured in this embodiment can be a semiconductor device with flexibility if a flexible insulator is used.

Therefore, the conductive shields 395a and 395b transmit electromagnetic waves to be transmitted and received by the conductive layer 380 which is an antenna included in the semiconductor device and block application of external static electricity to the semiconductor integrated circuit 350 in the semiconductor device. Since the conductive shields 395a and 395b diffuse and release static electricity applied by electrostatic discharge or prevent electric charge from locally existing (localization of electric charge) (prevents local electric potential difference from occurring), the semiconductor integrated circuit 350 can be prevented from being damaged by static electricity.

Further, since the insulators are provided so as to sandwich the semiconductor integrated circuit, adverse effects on the semiconductor integrated circuit due to external stress or electrostatic discharge, such as damage or deterioration in characteristics can be prevented also in a manufacturing process. Thus, the semiconductor device can be manufactured with high yield.

The conductive shields covering the semiconductor integrated circuit prevent electrostatic breakdown of the semiconductor integrated circuit (e.g., malfunction of a circuit and damage to a semiconductor element) due to electrostatic discharge. In addition, with use of the pair of insulators between which the semiconductor integrated circuit is sandwiched, a highly reliable semiconductor device which has resistance while achieving reduction in the thickness and size, can be provided. Moreover, the semiconductor device can be manufactured with high yield by prevention of external stress, or defective shapes or deterioration in characteristics resulted from electrostatic discharge also in a manufacturing process.

Embodiment 5

In this embodiment, examples of semiconductor devices for achieving higher reliability will be described. Specifically, as examples of the semiconductor devices, examples of a microprocessor and a semiconductor device which has an arithmetic function and can transmit and receive data without contact will be described.

Figure 12:
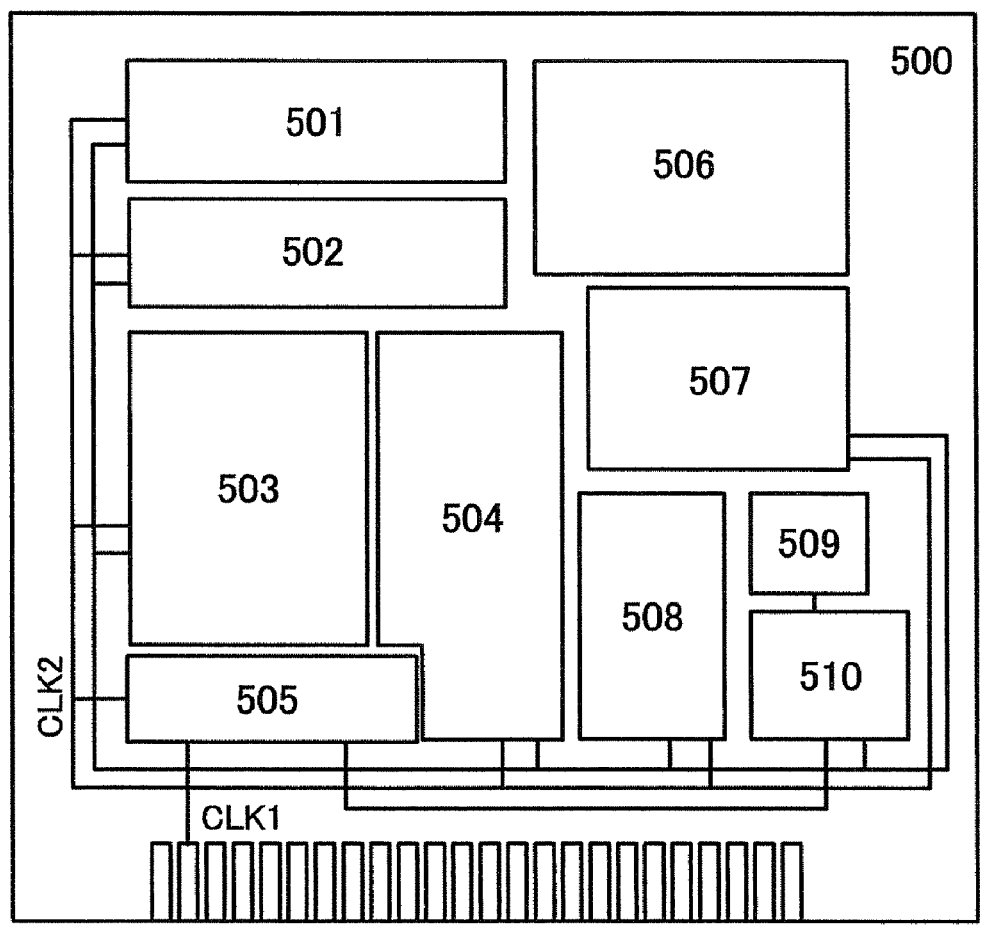
FIG. 12 is a block diagram showing a structure of a microprocessor obtained using a semiconductor device according to an embodiment of the present invention.

FIG. 12 illustrates an example of a microprocessor 500 as an example of the semiconductor device. This microprocessor 500 is formed using a semiconductor device formed according to the above embodiments. This microprocessor 500 has an arithmetic logic unit (ALU) 501, an ALU controller 502, an instruction decoder 503, an interrupt controller 504, a timing controller 505, a register 506, a register controller 507, a bus interface (Bus I/F) 508, a read only memory (ROM) 509, and a memory interface (ROM I/F) 510.

An instruction input to the microprocessor 500 through the bus interface 508 is inputted to the instruction decoder 503 and decoded. Then, the instruction is inputted to the ALU controller 502, the interrupt controller 504, the register controller 507, and the timing controller 505. The ALU controller 502, the interrupt controller 504, the register controller 507, and the timing controller 505 perform various controls based on the decoded instruction. Specifically, the ALU controller 502 produces a signal for controlling the operation of the arithmetic logic unit 501. The interrupt controller 504 judges an interrupt request from an external input/output device or a peripheral circuit based on its priority or a mask state, and processes the request while a program is executed in the microprocessor 500. The register controller 507 generates an address of the register 506, and reads/writes data from/to the register 506 in accordance with the state of the microprocessor 500. The timing controller 505 produces signals for controlling timing of driving of the arithmetic logic unit 501, the ALU controller 502, the instruction decoder 503, the interrupt controller 504, and the register controller 507. For example, the timing controller 505 is provided with an internal clock generator for generating an internal clock signal CLK2 based on a reference clock signal CLK1, and supplies the clock signal CLK2 to each of the above-mentioned circuits. Note that the microprocessor 500 illustrated in FIG. 12 is just an example of the simplified structure, and practical microprocessors have a variety of structures depending on usage.

Figure 13:
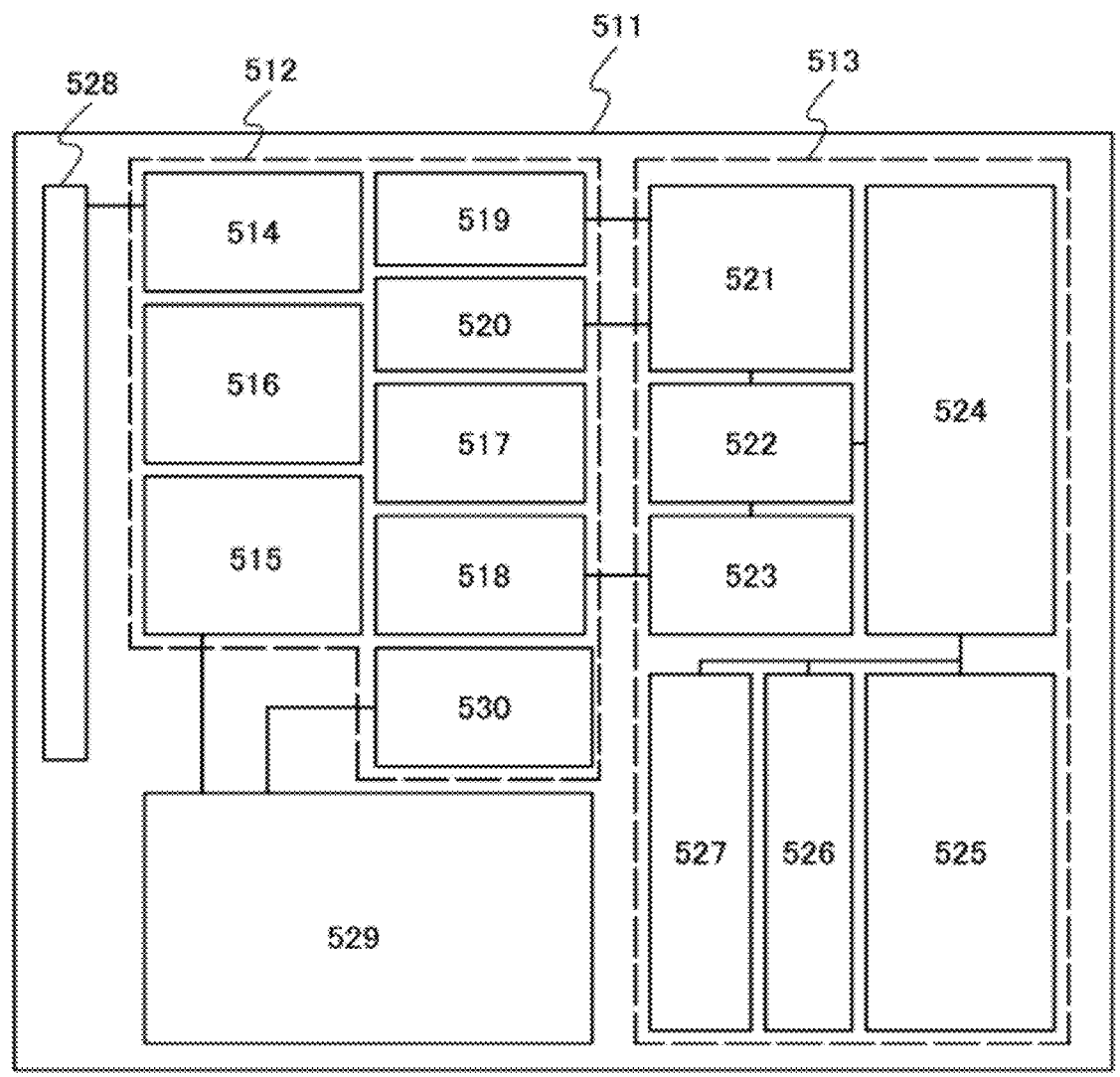
FIG. 13 is a block diagram showing a structure of an RFCPU obtained using a semiconductor device according to an embodiment of the present invention.

Next, an example of the semiconductor device which has an arithmetic function and can transmit and receive data without contact will be described with reference to FIG. 13. FIG. 13 illustrates an example of a computer (hereinafter also referred to as an RFCPU) which transmits/receives signals to/from an external device by wireless communication. An RFCPU 511 has an analog circuit portion 512 and a digital circuit portion 513. The analog circuit portion 512 includes a resonance circuit 514 having a resonant capacitor, a rectifier circuit 515, a constant voltage circuit 516, a reset circuit 517, an oscillator circuit 518, a demodulation circuit 519, and a modulation circuit 520. The digital circuit portion 513 includes an RF interface 521, a control register 522, a clock controller 523, an interface 524, a central processing unit 525, a random access memory 526, and a read only memory 527.

The operation of the RFCPU 511 having such a structure is roughly described below. The resonance circuit 514 generates induced electromotive force based on a signal received at an antenna 528. The induced electromotive force is stored in a capacitor portion 529 via the rectifier circuit 515. The capacitor portion 529 is preferably formed using a capacitor such as a ceramic capacitor or an electric double layer capacitor. The capacitor portion 529 is not necessarily formed over the same substrate as the RFCPU 511 and may be attached as another component to a substrate having an insulating surface that partially constitutes the RFCPU 511.

The reset circuit 517 produces a signal that resets the digital circuit portion 513 to be initialized. For example, a signal which rises with a delay to a rise of the power supply voltage is produced as a reset signal. The oscillator circuit 518 changes the frequency and the duty ratio of a clock signal in accordance with a control signal produced by the constant voltage circuit 516. The demodulation circuit 519 having a low pass filter, for example, binarizes changes in amplitude of reception signals of an amplitude shift keying (ASK) system. The modulation circuit 520 changes the amplitude of transmission signals of an amplitude shift keying (ASK) system to be transmitted. The modulation circuit 520 changes the resonance point of the resonance circuit 514, thereby changing the amplitude of communication signals. The clock controller 523 produces a control signal for changing the frequency and the duty ratio of the clock signal in accordance with the power supply voltage or current consumption in the central processing unit 525. The power supply voltage is monitored by the power supply control circuit 530.

A signal which is inputted to the RFCPU 511 from the antenna 528 is demodulated by the demodulation circuit 519, and then cut off into a control command, data, and the like by the RF interface 521. The control command is stored in the control register 522. The control command includes reading of data stored in the read only memory 527, writing of data to the random access memory 526, an arithmetic instruction to the central processing unit 525, and the like. The central processing unit 525 accesses the read only memory 527, the random access memory 526, and the control register 522 via the interface 524. The interface 524 has a function of producing an access signal for any one of the read only memory 527, the random access memory 526, and the control register 522 based on an address requested by the central processing unit 525.

As an arithmetic method of the central processing unit 525, a method may be employed in which the read only memory 527 stores an OS (operating system) and a program is read at the time of starting operation and then executed. Alternatively, a method in which a circuit dedicated to arithmetic is formed and an arithmetic process is conducted using hardware may be employed. In a method in which both hardware and software are used, a method can be employed in which a part of process is conducted in the circuit dedicated to arithmetic and the other part of the arithmetic process is conducted by the central processing unit 525 with use of a program.

In also the microprocessor of this embodiment, a conductive shield covering a semiconductor integrated circuit prevents electrostatic breakdown (such as malfunction of the circuit and damage of the semiconductor element) of the semiconductor integrated circuit due to electrostatic discharge. In addition, with use of a pair of insulators between which the semiconductor integrated circuit is sandwiched, a highly reliable semiconductor device which has resistance can be provided while achieving reduction in the thickness and size. Moreover, the semiconductor device can be manufactured with high yield by prevention of external stress, or defective shapes or deterioration in characteristics resulted from electrostatic discharge also in a manufacturing process.

Embodiment 6

In this embodiment, an example of usage modes of the semiconductor device described in the above embodiments will be described. Specifically, an application example of a semiconductor device to and from which data can be inputted and outputted without contact will be described with reference to drawings. The semiconductor device which is capable of inputting and outputting data without contact is also referred to as an RFID tag, an ID tag, an IC tag, an RF tag, a wireless tag, an electronic tag, or a wireless chip.

An example of a top surface structure of a semiconductor device illustrated in this embodiment is described with reference to FIG. 17A. A semiconductor device illustrated in FIGS. 17A and 17C includes a semiconductor integrated circuit chip 400 provided with an antenna (also referred to as an on-chip antenna) and a support substrate 406 provided with an antenna 405 (also referred to as a booster antenna). The semiconductor integrated circuit chip 400 is provided over an insulating layer 410 which is formed over the support substrate 406 and the antenna 405.

As for a semiconductor integrated circuit provided in the semiconductor integrated circuit chip 400, elements such as a plurality of transistors for constituting a memory portion or a logic portion, and the like are provided. In the semiconductor device of this embodiment, not to mention a field-effect transistor, a memory element which uses a semiconductor layer or the like can be employed as a semiconductor element; accordingly, a semiconductor device which can satisfy functions required for various applications can be manufactured and provided.

Figure 17A:
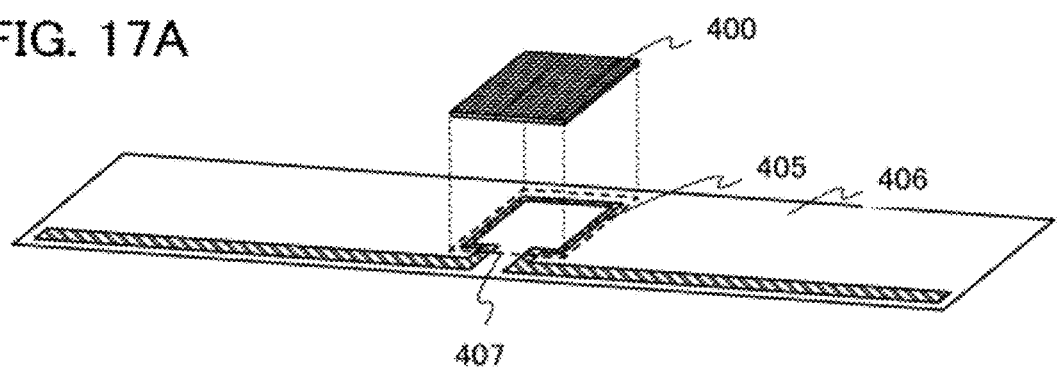
FIGS. 17A to 17C are views illustrating a semiconductor device according to an embodiment of the present invention.
Figure 20A:
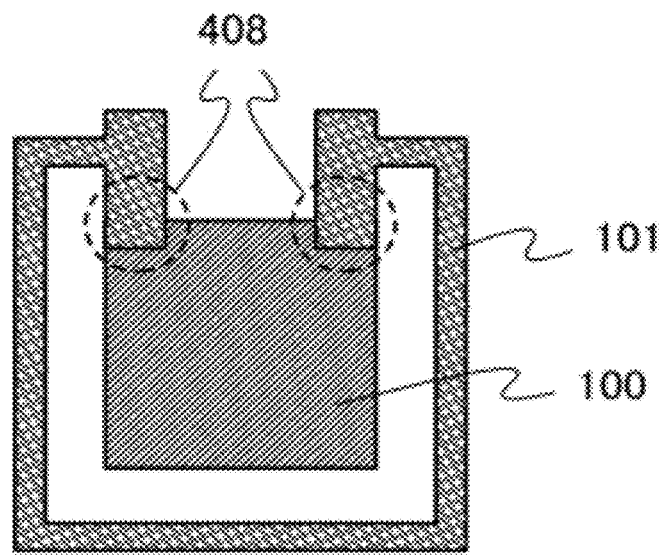
FIGS. 20A and 20B are views each illustrating a semiconductor device according to an embodiment of the present invention.

FIG. 20A is an enlarged view of the antenna and the semiconductor integrated circuit included in the semiconductor integrated circuit chip 400 illustrated in FIG. 17A. In FIG. 20A, the antenna 101 is a rectangular loop antenna whose number of windings is one, but this embodiment is not limited to this structure. The shape of the loop antenna is not limited to a rectangle, and a shape with a curve, for example, a circular shape, may be formed. In addition, the number of windings is not limited to one. The plurality of windings may be employed; however, in the case where the number of windings of the antenna 101 is one, parasitic capacitance generated between the semiconductor integrated circuit 100 and the antenna 101 can be reduced.

Figure 20B:
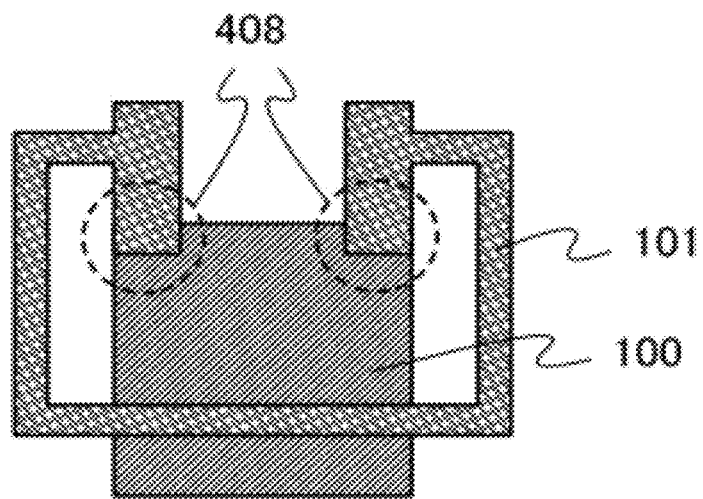

In FIG. 17A and FIG. 20A, the antenna 101 is arranged so as to surround the periphery of the semiconductor integrated circuit 100, and the antenna 101 is arranged in a region different from a region of the semiconductor integrated circuit 100, except portions corresponding to feeding points 408 indicated by a dashed line. However, this embodiment is not limited to this structure. As illustrated in FIG. 20B, the antenna 101 may be arranged so as to partly overlap with the semiconductor integrated circuit 100 in addition to the portions corresponding to the feeding points 408 indicated by the dashed line. Note that in the case where the antenna 101 is arranged in a region different from a region of the semiconductor circuit 100 as illustrated in FIG. 17A and FIG. 20A, parasitic capacitance generated between the semiconductor integrated circuit 100 and the antenna 101 can be reduced.

In FIG. 17A, the antenna 405 can transmit and receive signals or supply power to/from the antenna 101 by electromagnetic induction mainly in a loop-like shaped portion surrounded by a dashed line 407. Further, the antenna 405 can transmit and receive signals or supply power to/from an interrogator by a radio wave mainly in a region other than the portion surrounded by the dashed line 407. Note that it is preferable that the frequency of a radio wave used as a carrier (carrier wave) between the interrogator and the semiconductor device be approximately from 30 MHz to 5 GHz. For example, a frequency band of 950 MHz, 2.45 GHz, or the like may be employed.

Although the antenna 405 is a rectangular and loop-like shaped antenna whose number of windings is one in the region surrounded by the dashed line 407, this embodiment is not limited to this structure. The loop-like shaped portion does not necessarily have a rectangular shape, and a shape with a curve, e.g., a circular shape, may be formed. In addition, the number of windings is not limited to one, but the plurality of windings may be employed.

To the semiconductor device according to an embodiment of the present invention, an electromagnetic induction method, an electromagnetic coupling method, or a microwave method can be applied. In the case of the microwave method, the shape of each of the antenna 101 and the antenna 405 may be determined as appropriate depending on the wavelength of an electromagnetic wave to be used.

For example, in the case of employing a microwave method (e.g., a UHF band (860 MHz band to 960 MHz band), a 2.45 GHz band, or the like) as the signal transmission method in the semiconductor device, the length, the shape, and the like of the antenna may be determined as appropriate in consideration of a wavelength of an electromagnetic wave used for signal transmission. For example, the antenna can be formed into a linear shape (e.g., a dipole antenna) or a flat shape (e.g., a patch antenna or an antenna having a ribbon shape). Further, the antenna is not limited to having a linear shape, and the antenna may have a curved shape, a serpentine curved shape, or a shape combining them in consideration of the wavelength of the electromagnetic wave.

Figure 10:
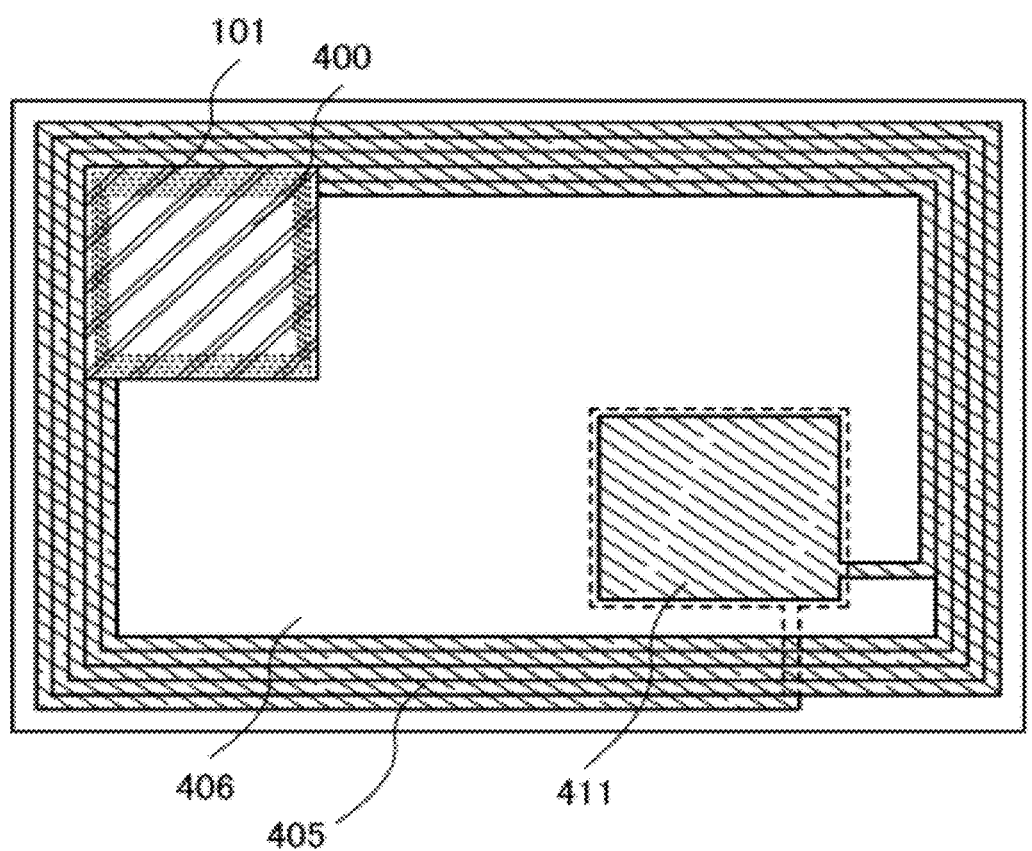
FIG. 10 is a view illustrating a semiconductor device according to an embodiment of the present invention.

FIG. 10 illustrates an example of a semiconductor device provided with the coiled antenna 101 and the coiled antenna 405, to which an electromagnetic induction method or an electromagnetic method is applied.

In FIG. 10, the semiconductor integrated circuit chip 400 provided with the coiled antenna 101 is formed over the support substrate 406 provided with the coiled antenna 405 as a booster antenna. Note that a capacitor 411 is formed by being interposed between the antenna 405 as the booster antenna and the support substrate 406.

Figure 17B:
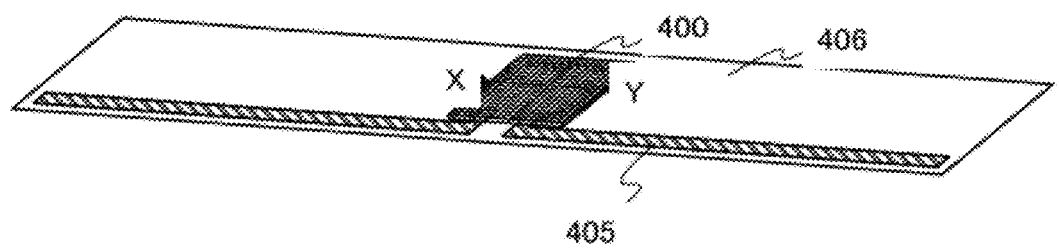

Next, structures of the semiconductor integrated circuit chip 400 and the booster antenna and arrangement thereof are described. FIG. 17B is a perspective view of a semiconductor device in which the semiconductor integrated circuit chip 400 and the antenna 405 provided for the support substrate 406 illustrated in FIG. 17A are stacked. Then, FIG. 17C is a cross-sectional view along a dashed line X-Y of FIG. 17B.

Figure 17C:
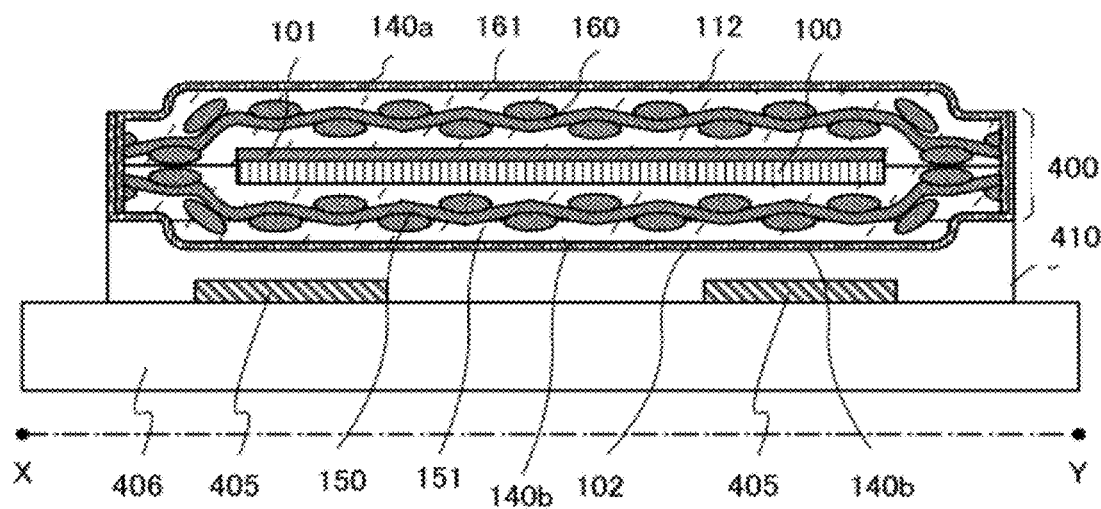

As the semiconductor integrated circuit chip 400 illustrated in FIG. 17C, the semiconductor device described in Embodiments 1 to 5 can be used, and here, a chip form obtained in such a manner that the semiconductor integrated circuits are cut off into individual semiconductor integrated circuits is a semiconductor integrated circuit chip. Note that, although the semiconductor integrated circuit chip illustrated in FIG. 17C is an example of using Embodiment 1, this embodiment is not limited to this structure and can be applied to another embodiment.

The semiconductor integrated circuit 100 illustrated in FIG. 17C is sandwiched between the first insulator 112 and the second insulator 102, and side surfaces of the semiconductor integrated circuits are also sealed by the first insulator 112 and the second insulator 102. In this embodiment, the first insulator 112 and the second insulator 102 are bonded so as to sandwich a plurality of semiconductor integrated circuits, and then the plurality of semiconductor integrated circuits 100 are cut off into individual semiconductor integrated circuits; accordingly, the semiconductor integrated circuit chips 400 are manufactured. Although there is no particular limitation on a cut-off method as long as the semiconductor integrated circuits 100 can be physically cut off, laser light irradiation is used for cutting off the semiconductor integrated circuits in this embodiment.

The semiconductor device according to an embodiment of the present invention includes the conductive shield 140 on an outer side (on the side where the semiconductor integrated circuit is provided, the side opposite to the side where the semiconductor integrated circuit is provided, and side surfaces) of a pair of insulators sandwiching the antenna and the semiconductor integrated circuit which is electrically connected to the antenna. The conductive shield 140 transmits electromagnetic waves to be transmitted and received by the antenna included in the semiconductor device and blocks external static electricity applied from the outside to the semiconductor integrated circuit in the semiconductor device.

In FIG. 17C, the semiconductor integrated circuit 100 is positioned so that the semiconductor integrated circuit 100 is closer to the antenna 405 than the antenna 101; however, the embodiment of the present invention is not limited to this structure. The antenna 101 may be positioned so that the antenna 101 is closer to the antenna 405 than the semiconductor integrated circuit 100. Further, the semiconductor integrated circuit 100 and the antenna 101 may be directly bonded to the first insulator 112 and the second insulator 102, or may be bonded to the first insulator 112 and the second insulator 102 with an adhesive layer functioning as an adhesive agent.

Figure 19:
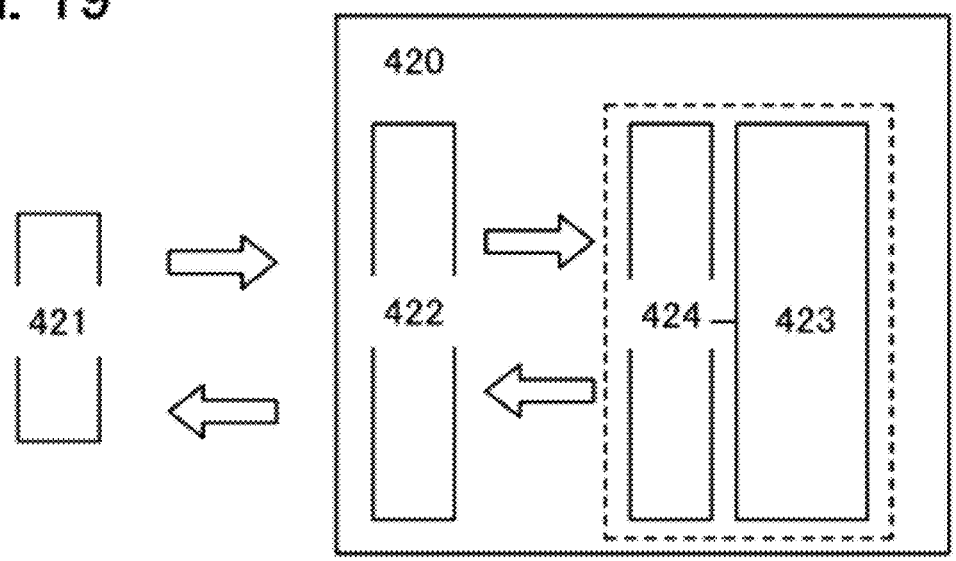
FIG. 19 is a diagram showing a semiconductor device according to an embodiment of the present invention.

Next, operation of the semiconductor device of this embodiment is described. FIG. 19 is an example of a block diagram illustrating a structure of the semiconductor device of this embodiment. A semiconductor device 420 illustrated in FIG. 19 includes an antenna 422 as a booster antenna, a semiconductor integrated circuit 423, and an antenna 424 as an on-chip antenna. When an electromagnetic wave is transmitted from an interrogator 421 and the antenna 422 receives the electromagnetic wave, alternating current is generated in the antenna 422 and a magnetic field is generated in the periphery of the antenna 422. Then, a loop-like shape in the antenna 422 and the antenna 424 in a loop-like shape are coupled electromagnetically, whereby induced electromotive force is generated in the antenna 424. The semiconductor integrated circuit 423 receives a signal or power from the interrogator 421 by using the above induced electromotive force. On the contrary, current is made to flow through the antenna 424 and induced electromotive force is generated in the antenna 422 in accordance with a signal generated in the semiconductor integrated circuit 423, whereby the signal can be transmitted to the interrogator 421 as a reflected wave of a radio wave transmitted from the interrogator 421.

Note that the antenna 422 mainly has a loop-like shaped portion which is coupled electromagnetically with the antenna 424 and a portion which receives a radio wave from the interrogator. The shape of the antenna 422 in the portion which mainly receives a radio wave from the interrogator 421 preferably has a shape which is capable of receiving a radio wave. For example, a dipole antenna, a folded dipole antenna, a slot antenna, a meander line antenna, a microstrip antenna, or the like may be used.

Although the structure of the semiconductor integrated circuit having only one antenna is described in FIGS. 17A to 17C, this embodiment is not limited to this structure. Two antennas, that is, an antenna for receiving power and an antenna for receiving a signal may be provided. In the case of two antennas, a frequency of a radio wave for supplying power and a frequency of a radio wave for transmitting a signal can be separately used.

In the semiconductor device of this embodiment, the on-chip antenna is used, and transmission and reception of signals or power between the booster antenna and the on-chip antenna can be performed without contact. Accordingly, unlike the case where an external antenna is connected to the semiconductor integrated circuit, connection between the semiconductor integrated circuit and the antenna is hardly cut off by force from the outside, and generation of initial defects caused by the connection can be suppressed. In addition, since the booster antenna is used in this embodiment, unlike the case of using only the on-chip antenna, such advantages of the external antenna that the size or shape of the on-chip antenna is hardly restricted by an area of the semiconductor integrated circuit, the frequency band of receivable radio waves is restricted, and the communication distance can be increased can be obtained.

As for the semiconductor device to which the embodiment of the present invention is applied, the conductive shield covering the semiconductor integrated circuit prevents electrostatic breakdown of the semiconductor integrated circuit (e.g., malfunction of the circuit and damage to a semiconductor element) due to electrostatic discharge. In addition, with use of the pair of insulators between which the semiconductor integrated circuit is sandwiched, a highly reliable semiconductor device which has resistance can be provided while achieving reduction in the thickness and size. Moreover, the semiconductor device can be manufactured with high yield by prevention of external stress, or defective shapes or deterioration in characteristics resulted from electrostatic discharge also in a manufacturing process. Therefore, the semiconductor device is capable of inputting and outputting data without contact as described in this embodiment, and is effective in the case of a small-sized semiconductor device. Since the semiconductor device of this embodiment has high reliability against external force, environmental conditions under which the semiconductor device can be used can be varied, and accordingly greater versatility of the semiconductor device can be achieved.

Embodiment 7

In this embodiment, an application example of the above semiconductor device which is capable of inputting and outputting data without contact, which is formed in accordance with the above embodiment, will be described. The semiconductor device which is capable of inputting and outputting data without contact is also referred to as an RFID tag, an ID tag, an IC tag, an IC chip, an RF tag, a wireless tag, an electronic tag, or a wireless chip depending on the usage pattern.

Figure 11A:
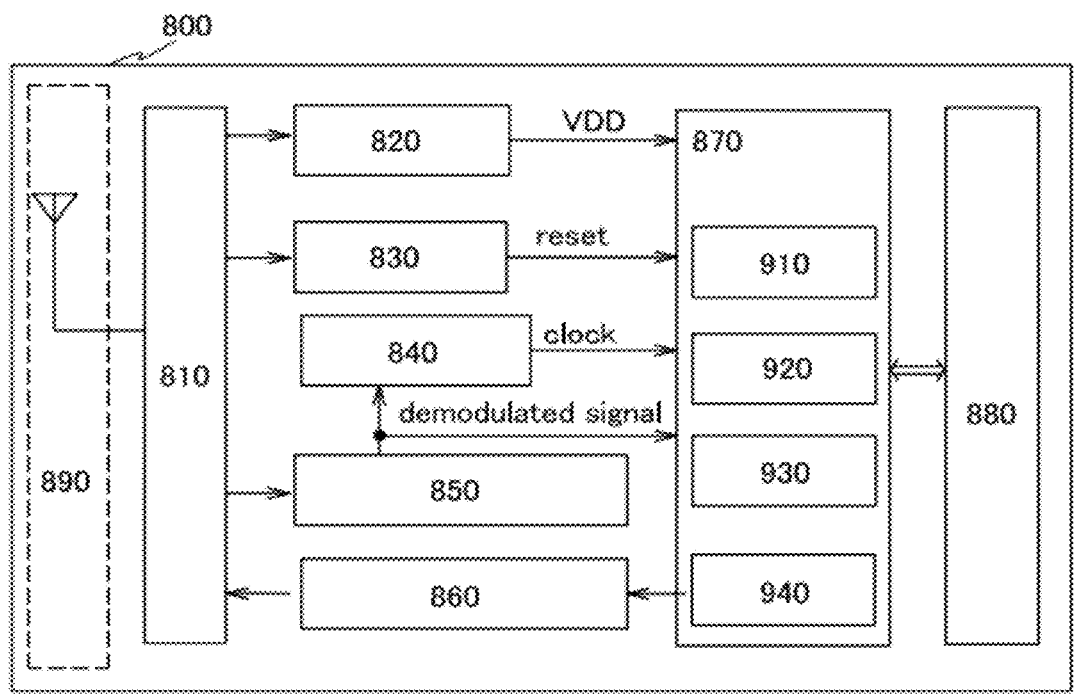
FIGS. 11A to 11C are a diagram and views illustrating a semiconductor device according to an embodiment of the present invention.

A semiconductor device 800, which has a function of exchanging data without contact, includes a high frequency circuit 810, a power supply circuit 820, a reset circuit 830, a clock generator circuit 840, a data demodulation circuit 850, a data modulation circuit 860, a control circuit 870 used for controlling other circuits, a memory circuit 880, and an antenna 890 (see FIG. 11A). The high-frequency circuit 810 receives a signal from the antenna 890 and outputs a signal, which is received from the data modulation circuit 860, with the antenna 890. The power supply circuit 820 generates power supply potential from a received signal. The reset circuit 830 generates a reset signal. The clock generator circuit 840 generates various clock signals based on a received signal input from the antenna 890. The data demodulation circuit 850 demodulates a received signal and outputs the demodulated signal to the control circuit 870. The data modulation circuit 860 modulates a signal received from the control circuit 870. As the control circuit 870, for example, a code extracting circuit 910, a code judging circuit 920, a CRC judging circuit 930, and an output unit circuit 940 are provided. Note that the code extracting circuit 910 extracts each of a plurality of codes included in an instruction transmitted to the control circuit 870. The code judging circuit 920 judges the content of the instruction by comparing the extracted code with a code corresponding to a reference. The CRC judging circuit 930 detects whether or not there is a transmission error or the like based on the judged code.

Next, an example of operation of the above-described semiconductor device will be described. First, a radio signal is received by the antenna 890. The radio signal is transmitted to the power supply circuit 820 via the high frequency circuit 810, and a high power supply potential (hereinafter referred to as "VDD") is generated. The VDD is supplied to each circuit in the semiconductor device 800. A signal transmitted to the data demodulation circuit 850 through the high-frequency circuit 810 is demodulated (hereinafter, this signal is referred to as a "demodulated signal"). Moreover, signals and the demodulated signal passed through the reset circuit 830 and the clock generator circuit 840 through the high-frequency circuit 810 are transmitted to the control circuit 870. The signals transmitted to the control circuit 870 are analyzed by the code extracting circuit 910, the code judging circuit 920, the CRC judging circuit 930, and the like. Then, based on the analyzed signals, information of the semiconductor device stored in the memory circuit 880 is outputted. The output information of the semiconductor device is encoded through the output unit circuit 940. Further, the encoded information of the semiconductor device 800 passes through the data modulating circuit 860 and then is transmitted by the antenna 890 as a wireless signal. Note that low power supply potential (hereinafter referred to as VSS) is common in the plurality of circuits included in the semiconductor device 800 and VSS can be GND.

In this manner, data in the semiconductor device 800 can be read by transmitting a signal to the semiconductor device 800 from a communication device and by receiving a signal which is transmitted from the semiconductor device 800 by the communication device.

Moreover, in the semiconductor device 800, power supply voltage may be supplied to each circuit by electromagnetic waves without mounting a power supply (battery), or a power supply (battery) may be mounted so that power supply voltage is supplied to each circuit by both electromagnetic waves and the power supply (battery).

Figure 11B:
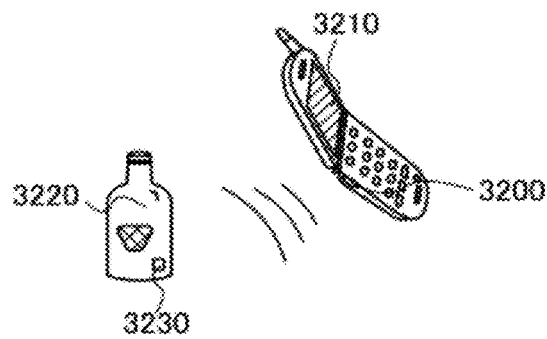
Figure 11C:
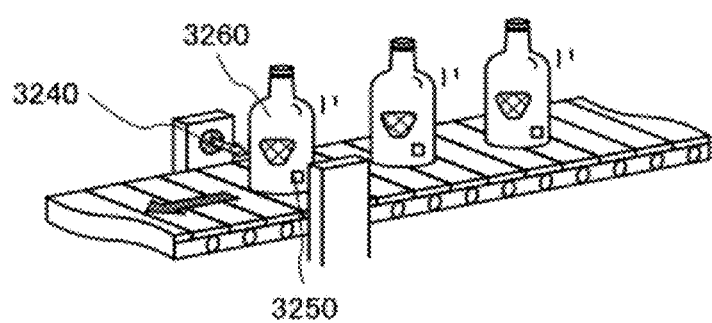

Next, an example of usage of a semiconductor device in which data can be inputted and outputted without contact is described. A communication device 3200 is provided for a side surface of a mobile terminal which includes a display portion 3210. A semiconductor device 3230 is provided for a side surface of a product 3220 (see FIG. 11B). When the communication device 3200 is held up to the semiconductor device 3230 included in the product 3220, the display portion 3210 displays information about the product, such as its materials, its place of production, inspection results for each production step, a history of the distribution process, and a description of the product. Further, when a product 3260 is conveyed by a conveyer belt, the product 3260 can be inspected with a communication device 3240 and a semiconductor device 3250 provided for the product 3260 (see FIG. 11C). In this manner, information can be easily obtained, and high functions and high added values are realized by utilization of a semiconductor device for a system.

As described above, the highly reliable semiconductor device according to an embodiment of the present invention has a very wide range of application, and therefore the semiconductor device can be used in electronic devices in all kinds of fields.

Embodiment 8

By implementation of the above embodiment, a semiconductor device serving as a chip having a processor circuit (hereinafter also referred to as an RFID tag, an ID tag, an IC tag, an RF tag, a wireless tag, an electronic tag, or a wireless tag) can be formed. The application range of such a semiconductor device is so wide that it may be applied to any object in order that the history thereof is revealed without contact and utilized in production, management, and the like. For example, the semiconductor device may be incorporated in bills, coins, securities, certificates, bearer bonds, containers for packages, books, recording media, personal belongings, vehicles, foods, clothes, healthcare items, household goods, medicals, and electronic apparatuses. These examples will be described with reference to FIGS. 9A to 9G.

Bills and coins are money that circulates in the market, and includes one that can be used in the same way as money in a specific area (cash voucher), a commemorative coin, and the like. The securities include checks, certificates, promissory notes, and the like, and can be provided with a chip 190 including a processor circuit (see FIG. 9A). The certificates refer to driver's licenses, certificates of residence, and the like, and can be provided with a chip 191 including a processor circuit (see FIG. 9B). The personal belongings include bags, a pair of glasses, and the like, and can be provided with a chip 197 including a processor circuit (see FIG. 9C). Bearer bonds refer to stamps, rice coupons, various merchandise coupons, and the like. Packing containers refer to wrapping paper for food containers, plastic bottles, and the like and can be provided with a chip 193 including a processor circuit (see FIG. 9D). The books refer to hardbacks, paperbacks, and the like, and can be provided with a chip 194 including a processor circuit (see FIG. 9E). The recording media refer to DVD software, video tapes, and the like, and can be provided with a chip 195 including a processor circuit (see FIG. 9F). Vehicles refer to wheeled vehicles such as bicycles, ships, and the like, and can be provided with a chip 196 including a processor circuit (see FIG. 9G). The groceries indicate foods, beverages, and the like. The garments indicate clothes, shoes, and the like. The health products indicate a medical apparatus, a health appliance, and the like. The household goods indicate furniture, lighting apparatus, and the like. The medicines indicate a drug, an agricultural chemical, and the like. The electronic devices indicate a liquid crystal display device, an EL display device, television sets (a television receiver and a thin television receiver), a cellular phone, and the like.

The semiconductor device can be provided by being attached to the surface of an article or being embedded in an article. For example, in the case of a book, the semiconductor device may be embedded in the paper; and in the case of a package made of an organic resin, the semiconductor device may be embedded in the organic resin.

As described above, the efficiency of an inspection system, a system used in a rental shop, or the like can be improved by provision of the packing containers, the recording media, the personal belonging, the food, the clothing, the household goods, the electronic devices, or the like with the semiconductor device. In addition, by provision of the vehicles with the semiconductor device, forgery or theft can be prevented. In addition, when the semiconductor device is implanted into creatures such as animals, each creature can be identified easily. For example, by implanting/attaching the semiconductor device with a sensor in/to a creature such as livestock, its health condition such as a current body temperature as well as its year of birth, sex, breed, or the like can be easily managed.

Note that this embodiment can be implemented in combination with any of Embodiments 1 to 7 as appropriate.

Embodiment 9

In this embodiment, an example of mounting a semiconductor device according to an embodiment of the present invention will be described with reference to FIGS. 18A to 18D.

The semiconductor device according to an embodiment of the present invention can be mounted on a variety of articles as described in Embodiment 8. In this embodiment, an example in which the semiconductor device is mounted on a flexible substrate to manufacture a flexible semiconductor device is described.

Figure 18A:
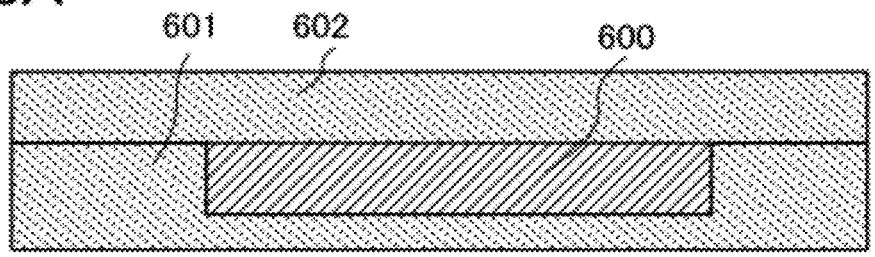
FIGS. 18A to 18D are views each illustrating a semiconductor device according to an embodiment of the present invention.
Figure 18B:
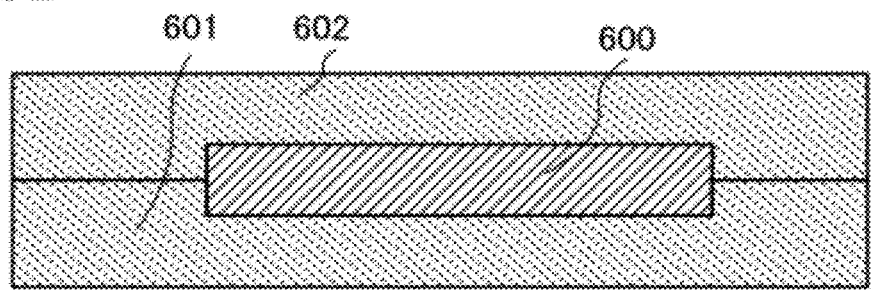
Figure 18C:
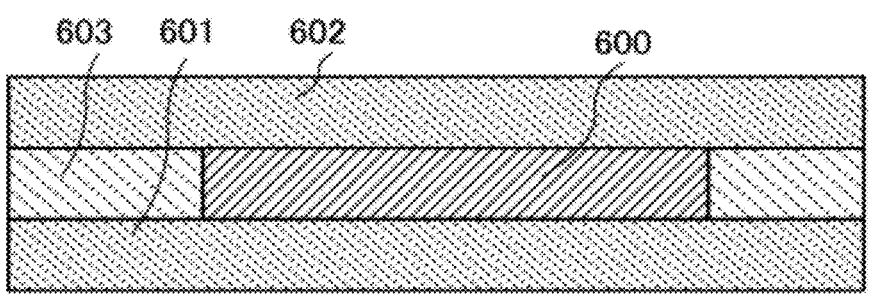
Figure 18D:
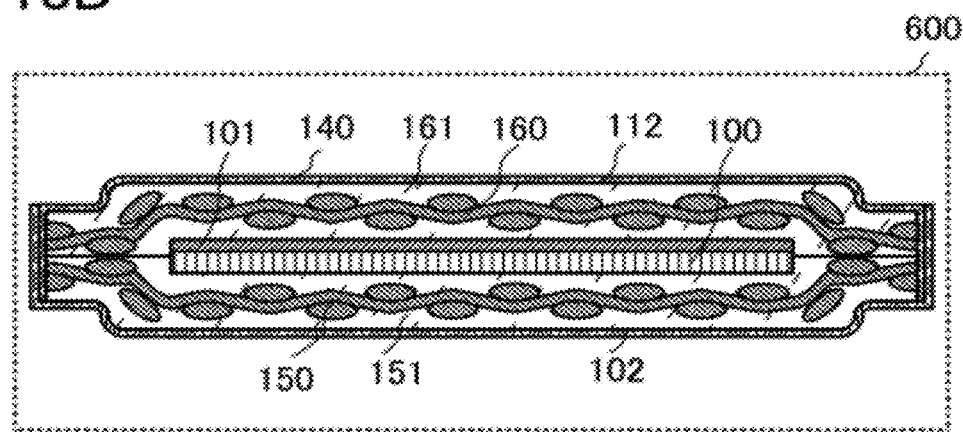

FIGS. 18A to 18C each illustrate an example in which a semiconductor integrated circuit is mounted to be embedded into a flexible substrate. As the semiconductor integrated circuit chip, the semiconductor device described in Embodiments 1 to 6 can be used, and here, a chip form obtained by cutting off the semiconductor devices individually is a semiconductor integrated circuit chip. In addition, FIG. 18D illustrates the detail of a semiconductor integrated circuit chip 600. Although the semiconductor integrated circuit chip illustrated in FIG. 18D is an example of using Embodiment 1, this embodiment can be applied to another embodiment and not limited to this structure.

In FIG. 18D, the antenna 101 and the semiconductor integrated circuit 100 are sandwiched between the first insulator 112 and the second insulator 102, and side surfaces of the antenna 101 and the semiconductor integrated circuit 100 are also sealed. In this embodiment, a plurality of semiconductor integrated circuits are sandwiched between the first insulator 112 and the second insulator 102. The antennas 101 and the semiconductor integrated circuits 100 are cut off into individual antennas and semiconductor integrated circuits, and accordingly semiconductor integrated circuit chips are manufactured. Although there is no particular limitation on a cut-off method as long as the semiconductor integrated circuits 100 can be physically cut off, laser light irradiation is used for cutting off the semiconductor integrated circuits in this embodiment. The semiconductor integrated circuits 100 are cut off, whereby the antenna 101 and the semiconductor integrated circuit 100 are sealed by the first insulator 112 and the second insulator 102. The first insulator 112 and the second insulator 102 are aligned with cut surfaces (side surfaces generated due to the cut-off), and the first insulator 112 and the second insulator 102 are exposed at the cut surfaces.

The conductive shield 140 is formed so as to cover (surround) the first insulator 112 and the second insulator 102. The conductive shield 140 is formed on surfaces and cut surfaces of the first insulator 112 and the second insulator 102. Accordingly, the antenna 101 and the semiconductor integrated circuit 100 are sealed by the first insulator 112 and the second insulator 102 and are also protected against electrostatic discharge by the conductive shield 140 which is provided outside the first insulator 112 and the second insulator 102, which corresponds to top and bottom surfaces of the semiconductor device.

The conductive shield covering the semiconductor integrated circuit prevents electrostatic breakdown of the semiconductor integrated circuit (e.g., malfunction of the circuit and damage to a semiconductor element) due to electrostatic discharge. In addition, with use of the pair of insulators between which the semiconductor integrated circuit is sandwiched, a highly reliable semiconductor device which has resistance can be provided while achieving reduction in the thickness and size. Moreover, the semiconductor device can be manufactured with high yield by prevention of external stress, or defective shapes or deterioration in characteristics resulted from electrostatic discharge also in a manufacturing process.

FIG. 18A illustrates the semiconductor integrated circuit chip 600 sandwiched between a flexible substrate 601 and a flexible substrate 602. The semiconductor integrated circuit chip 600 is placed in a recessed portion provided for the flexible substrate 601.

The recessed portion where the semiconductor integrated circuit chip 600 is placed may be provided for one of the flexible substrates or the both flexible substrates. FIG. 18B illustrates an example in which the semiconductor integrated circuit chip 600 is placed in a recessed portion provided for both the flexible substrate 601 and the flexible substrate 602.

Alternatively, the flexible substrate may have a three-layer structure and an opening where the semiconductor integrated circuit chip 600 is placed may be provided in the middle flexible substrate. FIG. 18C illustrates an example in which an opening is provided for a flexible substrate 603, the semiconductor integrated circuit chip 600 is placed in the opening, and the flexible substrate 603 and the semiconductor integrated circuit chip 600 are sandwiched between the flexible substrate 601 and the flexible substrate 602.

In FIGS. 18A to 18C, a flexible substrate may be stacked on outer side of the flexible substrate 601 or the flexible substrate 602.

As for the flexible substrates 601, 602, and 603, a woven fabric which is woven using bundles of fibers (single yarns) (hereinafter, the bundles of fibers are referred to as yarn bundles) for warp yarns and weft yarns, a nonwoven fabric obtained by stacking yarn bundles of plural kinds of fibers in a random manner or in one direction, paper, or the like can be used. Specifically, a substrate formed from PET (polyethylene terephthalate), PEN (polyethylene naphthalate), PES (polyethersulfone), polypropylene, polypropylene sulfide, polycarbonate, polyetherimide, polyphenylene sulfide, polyphenylene oxide, polysulfone, polyphthalamide, or the like; a film formed from polypropylene, polyester, vinyl, polyvinyl fluoride, vinyl chloride, or the like; paper formed from a fibrous material; or the like can be used. Further, an adhesive synthetic resin film (such as an acrylic synthetic resin or an epoxy synthetic resin); or the like can be used. When a substrate or a film is bonded to the object to be treated, an adhesive layer may be used. A condition is selected in accordance with a kind of the substrate or the film, bonding can be performed by heat treatment and/or pressure treatment. The adhesive layer corresponds to a layer having an adhesive agent such as a heat curing resin, an ultraviolet curing resin, an epoxy resin, and a resin additive.

As in this embodiment, a recessed portion or an opening is provided for the flexible substrate for mounting and the semiconductor integrated circuit chip 600 is placed to be embedded therein, whereby a projected portion caused by provision of the semiconductor integrated circuit chip 600 is not formed. Thus, the surface of the flexible substrate has planarity, and the thickness can be uniform. Accordingly, even if pressure treatment is performed using a roller or the like for bonding the semiconductor integrated circuit chip to the flexible substrate to be mounted, local application of pressure (concentration of pressure) to the semiconductor integrated circuit chip can be prevented. Therefore, damage to the semiconductor integrated circuit chip in the mounting step can be reduced, so that a yield of the semiconductor device is improved. After mounting, a highly reliable semiconductor device having high resistance to external stress can be obtained.

Further, since the semiconductor device can have a planar and smooth surface, it has excellent properties of stacking and transportation when the semiconductor device is stored and is set on a machine. Furthermore, since the semiconductor integrated circuit chip is not seen from the outside (a projected portion reflected by a shape of the semiconductor integrated circuit chip is not generated on the surface), a semiconductor device with high security can be manufactured.

Example 1

In this example, results of evaluation of the reliability of a semiconductor device according to an embodiment of the present invention after manufacture thereof will be described.

A sample was manufactured as follows: a stacked-layer structure in which a semiconductor integrated circuit and an antenna are sandwiched between a first insulator and a second insulator was formed, and the stacked-layer structure was covered with (surrounded by) a conductive shield. In the sample, a prepreg (thickness: 20 µm) which is a structure body in which a fibrous body (glass fiber) is impregnated with an organic resin (a brominated epoxy resin) was used as the first insulator and the second insulator. Sample A which was a sample in which the conductive shield was formed of a titanium film with a thickness of 10 nm; Sample B which was a sample in which the conductive shield was formed of a compound of silicon oxide and indium tin oxide (hereinafter, referred to as "ITSO") with a thickness of 10 nm; Sample C which was a sample in which the conductive shield was formed of ITSO with a thickness of 100 nm; and Sample D which was a sample in which the conductive shield was not provided were used. ESD (electro static discharge) measurement was performed on those samples in order to evaluate the reliability thereof.

In the ESD measurement, the sample was placed on a stacked layer of a glass substrate (thickness: 0.5 mm), an aluminum plate, and a conductive sheet; voltage was applied with an ESD tester (simple response evaluation, manufactured by Takaya Corporation) from the side where the conductive shield was formed, of the sample to the central part of the integrated circuit; electricity was removed (for one minute) after that; and operation check was performed. The operation check was performed under such a condition that a surface on the side where the antenna was provided with respect to the semiconductor integrated circuit was regarded as a "top surface" and a surface on the side opposite to the side where the antenna was provided with respect to the semiconductor integrated circuit was regarded as a "bottom surface".

The ESD measurement was performed on five Samples A, four Samples B, four Samples C, and four Samples D. Table 1 shows average values, maximum values, and minimum values of ESD applied voltage [kV] until the samples were in a non-operation state.

TABLE 1

| Sample | | ESD applied voltage [kV] until sample is in a non-operation state | | |
|---|---|---|---|---|
| | | maximum value | average value | minimum value |
| Sample A | bottom | 15.0 | 15.0 | 15.0 |
| | top | 15.0 | 15.0 | 15.0 |
| Sample B | bottom | 13.0 | 12.0 | 11.0 |
| | top | 15.0 | 14.0 | 9.0 |
| Sample C | bottom | 15.0 | 15.0 | 15.0 |
| | top | 15.0 | 15.0 | 15.0 |

TABLE 1-continued

| Sample | | ESD applied voltage [kV] until sample is in a non-operation state | | |
|---|---|---|---|---|
| | | maximum value | average value | minimum value |
| Sample S | bottom | 7.0 | 2.7 | 2.0 |
| | top | 6.0 | 5.2 | 4.0 |

The average value, the maximum value, and the minimum value of the ESD applied voltage [kV] until the non-operation state of Sample D at the bottom surface were 2.7 kV, 7.0 kV, and 2.0 kV, respectively, while the average value, the maximum value, and the minimum value of Sample A at the bottom surface were 15.0 kV, 15.0 kV, and 15.0 kV, respectively; the average value, the maximum value, and the minimum value of Sample B at the bottom surface were 12.0 kV, 13.0 kV, and 11.0 kV, respectively; and the average value, the maximum value, and the minimum value of Sample C at the bottom surface were 15.0 kV, 15.0 kV, and 15.0 kV, respectively. It is found that Sample A, Sample B, and Sample C each of which had the conductive shield was able to operate at higher voltage than Sample D. The above results confirmed that when the semiconductor integrated circuit was covered with the conductive shield, resistance to electrostatic discharge increased and thus electrostatic breakdown hardly occurred.

The above results confirmed that when an embodiment of the present invention was used, the conductive shield covering the semiconductor integrated circuit was able to prevent electrostatic breakdown of the semiconductor integrated circuit (e.g., malfunction of the circuit and damage to a semiconductor element) due to electrostatic discharge and a highly reliable semiconductor device was able to be provided while achieving reduction in the thickness and size of the semiconductor device.

Example 2

Next, results of the bending test on a semiconductor device according to an embodiment of the present invention will be described.

First, five Samples E each of which had the same structure as Sample A, five Samples F each of which had the same structure as Sample B, and five Samples G each of which had the same structure as Sample D were prepared. Next, five samples of each Sample were arranged on a polyethylene terephthalate tape, the polyethylene terephthalate tape was provided with 670 g of weight on one side, and the polyethylene terephthalate tape was moved back and forth on a metal rod around which paper was wound.

Response evaluation was performed on each of the five samples of each of Sample E, Sample F, and Sample G every 30 round trips. Tables 2 to 4 show the results of the response evaluation of Sample G, Sample E, Sample F until 300 round trips, respectively.

TABLE 2

| | | | | | | | | | | | | | | |
|---|---|---|---|---|---|---|---|---|---|---|---|---|---|---|
| | Sample G | | | | | | | | | | | | | |
| | before test | | | | | | | | | | | | after test | |
| Sample No. | resonance frequency [MHz] | Maximum communication distance [mm] | number of times | | | | | | | | | after cut off | resonance frequency [MHz] | communication distance [mm] |
| | | | 30 | 60 | 90 | 120 | 150 | 180 | 210 | 240 | 270 | 300 | | | |
| 1 | 15.9 | 22 | o | x | x | x | x | x | x | x | x | x | x | 15.7 | x |
| 2 | 15.2 | 18 | o | x | x | x | x | x | x | x | x | x | x | 14.8 | x |
| 3 | 15.1 | 20 | o | x | x | x | x | x | x | x | x | x | x | 15.7 | x |
| 4 | 16.0 | 18 | x | x | x | x | x | x | x | x | x | x | x | 14.8 | x |
| 5 | 15.9 | 19 | x | x | x | x | x | x | x | x | x | x | x | 16.4 | x |

TABLE 3

| | | | | | | | | | | | | | | |
|---|---|---|---|---|---|---|---|---|---|---|---|---|---|---|
| | Sample E | | | | | | | | | | | | | |
| | before test | | | | | | | | | | | | after test | |
| Sample No. | resonance frequency [MHz] | Maximum communication distance [mm] | number of times | | | | | | | | | after cut off | resonance frequency [MHz] | communication distance [mm] |
| | | | 30 | 60 | 90 | 120 | 150 | 180 | 210 | 240 | 270 | 300 | | | |
| 1 | 12.9 | 19 | o | o | o | o | o | o | o | o | o | o | o | 12.9 | 20 |
| 2 | 13.0 | 19 | o | o | o | o | o | o | o | o | o | o | o | 13.0 | 19 |
| 3 | 13.0 | 15 | o | o | o | o | o | o | o | o | o | o | o | 13.1 | 15 |
| 4 | 13.0 | 19 | o | o | o | o | o | o | o | o | o | o | o | 13.0 | 19 |
| 5 | 13.0 | 20 | o | o | o | o | o | o | o | o | o | o | o | 13.0 | 20 |

TABLE 4

| | | | | | | | | | | | | | | |
|---|---|---|---|---|---|---|---|---|---|---|---|---|---|---|
| | Sample F | | | | | | | | | | | | | |
| | before test | | | | | | | | | | | | after test | |
| Sample No. | resonance frequency [MHz] | Maximum communication distance [mm] | number of times | | | | | | | | | after cut off | resonance frequency [MHz] | communication distance [mm] |
| | | | 30 | 60 | 90 | 120 | 150 | 180 | 210 | 240 | 270 | 300 | | | |
| 1 | 13.6 | 18 | o | o | o | o | o | o | o | o | o | o | o | 13.9 | 18 |
| 2 | 13.7 | 19 | o | o | o | o | o | o | o | o | o | o | o | 13.9 | 17 |
| 3 | 13.9 | 16 | o | o | o | o | o | o | o | o | o | o | o | 13.8 | 16 |
| 4 | 13.9 | 18 | o | o | o | o | o | o | o | o | o | o | o | 13.9 | 18 |
| 5 | 14.0 | 14 | o | o | o | o | o | o | o | o | o | o | o | 13.9 | 15 |

Two of the five samples of Sample G did not show response after 30 round trips. The other three samples showed response until 30 round trips; however, they did not show response after 60 round trips. It was found that, as for Sample E and Sample F, all five samples of each of Sample E and Sample F showed response until 300 round trips.

The above results confirmed that when an embodiment of the present invention was used, the conductive shield covering the semiconductor integrated circuit was able to prevent electrostatic breakdown of the semiconductor integrated circuit (e.g., malfunction of the circuit and damage to a semiconductor element) due to electrostatic discharge and reliability against bend stress was able to be improved. The above results also confirmed that a highly reliable semiconductor device was able to be provided while achieving reduction in the thickness and size of the semiconductor device.

Example 3

In this example, results of evaluation of the reliability of a semiconductor device according to an embodiment of the present invention after manufacture thereof will be described.

As samples, stacked-layer structures of a conductive shield, a fourth insulator, a first insulator, an antenna, a semiconductor integrated circuit, a third insulator, a second insulator, and a conductive shield (Sample H, Sample I, and Sample J) were manufactured. In the sample, a prepreg (thickness: 20 μm) in which a fibrous body (glass fiber) was impregnated with an organic resin (a brominated epoxy resin) was used as the first insulator and the second insulator. An aramid film (thickness: 12 μm) was used as the third insulator and the fourth insulator. Note that a silicon nitride film was formed as a protective layer over the antenna, and an acrylic resin (thickness: 10 μm) was formed as an adhesive layer between the third insulator and the semiconductor integrated circuit.

The following samples were used: Sample H in which the conductive shield was formed of a titanium film, Sample I in which the conductive shield was formed of an ITSO film, and Sample J in which the conductive shield was formed of a nickel film were used. In a structure of each sample, in the case where the conductive shields were formed of the titanium film and the ITSO film, the thickness of each of the conductive shields was 5 nm, 10 nm, 50 nm, and 100 nm. In addition, in the case where the conductive shield was formed of the nickel film, the thickness of the conductive shield was 10 nm, 50 nm, and 100 nm. Note that a conductive shield whose thickness was 0 nm was a sample in which a conductive shield was not formed (Sample).

ESD measurement (each thickness, five samples), bending test (each thickness, five samples), and measurement of sheet resistance (each thickness, five samples) were performed on Sample H, Sample I, and Sample J.

The ESD measurement was performed by a similar method to Example 1. The bending test was performed by a similar method to Example 2. The measurement of sheet resistance was performed in such a manner that each of a titanium film, an ITSO film, and a nickel film was formed over glass. The thickness of each of the conductive shields in the case where the conductive shields were formed of the titanium film and the ITSO film was 5 nm, 10 nm, 50 nm, and 100 nm, and in the case where the conductive shield was formed of the nickel film was 10 nm, 50 nm, and 100 nm. The measurement was performed on each sample with a resistivity tester (manufactured by Taiyo NPS Corporation) by a DC four-probe method.

Figure 21:
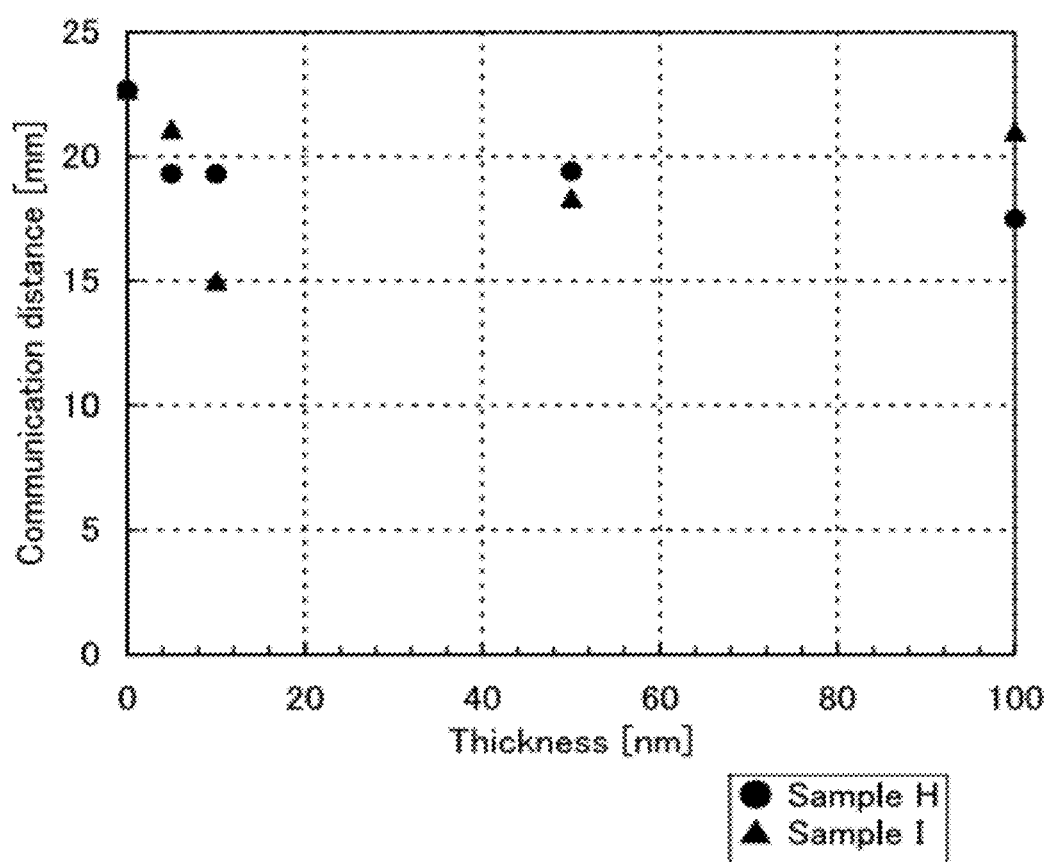
FIG. 21 is a graph showing communication distances in Example 3.
Figure 22:
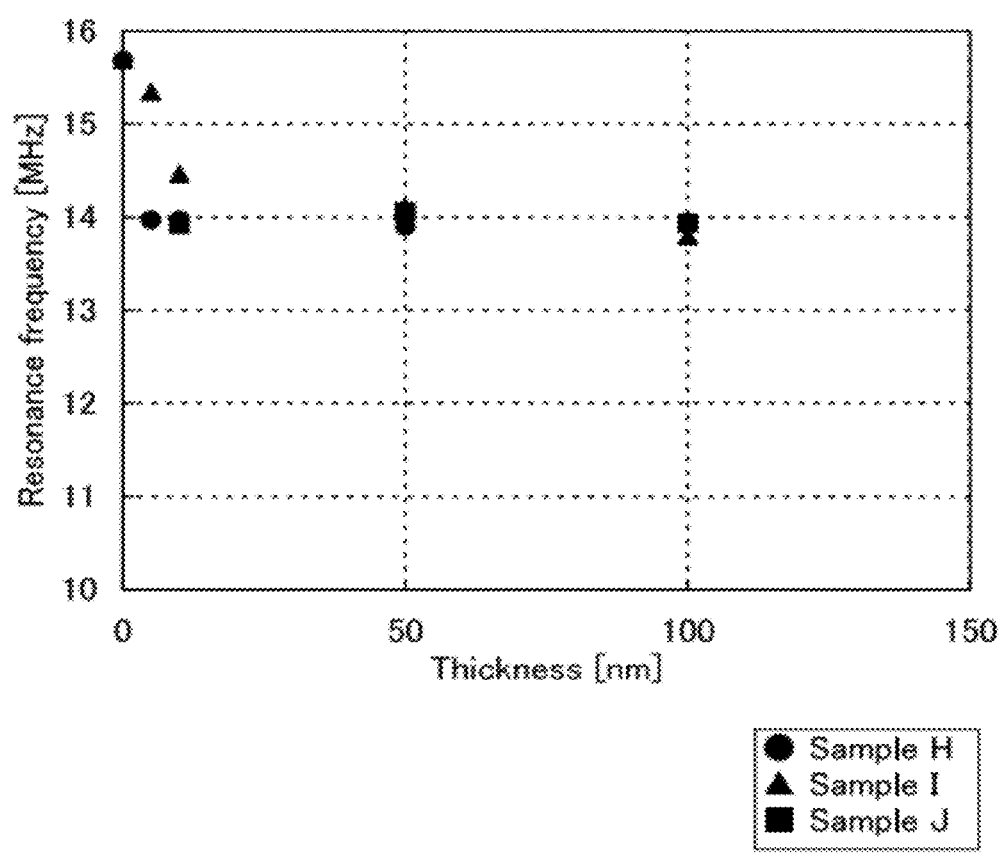
FIG. 22 is a graph showing resonance frequencies in Example 3.

FIG. 21 shows the results of the communication distances of Sample H and Sample I. FIG. 22 shows the results of the resonance frequency of Sample H, Sample I, and Sample J. FIG. 21 and FIG. 22 each show results of average values obtained after measurement on ten samples with each thickness. The results of FIG. 21 showed that the communication distances of Sample H and Sample I were hardly changed depending on the material or the thickness. Further, the results showed that, also in the results shown in FIG. 22, the resonance frequencies of Sample H, Sample I, and Sample J were hardly changed depending on the material or the thickness. In other words, the results showed that electromagnetic waves transmitted through the conductive shield and communication with the outside was able to be favorably performed.

Figure 23:
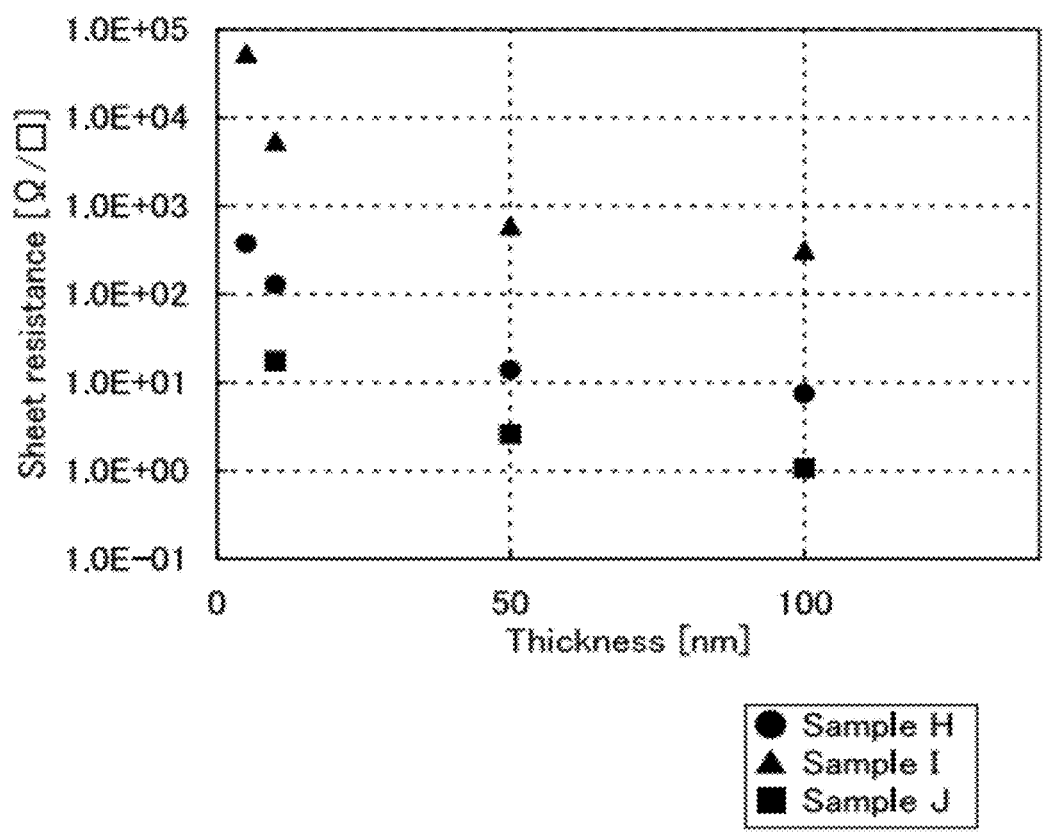
FIG. 23 is a graph showing sheet resistance in Example 3.

FIG. 23 shows the measurement results of the resistivity of Sample H, Sample I, and Sample J. The sheet resistance of all of Sample H, Sample I, and Sample J tended to decrease as the thickness was increased. The above results showed that increase in the thickness of Sample H, Sample I, and Sample J made the sheet resistance decreased and made it possible to effectively diffuse static electricity in the case where electrostatic discharge was generated. Further, the results showed that the thicknesses of the conductive shield and the sheet resistance were correlated with each other, and the sheet resistance was able to be controlled by the thickness.

Table 5, table 6, and table 7 show the results of the ESD measurement of Sample H, Sample I, and Sample J, respectively. The measurement was performed on five samples of each Sample with each thickness. In Tables 5 to 7, as for the measurement results, the denominator indicates the number of test samples and the numerator indicates the number of samples which operated.

TABLE 5

| | Result of ESD apply test | | | | | | | | | |
|---|---|---|---|---|---|---|---|---|---|---|
| ESD applied voltage | ESD applied from antenna side | | | | | ESD applied from semiconductor integrated circuit side | | | | |
| | Thickness of sample H [nm] | | | | | | | | | |
| | 0 | 5 | 10 | 50 | 100 | 0 | 5 | 10 | 50 | 100 |
| 5 kV | 1/5 | 5/5 | 5/5 | 5/5 | 5/5 | 0/5 | 5/5 | 5/5 | 5/5 | 5/5 |
| 10 kV | 0/5 | 5/5 | 5/5 | 5/5 | 5/5 | 0/5 | 5/5 | 5/5 | 5/5 | 5/5 |
| 15 kV | 0/5 | 5/5 | 5/5 | 5/5 | 5/5 | 0/5 | 3/5 | 5/5 | 5/5 | 5/5 |

TABLE 6

| | Result of ESD apply test | | | | | | | | | |
|---|---|---|---|---|---|---|---|---|---|---|
| ESD applied voltage | ESD applied from antenna side | | | | | ESD applied from semiconductor integrated circuit side | | | | |
| | Thickness of sample I [nm] | | | | | | | | | |
| | 0 | 5 | 10 | 50 | 100 | 0 | 5 | 10 | 50 | 100 |
| 5 kV | 1/5 | 5/5 | 5/5 | 5/5 | 5/5 | 0/5 | 5/5 | 5/5 | 5/5 | 5/5 |
| 10 kV | 0/5 | 5/5 | 5/5 | 5/5 | 5/5 | 0/5 | 5/5 | 5/5 | 5/5 | 5/5 |
| 15 kV | 0/5 | 4/5 | 4/5 | 5/5 | 5/5 | 0/5 | 4/5 | 4/5 | 4/5 | 5/5 |

TABLE 7

| | Result of ESD apply test | | | | | | | |
|---|---|---|---|---|---|---|---|---|
| ESD applied voltage | ESD applied from antenna side | | | | ESD applied from semiconductor integrated circuit side | | | |
| | Thickness of sample J [nm] | | | | | | | |
| | 0 | 10 | 50 | 100 | 0 | 10 | 50 | 100 |
| 5 kV | 1/5 | 5/5 | 5/5 | 5/5 | 1/5 | 5/5 | 5/5 | 5/5 |
| 10 kV | 0/5 | 5/5 | 5/5 | 5/5 | 0/5 | 5/5 | 5/5 | 5/5 |
| 15 kV | 0/5 | 5/5 | 5/5 | 5/5 | 0/5 | 5/5 | 5/5 | 5/5 |

As for Sample in which a conductive shield was not provided, only one of five samples operated in the case where 5 kV of voltage was applied, and none of them operated in the case where 10 kV of voltage was applied. As for Sample H, three of five samples with a thickness of 5 nm operated in the case where 15 kV of voltage was applied from a bottom surface, and all of them with a thickness other than 5 nm operated in the case where 15 kV of voltage was applied from both the top and bottom surfaces. In addition, as for Sample I, all of five samples with a thickness of each of 50 nm and 100 nm operated in the case where 15 kV of voltage was applied, and four of five samples with a thickness of each of 5 nm and 10 nm operated in the case where 15 kV of voltage was applied to both the surface and the bottom surface. As for Sample J, five samples all operated regardless of the thickness and voltage. The above results showed that increase in the thickness of the conductive shield made it possible to prevent electrostatic breakdown due to electrostatic discharge.

Table 8 shows the results of the bending test of Sample H, Sample I, and Sample J. Table 8 shows if normal operation was able to be observed or not after bending test was performed 300 times. In the examination results, the denominators indicate the number of test samples and the numerators indicate the number of samples which operated. The measurement was performed on five samples of each Sample with each thickness.

TABLE 8

| Sample | Thickness of sample [nm] | | | | |
|---|---|---|---|---|---|
| | | 0 | 5 | 10 | 50 | 100 |
| Examination Result | Sample H | 0/5 | 5/5 | 5/5 | 5/5 | 5/5 |
| | Sample I | 0/5 | 5/5 | 5/5 | 5/5 | 5/5 |
| | Sample J | — | — | 5/5 | 5/5 | 5/5 |

According to the results shown in Table 8, as for Sample in which a conductive shield was not formed, none of five samples showed response after 300 round trips. On the other hand, as for each of Sample H, Sample I, and Sample J, all five samples of each thickness showed response after 300 round trips. The above results showed that the conductive shield was covered with the integrated circuit, whereby electrostatic breakdown due to electrostatic discharge was able to be prevented.

The above results showed that when an embodiment of the present invention was used, the conductive shield covering the semiconductor integrated circuit was able to prevent electrostatic breakdown of the semiconductor integrated circuit (e.g., malfunction of the circuit and damage to a semiconductor element) due to electrostatic discharge and reliability against bend stress can be improved. The above results also showed that a highly reliable semiconductor device was able to be provided while achieving reduction in the thickness and size of the semiconductor device.

This application is based on Japanese Patent Application serial no. 2008-136082 filed with Japan Patent Office on May 23, 2008, the entire contents of which are hereby incorporated by reference.

EXPLANATION OF REFERENCE

100: semiconductor integrated circuit, 101: antenna, 102: insulator, 103: insulator, 104: adhesive layer, 105: inorganic insulating layer, 110: substrate, 111: separation layer, 112: insulator, 113: insulator, 114: adhesive layer, 122a: p-type impurity region, 140: conductive shield, 140a: conductive shield, 140b: conductive shield, 150: fibrous body, 151: organic resin, 160: fibrous body, 161: organic resin, 190: chip, 191: chip, 193: chip, 194: chip, 195: chip, 196: chip, 197: chip, 200: substrate, 201: separation layer, 202: base film, 204a: drain region, 205a: impurity region, 206: channel formation region, 207: gate insulating layer, 208: gate electrode, 209a: insulating layer, 210: transistor, 210a: wiring layer, 211: transistor, 212: insulating film, 213: insulating film, 214: insulating layer, 223a: impurity region, 224a: drain region, 226: channel formation region, 227: gate insulating layer, 228: gate electrode layer, 229a: insulating layer, 230a: wiring layer, 250: semiconductor integrated circuit, 252: insulator, 254: inorganic insulating layer, 260a: conductive shield, 260b: conductive shield, 262: insulator, 263: conductive layer, 270: fibrous body, 271: organic resin, 280: fibrous body, 281: organic resin, 300: substrate, 301: separation layer, 302: insulating film, 303: semiconductor layer, 304: semiconductor layer, 305: semiconductor layer, 306: semiconductor layer, 308: gate insulating layer, 309: gate insulating layer, 310: insulating film, 311: charge accumulation layer, 312: gate electrode layer, 313: gate electrode layer, 314a: gate electrode layer, 315: control gate electrode layer, 316: gate electrode layer, 317: gate electrode layer, 318: gate electrode layer, 319: control gate electrode layer, 320: impurity element, 321: mask, 322a: p-type impurity region, 322b: p-type impurity region, 323: channel formation region, 324: impurity element, 325: mask, 326a: n-type impurity region, 329: channel formation region, 330: channel formation region, 331: channel formation region, 350: semiconductor integrated circuit, 362a: n-type impurity region, 362b: n-type impurity region, 364a: n-type impurity region, 364b: n-type impurity region, 367: insulating film, 368: insulating film, 369a: wiring layer, 369b: wiring layer, 370a: wiring layer, 370b: wiring layer, 371a: wiring layer, 371b: wiring layer, 372a: wiring layer, 372b: wiring layer, 373: thin film transistor, 374: thin film transistor, 375: memory element, 376: thin film transistor, 380: conductive layer, 381: inorganic insulating layer, 382: insulator, 383: fibrous body, 384: organic resin, 385: insulator, 387: organic resin, 388: insulator, 389: adhesive layer, 390: insulating layer, 391: insulator, 395a: conductive shield, 395b: conductive shield, 400: semiconductor integrated circuit chip, 405: antenna, 406: supporting substrate, 407: dashed line, 408: power feeding point, 410: insulating layer, 411: capacitor, 420: semiconductor device, 421: interrogator, 422: antenna, 423: semiconductor integrated circuit, 424: antenna, 500: microprocessor, 501: arithmetic circuit, 502: arithmetic circuit control portion, 503: instruction decoder, 504: interrupt controller, 505: timing controller, 506: register, 507: register controller, 508: bus interface, 509: read only memory, 510: memory interface, 511: RFCPU, 512: analog circuit portion, 513: digital circuit portion, 514: resonance circuit, 515: rectifier circuit, 516: constant voltage circuit, 517: reset circuit, 518: oscillator circuit, 519: demodulation circuit, 520: modulation circuit, 521: RF interface, 522: control register, 523: clock controller, 524: interface, 525: central processing unit, 526: random access memory, 527: read only memory, 528: antenna, 529: capacitor portion, 530: power supply control circuit, 600: semiconductor integrated circuit chip, 601: flexible substrate, 602: flexible substrate, 603: flexible substrate, 800: semiconductor device, 810: high frequency circuit, 820: power supply circuit, 830: reset circuit, 840: clock generator circuit, 850: data demodulation circuit, 860: data modulation circuit, 870: control circuit, 880: memory circuit, 890: antenna, 910: code extracting circuit, 920: code judging circuit, 930: CRC judging circuit, 940: output unit circuit, 3200: communication device, 3210: display portion, 3230: semiconductor device, 3240: communication device, 3250: semiconductor device, and 3260: product.

The invention claimed is:
1. A semiconductor device comprising:
a first insulator and a second insulator provided so as to face each other;
a semiconductor integrated circuit and an antenna provided over the semiconductor integrated circuit sealed by the first insulator and the second insulator; and
a conductive material covering an outer surface of the first insulator and an outer surface of the second insulator,
wherein at least one of the first insulator and the second insulator comprises a fibrous body and an organic resin.
2. A semiconductor device comprising:
a first insulator and a second insulator provided so as to face each other;
a semiconductor integrated circuit and a first antenna provided over the semiconductor integrated circuit sealed by the first insulator and the second insulator;
a conductive material covering an outer surface of the first insulator and an outer surface of the second insulator; and
a second antenna electromagnetically connected to the first antenna,
wherein at least one of the first insulator and the second insulator comprises a fibrous body and an organic resin.

3. The semiconductor device according to claim 2, wherein the semiconductor integrated circuit performs wireless communication with the outside through the second antenna.

4. The semiconductor device according to claim 2,
wherein the second antenna is provided over a substrate,
wherein an insulating film is formed over the second antenna, and
wherein the semiconductor integrated circuit and the first antenna sealed by the first insulator and the second insulator and covered with the conductive material are provided over the insulating film.

5. The semiconductor device according to claim 1 or 2, wherein the conductive material has a single-layer structure or a stacked-layer structure.

6. The semiconductor device according to claim 1 or 2, wherein the conductive material is a metal film.

7. The semiconductor device according to claim 6, wherein the metal film is a titanium film with a thickness of greater than or equal to 5 nm and less than or equal to 100 nm.

8. The semiconductor device according to claim 1 or 2, wherein the conductive material is a metal oxide film.

9. The semiconductor device according to claim 8, wherein the metal oxide film is an indium tin oxide film containing silicon oxide with a thickness of greater than or equal to 5 nm and less than or equal to 100 nm.

10. The semiconductor device according to claim 1 or 2, wherein the conductive material comprises a semiconductor film or a metal nitride film.

11. The semiconductor device according to claim 1 or 2, wherein at least one of the first insulator and the second insulator has a thickness of greater than or equal to 5 μm and less than or equal to 50 μm.

12. The semiconductor device according to claim 1 or 2, wherein the at least one of the first insulator and the second insulator has a structure body in which the fibrous body is impregnated with the organic resin.

13. The semiconductor device according to claim 1 or 2, wherein the conductive material functions as shields.

14. The semiconductor device according to claim 1 or 2, wherein the conductive material transmits electromagnetic waves and blocks static electricity.

15. The semiconductor device according to claim 1, wherein the antenna and the semiconductor integrated circuit interposed between the first insulator and the second insulator are surrounded by the conductive material entirely.

16. The semiconductor device according to claim 2, wherein the first antenna and the semiconductor integrated circuit interposed between the first insulator and the second insulator are entirely surrounded by the conductive material.

17. A semiconductor device comprising:
a first insulator and a second insulator provided so as to face each other wherein the first insulator has a first surface facing the second insulator and a second surface facing in an opposite direction from the first surface and wherein the second insulator has a third surface facing to the first insulator and a fourth surface facing an opposite direction from the third surface;
a semiconductor integrated circuit between the first insulator and the second insulator;
an antenna between the semiconductor integrated circuit and the first insulator;
a first conductive layer in contact with the second surface of the first insulator; and
a second conductive layer in contact with the fourth surface of the second insulator,
wherein at least of one of the first conductive layer and the second conductive layer is in contact with a side surface of the first insulator and a side surface of the second insulator, and
wherein the side surface of the first insulator is coplanar with the side surface of the second insulator.

18. A semiconductor device comprising:
a first insulator and a second insulator provided so as to face each other wherein the first insulator has a first surface facing the second insulator and a second surface facing in an opposite direction from the first surface and wherein the second insulator has a third surface facing the first insulator and a fourth surface facing an opposite direction from the third surface;
a semiconductor integrated circuit between the first insulator and the second insulator;
a first antenna between the semiconductor integrated circuit and the first insulator;
a first conductive layer in contact with the second surface of the first insulator;
a second conductive layer in contact with the fourth surface of the second insulator; and
a second antenna electromagnetically connected to the first antenna,
wherein at least of one of the first conductive layer and the second conductive layer is in contact with a side surface of the first insulator and a side surface of the second insulator, and
wherein the side surface of the first insulator is coplanar with the side surface of the second insulator.

19. The semiconductor device according to claim 18, wherein the semiconductor integrated circuit performs wireless communication with the outside through the second antenna.

20. The semiconductor device according to claim 18,
wherein the second antenna is provided over a substrate,
wherein an insulating film is formed over the second antenna, and
wherein the semiconductor integrated circuit and the first antenna interposed between the first insulator and the second insulator and covered with the first conductive layer and the second conductive layer is provided over the insulating film.

21. The semiconductor device according to claim 17 or 18, wherein at least one of the first conductive layer and the second conductive layer has a stacked-layer structure.

22. The semiconductor device according to claim 17 or 18, wherein at least one of the first conductive layer and the second conductive layer comprises a metal film.

23. The semiconductor device according to claim 22, wherein the metal film is a titanium film with a thickness of greater than or equal to 5 nm and less than or equal to 100 nm.

24. The semiconductor device according to claim 17 or 18, wherein at least one of the first conductive layer and the second conductive layer comprises a metal oxide film.

25. The semiconductor device according to claim 24, wherein the metal oxide film is an indium tin oxide film containing silicon oxide with a thickness of greater than or equal to 5 nm and less than or equal to 100 nm.

26. The semiconductor device according to claim 17 or 18, wherein at least one of the first conductive layer and the second conductive layer comprises a semiconductor film or a metal nitride film.

27. The semiconductor device according to claim 17 or 18, wherein at least one of the first insulator and the second insulator has a thickness of greater than or equal to 5 μm and less than or equal to 50 μm.

28. The semiconductor device according to claim 17 or 18, wherein at least one of the first insulator and the second insulator comprises a fibrous body and an organic resin.

29. The semiconductor device according to claim 17 or 18, wherein at least one of the first insulator and the second insulator has a structure body in which a fibrous body is impregnated with an organic resin.

30. The semiconductor device according to claim 17 or 18, wherein the first conductive layer and the second conductive layer function as shields.

31. The semiconductor device according to claim 17 or 18, wherein the first conductive layer and the second conductive layer transmit electromagnetic waves and block static electricity.

32. The semiconductor device according to claim 17, wherein the antenna and the semiconductor integrated circuit interposed between the first insulator and the second insulator are entirely surrounded by the first conductive layer and the second conductive layer.

33. The semiconductor device according to claim 18, wherein the first antenna and the semiconductor integrated circuit interposed between the first insulator and the second insulator are entirely surrounded by the first conductive layer and the second conductive layer.

* * * * *